US012606580B2

(12) United States Patent
Park et al.

(10) Patent No.: US 12,606,580 B2
(45) Date of Patent: Apr. 21, 2026

(54) ORGANIC ELECTROLUMINESCENT COMPOUND AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Hyo-Soon Park, Gyeonggi-do (KR); Mi-Ja Lee, Gyeonggi-do (KR); Kyung-Hoon Choi, Gyeonggi-do (KR); Kyoung-Jin Park, Gyeonggi-do (KR); Jin-Ri Hong, Gyeonggi-do (KR); So-Mi Park, Gyeonggi-do (KR); Hyun Kim, Gyeonggi-do (KR)

(73) Assignee: DuPont Specialty Materials Korea Ltd. (KR)

( * ) Notice: Subject to any disclaimer, the term of this patent is extended or adjusted under 35 U.S.C. 154(b) by 887 days.

(21) Appl. No.: 17/848,946

(22) Filed: Jun. 24, 2022

(65) Prior Publication Data

US 2023/0096621 A1 Mar. 30, 2023

(30) Foreign Application Priority Data

Jul. 29, 2021 (KR) ........................ 10-2021-0099676

(51) Int. Cl.

| | |
|---|---|
| ***C07F 15/00*** | (2006.01) |
| ***H01L 51/00*** | (2006.01) |
| ***H01L 51/50*** | (2006.01) |
| ***H10K 50/11*** | (2023.01) |
| ***H10K 85/30*** | (2023.01) |

(52) U.S. Cl.
CPC .......... *C07F 15/0033* (2013.01); *H10K 50/11* (2023.02); *H10K 85/342* (2023.02); *C07B 2200/05* (2013.01)

(58) Field of Classification Search
None
See application file for complete search history.

(56) References Cited

U.S. PATENT DOCUMENTS

2017/0256726 A1 9/2017 Saito et al.
2018/0319831 A1 11/2018 Ji et al.

FOREIGN PATENT DOCUMENTS

CN 104447881 A * 3/2015
EP 2730583 A1 * 5/2014

OTHER PUBLICATIONS

Request for the Submission of an Opinion from Korea Intellectual Property Office, Application No. 10-2021-0099676, Filing Date: Jul. 29, 2021.

* cited by examiner

*Primary Examiner* — Tae H Yoon
(74) *Attorney, Agent, or Firm* — G. Creston Campbell

(57) ABSTRACT

The present disclosure relates to an organic electroluminescent compound comprising a ligand represented by formula 1, and an organic electroluminescent device comprising the same. By comprising the organic electroluminescent compound of the present disclosure, it is possible to provide an organic electroluminescent device having higher luminous efficiency and/or longer lifetime properties compared to a conventional organic electroluminescent device.

11 Claims, No Drawings

ORGANIC ELECTROLUMINESCENT COMPOUND AND ORGANIC ELECTROLUMINESCENT DEVICE COMPRISING THE SAME

CROSS-REFERENCE TO RELATED APPLICATION

This application is the Convention Filing of KR10-2021-0099676; filed Jul. 29, 2021, which is incorporated by reference herein in its entirety.

TECHNICAL FIELD

The present disclosure relates to an organic electroluminescent compound and an organic electroluminescent device comprising the same.

BACKGROUND ART

An electroluminescent device (EL device) is a self-light-emitting display device which has advantages in that it provides a wider viewing angle, a greater contrast ratio, and a faster response time. The first organic EL device was developed by Eastman Kodak in 1987, by using small aromatic diamine molecules and aluminum complexes as materials for forming a light-emitting layer (see Appl. Phys. Lett. 51, 913, 1987).

An organic electroluminescent device (OLED) changes electric energy into light by applying electricity to an organic electroluminescent material, and commonly comprises an anode, a cathode, and an organic layer between the two electrodes. The organic layer of the OLED may comprise a hole injection layer, a hole transport layer, a hole auxiliary layer, a light-emitting auxiliary layer, an electron blocking layer, a light-emitting layer, an electron buffer layer, a hole blocking layer, an electron transport layer, an electron injection layer, etc., if necessary. The materials used in the organic layer can be classified into a hole injection material, a hole transport material, a hole auxiliary material, a light-emitting auxiliary material, an electron blocking material, a light-emitting material (including a host material and a dopant material), an electron buffer material, a hole blocking material, an electron transport material, an electron injection material, etc., depending on their functions. In the OLED, holes from the anode and electrons from the cathode are injected into a light-emitting layer by the application of electric voltage, and excitons having high energy are produced by the recombination of the holes and electrons. The organic light-emitting compound moves into an excited state by the energy and emits light from the energy when the organic light-emitting compound returns to the ground state from the excited state.

The most important factor determining luminous efficiency in an OLED is the light-emitting materials used. The light-emitting materials are required to have the following features: high quantum efficiency, high mobility of an electron and a hole, and uniformity and stability of the formed light-emitting material layer. The light-emitting material is classified into blue, green, and red light-emitting materials according to the light-emitting color, and further includes yellow or orange light-emitting materials. Furthermore, the light-emitting material is classified into a host material and a dopant material in a functional aspect. Generally, a device having excellent EL characteristics has a structure comprising a light-emitting layer made by doping a dopant to a host.

Iridium(III) complexes have been widely known as a dopant of phosphorescent light-emitting materials, including bis(2-(2'-benzothienyl)-pyridinato-N,C-3')iridium(acetylacetonate) [$(acac)Ir(btp)_2$], tris(2-phenylpyridine)iridium [$Ir(ppy)_3$] and bis(4,6-difluorophenylpyridinato-N,C2)picolinato iridium (Firpic) as red, green, and blue light-emitting materials, respectively.

Meanwhile, Korean Patent Application Laid-Open No. 2017-0060049 discloses the following compound as a phosphorescent light-emitting material.

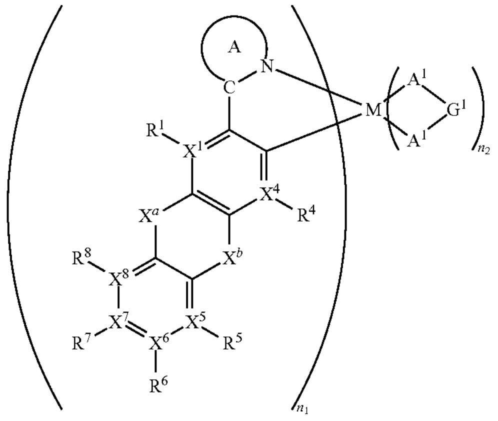

However, development of a phosphorescent light-emitting material for improving performances of an OLED is still required.

DISCLOSURE OF INVENTION

Technical Problem

The objective of the present disclosure is firstly, to provide an organic electroluminescent compound capable of producing an organic electroluminescent device having excellent luminous efficiency and/or lifetime properties, and secondly, to provide an organic electroluminescent device comprising the organic electroluminescent compound.

Solution to Problem

The present inventors have found that the above objective can be achieved by the organic electroluminescent compound comprising ligand $L_1$ represented by the following formula 1, wherein the ligand $L_1$ is coordinated to a metal having an atomic number greater than 40.

(1)

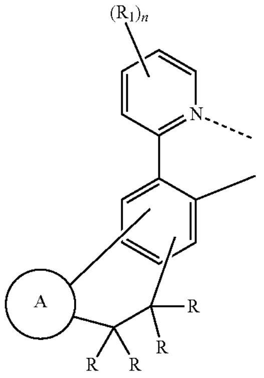

In formula 1, ring A represents a substituted or unsubstituted benzene ring, or a substituted or unsubstituted pyridine ring;

R, each independently, represents a substituted or unsubstituted (C1-C30)alkyl, a substituted or unsubstituted (C3-C30)cycloalkyl, a substituted or unsubstituted (C6-C30)aryl, or a substituted or unsubstituted (3- to 30-membered)heteroaryl;

$R_1$, each independently, represents hydrogen, deuterium, a substituted or unsubstituted (C1-C30)alkyl, a substituted or unsubstituted (C3-C30)cycloalkyl, a substituted or unsubstituted (C6-C30)aryl, or a substituted or unsubstituted (3- to 30-membered)heteroaryl;

n represents an integer of 1 to 4, in which, if n is an integer of 2 or more, each of $R_1$ may be the same or different; and the hydrogen in formula 1 may be substituted with deuterium.

Advantageous Effects of Invention

It is possible to provide an organic electroluminescent device having improved luminous efficiency and/or lifetime properties by using the organic electroluminescent compound of the present disclosure.

MODE FOR THE INVENTION

Hereinafter, the present disclosure will be described in detail. However, the following description is intended to explain the disclosure, and is not meant in any way to restrict the scope of the disclosure.

The term "an organic electroluminescent compound" in the present disclosure means a compound that may be used in an organic electroluminescent device. If necessary, the organic electroluminescent compound may be comprised in any layers constituting an organic electroluminescent device.

The term "an organic electroluminescent material" in the present disclosure means a material that may be used in an organic electroluminescent device, and may comprise at least one compound. If necessary, the organic electroluminescent material may be comprised in any layers constituting an organic electroluminescent device. For example, the organic electroluminescent material may be a hole injection material, a hole transport material, a hole auxiliary material, a light-emitting auxiliary material, an electron blocking material, a light-emitting material (including a host material and a dopant material), an electron buffer material, a hole blocking material, an electron transport material, an electron injection material, etc.

Herein, the term "(C1-C30)alkyl" is meant to be a linear or branched alkyl having 1 to 30 carbon atoms constituting the chain, in which the number of carbon atoms is preferably 1 to 20, and more preferably 1 to 10. The above alkyl may include methyl, ethyl, n-propyl, isopropyl, n-butyl, isobutyl, sec-butyl, tert-butyl, n-pentyl, tert-pentyl, neopentyl, isopentyl, sec-pentyl, sec-isopentyl, 3-pentyl, etc. The term "(C2-C30)alkenyl" in the present disclosure is meant to be a linear or branched alkenyl having 2 to 30 carbon atoms constituting the chain, in which the number of carbon atoms is preferably 2 to 20, and more preferably 2 to 10. The above alkenyl may include vinyl, 1-propenyl, 2-propenyl, 1-butenyl, 2-butenyl, 3-butenyl, 2-methylbut-2-enyl, etc. The term "(C2-C30)alkynyl" in the present disclosure is meant to be a linear or branched alkynyl having 2 to 30 carbon atoms constituting the chain, in which the number of carbon atoms is preferably 2 to 20, and more preferably 2 to 10. The above alkynyl may include ethynyl, 1-propynyl, 2-propynyl, 1-butynyl, 2-butynyl, 3-butynyl, 1-methylpent-2-ynyl, etc. The term "(C3-C30)cycloalkyl" is meant to be a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, etc. The term "(3- to 7-membered)heterocycloalkyl" is meant to be a cycloalkyl having 3 to 7, preferably 5 to 7, ring backbone atoms, and including at least one heteroatom selected from the group consisting of B, N, O, S, Si, and P, and preferably the group consisting of O, S, and N. The above heterocycloalkyl may include tetrahydrofuran, pyrrolidine, thiolan, tetrahydropyran, etc. The term "(C6-C30) aryl(ene)" is meant to be a monocyclic or fused ring radical derived from an aromatic hydrocarbon having 6 to 30 ring backbone carbon atoms, in which the number of the ring backbone carbon atoms is preferably 6 to 25, more preferably 6 to 18. The above aryl(ene) may be partially saturated, and may comprise a spiro structure. The above aryl may include phenyl, biphenyl, terphenyl, naphthyl, binaphthyl, phenylnaphthyl, naphthylphenyl, phenylterphenyl, fluorenyl, phenylfluorenyl, dimethylfluorenyl, benzofluorenyl, dibenzofluorenyl, phenanthrenyl, phenylphenanthrenyl, anthracenyl, indenyl, triphenylenyl, pyrenyl, tetracenyl, perylenyl, chrysenyl, naphthacenyl, fluoranthenyl, spirobifluorenyl, etc. Specifically, the aryl may include phenyl, 1-naphthyl, 2-naphthyl, 1-anthryl, 2-anthryl, 9-anthryl, benzanthryl, 1-phenanthryl, 2-phenanthryl, 3-phenanthryl, 4-phenanthryl, 9-phenanthryl, naphthacenyl, pyrenyl, 1-chrysenyl, 2-chrysenyl, 3-chrysenyl, 4-chrysenyl, 5-chrysenyl, 6-chrysenyl, benzo[c]phenanthryl, benzo[g]chrysenyl, 1-triphenylenyl, 2-triphenylenyl, 3-triphenylenyl, 4-triphenylenyl, 1-fluorenyl, 2-fluorenyl, 3-fluorenyl, 4-fluorenyl, 9-fluorenyl, benzo[a]fluorenyl, benzo[b]fluorenyl, benzo[c]fluorenyl, dibenzofluorenyl, 2-biphenylyl, 3-biphenylyl, 4-biphenylyl, o-terphenyl, m-terphenyl-4-yl, m-terphenyl-3-yl, m-terphenyl-2-yl, p-terphenyl-4-yl, p-terphenyl-3-yl, p-terphenyl-2-yl, m-quaterphenyl, 3-fluoranthenyl, 4-fluoranthenyl, 8-fluoranthenyl, 9-fluoranthenyl, benzofluoranthenyl, o-tolyl, m-tolyl, p-tolyl, 2,3-xylyl, 3,4-xylyl, 2,5-xylyl, mesityl, o-cumenyl, m-cumenyl, p-cumenyl, p-tert-butylphenyl, p-(2-phenylpropyl)phenyl, 4'-methylbiphenylyl, 4"-tert-butyl-p-terphenyl-4-yl, 9,9-dimethyl-1-fluorenyl, 9,9-dimethyl-2-fluorenyl, 9,9-dimethyl-3-fluorenyl, 9,9-dimethyl-4-fluorenyl, 9,9-diphenyl-1-fluorenyl, 9,9-diphenyl-2-fluorenyl, 9,9-diphenyl-3- fluorenyl, 9,9-diphenyl-4-fluorenyl, 11,11-dimethyl-1-benzo[a]fluorenyl, 11,11-dimethyl-2-benzo[a]fluorenyl, 11,11-dimethyl-3-benzo[a]fluorenyl, 11,11-dimethyl-4-benzo[a]fluorenyl, 11,11-dimethyl-5-benzo[a]fluorenyl, 11,11-dimethyl-6-benzo[a]fluorenyl, 11,11-dimethyl-7-benzo[a]fluorenyl, 11,11-dimethyl-8-benzo[a]fluorenyl, 11,11-dimethyl-9-benzo[a]fluorenyl, 11,11-dimethyl-10-benzo[a]fluorenyl, 11,11-dimethyl-1-benzo[b]fluorenyl, 11,11-dimethyl-2-benzo[b]fluorenyl, 11,11-dimethyl-3-benzo[b]fluorenyl, 11,11-dimethyl-4-benzo[b]fluorenyl, 11,11-dimethyl-5-benzo[b]fluorenyl, 11,11-dimethyl-6-benzo[b]fluorenyl, 11,11-dimethyl-7-benzo[b]fluorenyl, 11,11-dimethyl-8-benzo[b]fluorenyl, 11,11-dimethyl-9-benzo[b]fluorenyl, 11,11-dimethyl-10-benzo[b]fluorenyl, 11,11-dimethyl-1-benzo[c]fluorenyl, 11,11-dimethyl-2-benzo[c]fluorenyl, 11,11-dimethyl-3-benzo[c]fluorenyl, 11,11-dimethyl-4-benzo[c]fluorenyl, 11,11-dimethyl-5-benzo[c]fluorenyl, 11,11-dimethyl-6-benzo[c]fluorenyl, 11,11-dimethyl-7-benzo[c]fluorenyl, 11,11-dimethyl-8-benzo[c]fluorenyl, 11,11-dimethyl-9-benzo[c]fluorenyl, 11,11-dimethyl-10-benzo[c]fluorenyl, 11,11-diphenyl-1-benzo[a]fluorenyl, 11,11-diphenyl-2-benzo[a]fluorenyl, 11,11-diphenyl-3-benzo[a]fluorenyl, 11,11-diphenyl-4-benzo[a]fluorenyl, 11,11-diphenyl-5-benzo[a]fluorenyl, 11,11-diphenyl-6-benzo[a]fluorenyl, 11,11-diphenyl-7-benzo[a]fluorenyl, 11,11-diphenyl-8-benzo[a]fluorenyl, 11,11-diphenyl-9-benzo[a]fluorenyl, 11,11-diphenyl-10-benzo[a]fluorenyl, 11,11-diphenyl-1-benzo[b]fluorenyl, 11,11-diphenyl-2-benzo[b]fluorenyl, 11,11-diphenyl-3-benzo[b]fluorenyl, 11,11-diphenyl-4-benzo[b]fluorenyl, 11,11-diphenyl-5-benzo[b]fluorenyl, 11,11-diphenyl-6-benzo[b]fluorenyl, 11,11-diphenyl-7-benzo[b]fluorenyl, 11,11-diphenyl-8-benzo[b]fluorenyl, 11,11-diphenyl-9-benzo[b]fluorenyl, 11,11-diphenyl-10-benzo[b]fluorenyl, 11,11-diphenyl-1-benzo[c]fluorenyl, 11,11-diphenyl-2-benzo[c]fluorenyl, 11,11-diphenyl-3-benzo[c]fluorenyl, 11,11-diphenyl-4-benzo[c]fluorenyl, 11,11-diphenyl-5-benzo[c]fluorenyl, 11,11-diphenyl-6-benzo[c]fluorenyl, 11,11-diphenyl-7-benzo[c]fluorenyl, 11,11-diphenyl-8-benzo[c]fluorenyl, 11,11-diphenyl-9-benzo[c]fluorenyl, 11,11-diphenyl-10-benzo[c]fluorenyl, 9,9,10,10-tetramethyl-9,10-dihydro-1-phenanthrenyl, 9,9,10,10-tetramethyl-9,10-dihydro-2-phenanthrenyl, 9,9,10,10-tetramethyl-9,10-dihydro-3-phenanthrenyl, 9,9,10,10-tetramethyl-9,10-dihydro-4-phenanthrenyl, etc. The term "(3- to 30-membered)heteroaryl(ene)" in the present disclosure is meant to be an aryl(ene) having 3 to 30 ring backbone atoms and including at least one heteroatom(s) selected from the group consisting of B, N, O, S, Si, and P. The number of heteroatoms is preferably 1 to 4. The above heteroaryl(ene) may be a monocyclic ring or a fused ring condensed with at least one benzene ring; may be partially saturated; may be one formed by linking at least one heteroaryl or aryl group to a heteroaryl(ene) group via a single bond(s); and may comprise a spiro structure. The above heteroaryl may include a monocyclic ring-type heteroaryl such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl such as benzofuranyl, benzothiophenyl, isobenzofuranyl, dibenzofuranyl, benzophenanthrofuranyl, dibenzothiophenyl, benzimidazolyl, benzothiazolyl, benzoisothiazolyl, benzophenanthrothiophenyl, benzoisoxazolyl, benzoxazolyl, phenanthrooxazolyl, phenanthrothiazolyl, isoindolyl, indolyl, benzoindolyl, indazolyl, benzothiadiazolyl, quinolyl, isoquinolyl, cinnolinyl, quinazolinyl, benzoquinazolinyl, quinoxalinyl, benzoquinoxalinyl, naphthyridinyl, carbazolyl, benzocarbazolyl, dibenzocarbazolyl, phenoxazinyl, phenothiazinyl, phenanthridinyl, benzodioxolyl, dihydroacridinyl, etc. More specifically, the heteroaryl may include 1-pyrrolyl, 2-pyrrolyl, 3-pyrrolyl, pyrazinyl, 2-pyridyl, 2-pyrimidinyl, 4-pyrimidinyl, 5-pyrimidinyl, 6-pyrimidinyl, 1,2,3-triazin-4-yl, 1,2,4-triazin-3-yl, 1,3,5-triazin-2-yl, 1-imidazolyl, 2-imidazolyl, 1-pyrazolyl, 1-indolidinyl, 2-indolidinyl, 3-indolidinyl, 5-indolidinyl, 6-indolidinyl, 7-indolidinyl, 8-indolidinyl, 2-imidazopyridyl, 3-imidazopyridyl, 5-imidazopyridyl, 6-imidazopyridyl, 7-imidazopyridyl, 8-imidazopyridyl, 3-pyridyl, 4-pyridyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, azacarbazolyl-1-yl, azacarbazolyl-2-yl, azacarbazolyl-3-yl, azacarbazolyl-4-yl, azacarbazolyl-5-yl, azacarbazolyl-6-yl, azacarbazolyl-7-yl, azacarbazolyl-8-yl, azacarbazolyl-9-yl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-tert-butylpyrrol-4-yl, 3-(2-phenylpropyl)pyrrol-1-yl, 2-methyl-1-indolyl, 4-methyl-1-indolyl, 2-methyl-3-indolyl, 4-methyl-3-indolyl, 2-tert-butyl-1-indolyl, 4-tert-butyl-1-indolyl, 2-tert-butyl-3-indolyl, 4-tert-butyl-3-indolyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-naphtho-[1,2-b]-benzofuranyl, 2-naphtho-[1,2-b]-benzofuranyl, 3-naphtho-[1,2-b]-benzofuranyl, 4-naphtho-[1,2-b]-benzofuranyl, 5-naphtho-[1,2-b]-benzofuranyl, 6-naphtho-[1,2-b]-benzofuranyl, 7-naphtho-[1,2-b]-benzofuranyl, 8-naphtho-[1,2-b]-benzofuranyl, 9-naphtho-[1,2-b]-benzofuranyl, 10-naphtho-[1,2-b]-benzofuranyl, 1-naphtho-[2,3-b]-benzofuranyl, 2-naphtho-[2,3-b]-benzofuranyl, 3-naphtho-[2,3-b]-benzofuranyl, 4-naphtho-[2,3-b]-benzofuranyl, 5-naphtho-[2,3-b]-benzofuranyl, 6-naphtho-[2,3-b]-benzofuranyl, 7-naphtho-[2,3-b]-benzofuranyl, 8-naphtho-[2,3-b]-benzofuranyl, 9-naphtho-[2,3-b]-benzofuranyl, 10-naphtho-[2,3-b]-benzofuranyl, 1-naphtho-[2,1-b]-benzofuranyl, 2-naphtho-[2,1-b]-benzofuranyl, 3-naphtho-[2,1-b]-benzofuranyl, 4-naphtho-[2,1-b]-benzofuranyl, 5-naphtho-[2,1-b]-benzofuranyl, 6-naphtho-[2,1-b]-benzofuranyl, 7-naphtho-[2,1-b]-benzofuranyl, 8-naphtho-[2,1-b]-benzofuranyl, 9-naphtho-[2,1-b]-benzofuranyl, 10-naphtho-[2,1-b]-benzofuranyl, 1-naphtho-[1,2-b]-benzothiophenyl, 2-naphtho-[1,2-b]-benzothiophenyl, 3-naphtho-[1,2-b]-benzothiophenyl, 4-naphtho-[1,2-b]-benzothiophenyl, 5-naphtho-[1,2-b]-benzothiophenyl, 6-naphtho-[1,2-b]-benzothiophenyl, 7-naphtho-[1,2-b]-benzothiophenyl, 8-naphtho-[1,2-b]-benzothiophenyl, 9-naphtho-[1,2-b]-benzothiophenyl, 10-naphtho-[1,2-b]-benzothiophenyl, 1-naphtho-[2,3-b]- benzothiophenyl, 2-naphtho-[2,3-b]-benzothiophenyl, 3-naphtho-[2,3-b]-benzothiophenyl, 4-naphtho-[2,3-b]-benzothiophenyl, 5-naphtho-[2,3-b]-benzothiophenyl, 1-naphtho-[2,1-b]-benzothiophenyl, 2-naphtho-[2,1-b]-benzothiophenyl, 3-naphtho-[2,1-b]-benzothiophenyl, 4-naphtho-[2,1-b]-benzothiophenyl, 5-naphtho-[2,1-b]-benzothiophenyl, 6-naphtho-[2,1-b]-benzothiophenyl, 7-naphtho-[2,1-b]-benzothiophenyl, 8-naphtho-[2,1-b]-benzothiophenyl, 9-naphtho-[2,1-b]-benzothiophenyl, 10-naphtho-[2,1-b]-benzothiophenyl, 2-benzofuro[3,2-d]pyrimidinyl, 6-benzofuro[3,2-d]pyrimidinyl, 7-benzofuro[3,2-d]pyrimidinyl, 8-benzofuro[3,2-d]pyrimidinyl, 9-benzofuro[3,2-d]pyrimidinyl, 2-benzothio[3,2-d]pyrimidinyl, 6-benzothio[3,2-d]pyrimidinyl, 7-benzothio[3,2-d]pyrimidinyl, 8-benzothio[3,2-d]pyrimidinyl, 9-benzothio[3,2-d]pyrimidinyl, 2-benzofuro[3,2-d]pyrazinyl, 6-benzofuro[3,2-d]pyrazinyl, 7-benzofuro[3,2-d]pyrazinyl, 8-benzofuro[3,2-d]pyrazinyl, 9-benzofuro[3,2-d]pyrazinyl, 2-benzothio[3,2-d]pyrazinyl, 6-benzothio[3,2-d]pyrazinyl, 7-benzothio[3,2-d]pyrazinyl, 8-benzothio[3,2-d]pyrazinyl, 9-benzothio[3,2-d]pyrazinyl, 1-silafluorenyl, 2-silafluorenyl, 3-silafluorenyl, 4-silafluorenyl, 1-germafluorenyl, 2-germafluorenyl, 3-germafluorenyl, 4-germafluorenyl, 1-dibenzoselenophenyl, 2-dibenzoselenophenyl, 3-dibenzoselenophenyl, 4-dibenzoselenophenyl, etc. In the present disclosure, the term "halogen" includes F, Cl, Br, and I.

Herein, "substituted" in the expression "substituted or unsubstituted" means that a hydrogen atom in a certain functional group is replaced with another atom or another functional group, i.e., a substituent. The substituent(s) of the substituted benzene ring, the substituted pyridine ring, the substituted alkyl, the substituted cycloalkyl, the substituted aryl, the substituted arylene, the substituted heteroaryl, the substituted heteroarylene, the substituted alkenyl, the substituted alkynyl, the substituted alkoxy, the substituted trialkylsilyl, the substituted triarylsilyl, the substituted dialkylarylsilyl, the substituted alkyldiarylsilyl, the substituted mono- or di-alkylamino, the substituted alkylarylamino, and the substituted mono- or di-arylamino in the formulas of the present disclosure, each independently, are at least one selected from the group consisting of deuterium; a halogen; a cyano; a carboxyl; a nitro; a hydroxyl; a phosphine oxide; a (C1-C30)alkyl unsubstituted or substituted with deuterium; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered)heteroaryl unsubstituted or substituted with at least one of a (C6-C30)aryl(s), a (C1-C30)alkyl(C6-C30)aryl(s), and a tri(C6-C30)arylsilyl(s); a (C6-C30)aryl unsubstituted or substituted with at least one of a (C1-C30)alkyl(s), a (C6-C30)aryl(s), a tri(C6-C30)arylsilyl(s), and a (3- to 30-membered)heteroaryl(s); a tri(C1-C30)alkylsilyl; a tri(C6-C30)arylsilyl; a di(C1-C30)alkyl(C6-C30)arylsilyl; a (C1-C30)alkyldi(C6-C30)arylsilyl; a fused ring group of a (C3-C30) aliphatic ring(s) and a (C6-C30) aromatic ring(s); an amino; a mono- or di-(C1-C30)alkylamino; a mono- or di-(C2-C30)alkenylamino; a (C1-C30)alkyl(C2-C30)alkenylamino; a mono- or di-(C6-C30)arylamino; a (C1-C30)alkyl(C6-C30)arylamino; a mono- or di-(3- to 30-membered)heteroarylamino; a (C1-C30)alkyl(3- to 30-membered)heteroarylamino; a (C2-C30)alkenyl(C6-C30)arylamino; a (C2-C30)alkenyl(3- to 30-membered)heteroarylamino; a (C6-C30)aryl(3- to 30-membered)heteroarylamino; a (C1-C30)alkylcarbonyl; a (C1-C30)alkoxycarbonyl; a (C6-C30)arylcarbonyl; a (C6-C30)arylphosphinyl; a di(C6-C30)arylboronyl; a di(C1-C30)alkylboronyl; a (C1-C30)alkyl(C6-C30)arylboronyl; a (C6-C30)aryl(C1-C30)alkyl; and a (C1-C30)alkyl(C6-C30)aryl. According to one embodiment of the present disclosure, the substituent(s) may be at least one selected from the group consisting of deuterium; a (C1-C20)alkyl unsubstituted or substituted with deuterium; a (5- to 25-membered)heteroaryl unsubstituted or substituted with a (C6-C25)aryl(s) and/or a (5- to 25-membered)heteroaryl(s); a (C6-C25)aryl unsubstituted or substituted with at least one of a (C1-C20)alkyl(s), a (5- to 18-membered)heteroaryl(s), and a tri(C6-C25)arylsilyl(s); and a tri(C6-C25)arylsilyl. According to another embodiment of the present disclosure, the substituent(s) may be at least one selected from the group consisting of deuterium; a (C1-C10)alkyl unsubstituted or substituted with deuterium; a (5- to 18-membered)heteroaryl unsubstituted or substituted with a (C6-C12)aryl(s) and/or a (5- to 18-membered)heteroaryl(s); a (C6-C18)aryl unsubstituted or substituted with a (C1-C10)alkyl(s), a (5- to 18-membered)heteroaryl(s), and/or a tri(C6-C18)arylsilyl(s); and a tri(C6-C18)arylsilyl. For example, the substituent(s) may be at least one selected from the group consisting of deuterium; a methyl unsubstituted or substituted with deuterium; a phenyl unsubstituted or substituted with a diphenyltriazinyl(s) and/or a triphenylsilyl(s); a naphthyl; a biphenyl; a fluorenyl substituted with a methyl(s); a naphthylphenyl; a triphenylenyl; a terphenyl; a pyrimidinyl substituted with a phenyl(s); a triazinyl substituted with a phenyl(s); a carbazolyl unsubstituted or substituted with a phenyl(s); a dibenzothiophenyl; and a triphenylsilyl.

In the present disclosure, a ring formed by linking adjacent substituents means that two or more adjacent substituents are linked to or fused with each other to form a substituted or unsubstituted, mono- or polycyclic, (3- to 30-membered) alicyclic or aromatic ring, or the combination thereof, preferably a substituted or unsubstituted, mono- or polycyclic, (5- to 25-membered) alicyclic or aromatic ring, or the combination thereof. In addition, the formed ring may contain at least one heteroatom selected from B, N, O, S, Si, and P, preferably at least one heteroatom selected from N, O, and S.

The organic electroluminescent compound of the present disclosure comprises ligand $L_1$ represented by formula 1, and the ligand $L_1$ is coordinated to a metal having an atomic number greater than 40.

According to one embodiment of the present disclosure, the metal having an atomic number greater than 40 may be iridium (Ir), osmium (Os), copper (Cu), or platinum (Pt), and according to another embodiment of the present disclosure, Ir or Pt. For example, the metal having an atomic number greater than 40 may be Ir.

In formula 1, ring A represents a substituted or unsubstituted benzene ring, or a substituted or unsubstituted pyridine ring. According to one embodiment of the present disclosure, ring A represents a benzene ring unsubstituted or substituted with a (C1-C20)alkyl(s), or a pyridine ring unsubstituted or substituted with a (C1-C20)alkyl(s). According to another embodiment of the present disclosure, ring A represents a benzene ring unsubstituted or substituted with a (C1-C10)alkyl(s), or pyridine ring unsubstituted or substituted with a (C1-C10)alkyl(s). For example, ring A may be a benzene ring unsubstituted or substituted with a methyl(s), or a pyridine ring unsubstituted or substituted with a methyl(s) unsubstituted or substituted with deuterium.

In formula 1, R, each independently, represents a substituted or unsubstituted (C1-C30)alkyl, a substituted or unsubstituted (C3-C30)cycloalkyl, a substituted or unsubstituted (C6-C30)aryl, or a substituted or unsubstituted (3- to 30-membered)heteroaryl. According to one embodiment of the present disclosure, R, each independently, represents a (C1-C10)alkyl unsubstituted or substituted with deuterium, or an unsubstituted (C6-C25)aryl. For example, R, each independently, may be a methyl or an ethyl.

In formula 1, $R_1$, each independently, represents hydrogen, deuterium, a substituted or unsubstituted (C1-C30) alkyl, a substituted or unsubstituted (C3-C30)cycloalkyl, a substituted or unsubstituted (C6-C30)aryl, or a substituted or unsubstituted (3- to 30-membered)heteroaryl. According to one embodiment of the present disclosure, $R_1$, each independently, represents hydrogen, a substituted or unsubstituted (C1-C20)alkyl, or a substituted or unsubstituted (C6-C25)aryl. According to another embodiment of the present disclosure, $R_1$, each independently, represents hydrogen, a (C1-C10)alkyl unsubstituted or substituted with deuterium, or an unsubstituted (C6-C15)aryl. Specifically, $R_1$, each independently, may be selected from the group consisting of hydrogen, deuterium, methyl, ethyl, n-propyl, isopropyl, n-butyl, isobutyl, sec-butyl, tert-butyl, n-pentyl, tert-pentyl, neopentyl, isopentyl, sec-pentyl, sec-isopentyl, 3-pentyl, and phenyl; and the hydrogen in $R_1$ may be substituted with deuterium. For example, $R_1$, each independently, may be selected from the group consisting of hydrogen, a methyl unsubstituted or substituted with deuterium, an isopropyl unsubstituted or substituted with deuterium, an isobutyl unsubstituted or substituted with deuterium, a neopentyl unsubstituted or substituted with deuterium, a tert-butyl, or a sec-isopentyl.

In formula 1, n represents an integer of 1 to 4, in which, if n is an integer of 2 or more, each of $R_1$ may be the same or different. According to one embodiment of the present disclosure, n represents 1 or 2.

In formula 1, the hydrogen in formula 1 may be substituted with deuterium.

According to one embodiment of the present disclosure, the organic electroluminescent compound of the present disclosure may comprise the compound represented by the following formula 2.

$$M(L_1)x(L_2)y \qquad (2)$$

In formula 2, M represents a metal having an atomic number greater than 40. According to one embodiment of the present disclosure, M may be iridium (Ir), osmium (Os), copper (Cu), or platinum (Pt). According to another embodiment of the present disclosure, M may be Ir or Pt. For example, M may be Ir.

In formula 2, x represents 1 or 2; y represents 1 or 2; the sum of x and y is the oxidation number of M. According to one embodiment of the present disclosure, x may be 1, and y may be 2.

In formula 2, $L_1$ represents the ligand represented by formula 1; and $L_2$ represents the ligand represented by the following formula 3 or 4.

(3)

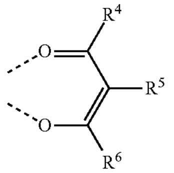

-continued (4)

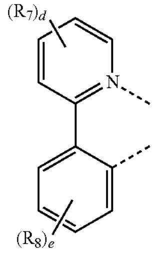

In formulas 3 and 4, $R_4$ to $R_8$, each independently, represent hydrogen, deuterium, a substituted or unsubstituted (C1-C30)alkyl, a substituted or unsubstituted (C3-C30)cycloalkyl, a substituted or unsubstituted (C6-C30)aryl, or a substituted or unsubstituted (3- to 30-membered)heteroaryl; or $R_4$ and $R_5$, $R_5$ and $R_6$, adjacent $R_7$'s, and adjacent $R_8$'s, each independently, may be linked to each other to form a ring(s). According to one embodiment of the present disclosure, $R_4$ to $R_8$, each independently, represent hydrogen, a substituted or unsubstituted (C1-C20)alkyl, or a substituted or unsubstituted (C6-C25)aryl. According to another embodiment of the present disclosure, $R_4$ to $R_8$, each independently, represent hydrogen, a (C1-C10)alkyl unsubstituted or substituted with deuterium, or an unsubstituted (C6-C15)aryl. Specifically, $R_4$ to $R_8$, each independently, are selected from the group consisting of hydrogen, deuterium, methyl, ethyl, n-propyl, isopropyl, n-butyl, isobutyl, sec-butyl, tert-butyl, n-pentyl, tert-pentyl, neopentyl, isopentyl, sec-pentyl, sec-isopentyl, 3-pentyl, and phenyl; and the hydrogen in $R_4$ to $R_8$ may be substituted with deuterium. For example, $R_4$ to $R_8$, each independently, represent hydrogen, or a methyl unsubstituted or substituted with deuterium.

In formula 4, d and e, each independently, represent an integer of 1 to 4, in which, if d and e, each independently, are an integer of 2 or more, each of $R_7$ and each of $R_8$ may be the same or different.

According to one embodiment of the present disclosure, the ligand $L_1$ may be represented by the following formula 1-1 or 1-2.

(1-1)

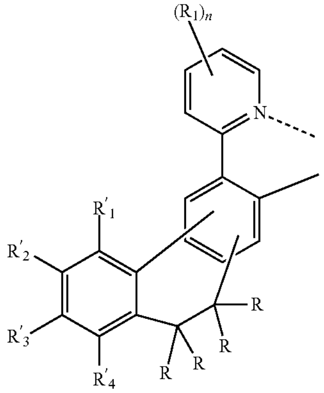

-continued (1-2)

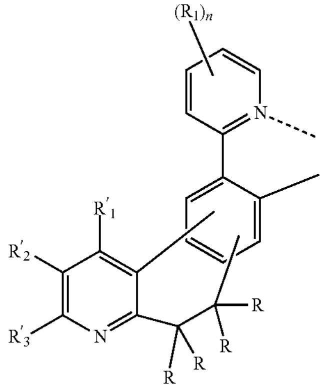

In formulas 1-1 and 1-2, $R'_1$ to $R'_4$, each independently, represent hydrogen, deuterium, a substituted or unsubstituted (C1-C30)alkyl, or a substituted or unsubstituted (C3-C30)cycloalkyl; and R, $R_1$, and n are as defined in formula 1. According to one embodiment of the present disclosure, $R'_1$ to $R'_4$, each independently, represent hydrogen, or a substituted or unsubstituted (C1-C20)alkyl. According to another embodiment of the present disclosure, $R'_1$ to $R'_4$, each independently, represent hydrogen, or a (C1-C10)alkyl unsubstituted or substituted with deuterium. Specifically, $R'_1$ to R'4, each independently, may be selected from the group consisting of hydrogen, deuterium, a methyl, an ethyl, a n-propyl, an isopropyl, a n-butyl, an isobutyl, a sec-butyl, a tert-butyl, a n-pentyl, a tert-pentyl, a neopentyl, an isopentyl, a sec-pentyl, a sec-isopentyl, and 3-pentyl; and the hydrogen in $R'_1$ to $R'_4$ may be substituted with deuterium. For example, $R'_1$ to $R'_4$, each independently, may be hydrogen, or a methyl unsubstituted or substituted with deuterium.

According to one embodiment of the present disclosure, the organic electroluminescent compound may comprise the compound represented by the following formula 2-1 or 2-2.

(2-1)

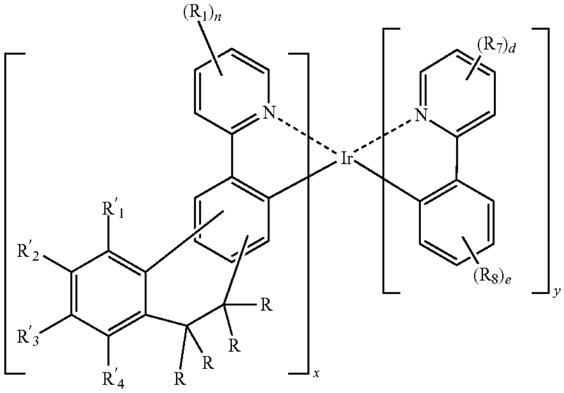

-continued (2-2)

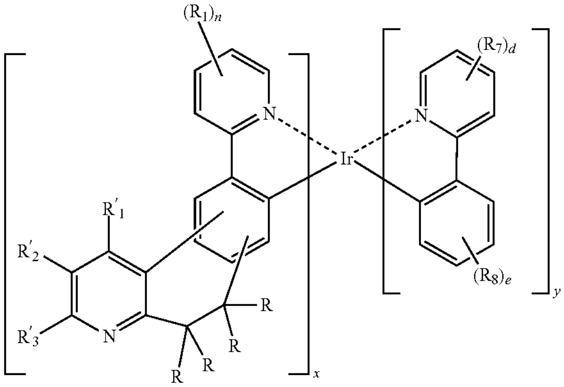

In formulas 2-1 and 2-2, $R'_1$ to $R'_4$ are as defined in formulas 1-1 and 1-2; R, $R_1$, and n are as defined in formula 1; x and y are as defined in formula 2; and $R_7$, $R_8$, d, and e are as defined in formula 4.

The organic electroluminescent compound of the present disclosure includes the following compounds, but is not limited thereto.

C-1

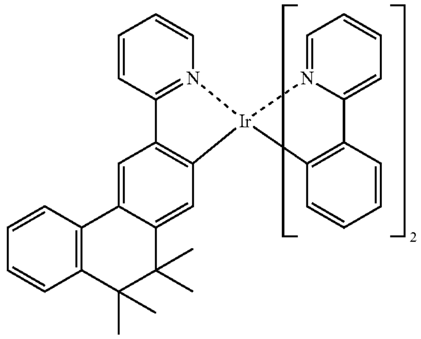

C-2

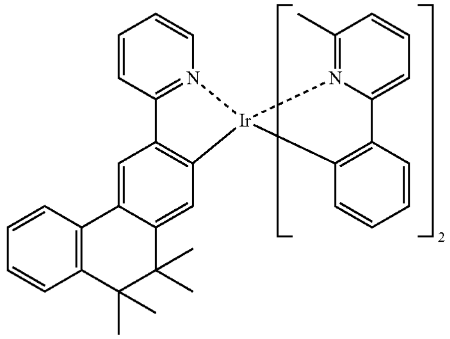

-continued
C-3
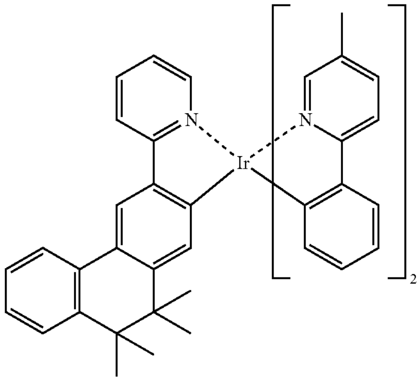
C-4
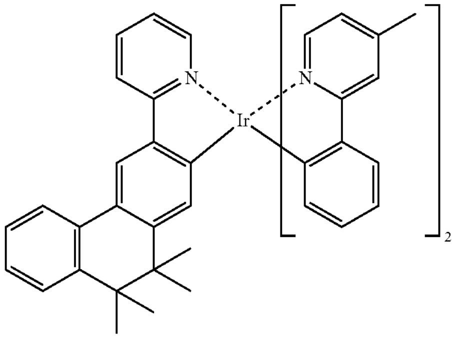
C-5
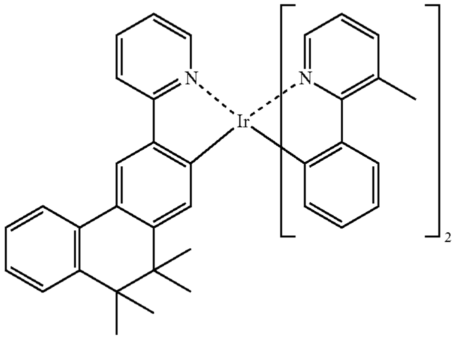
C-6
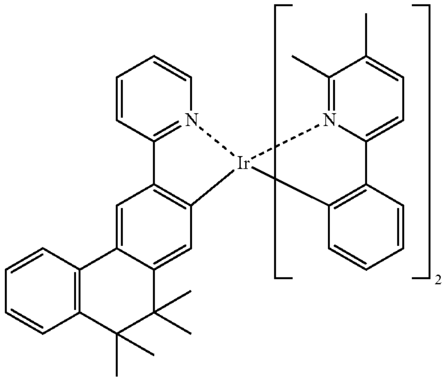
-continued
C-7
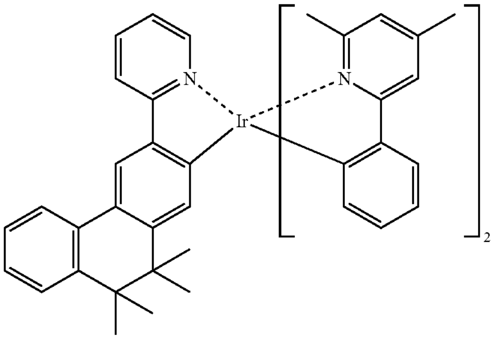
C-8
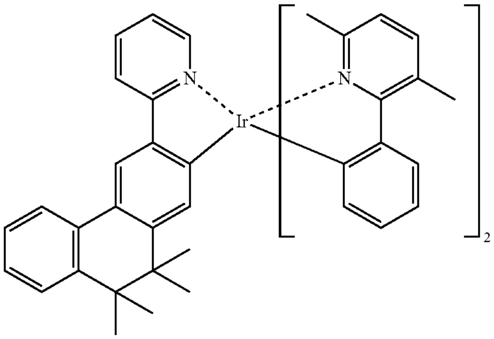
C-9
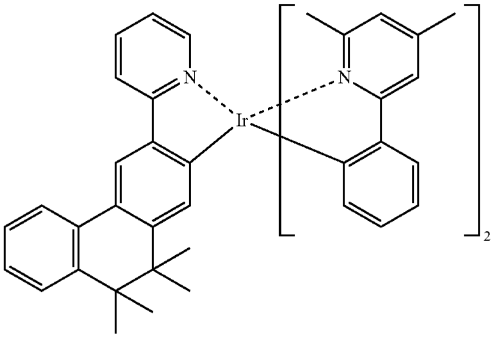
C-10
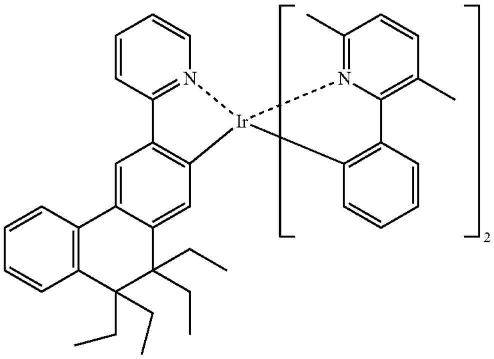

-continued
C-11
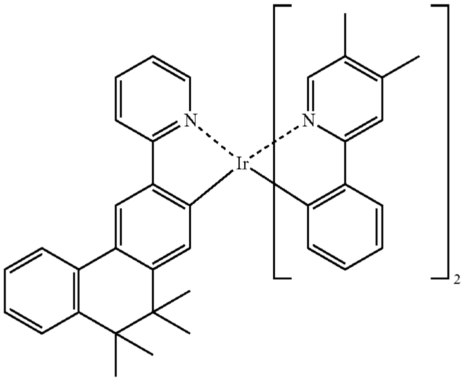
C-12
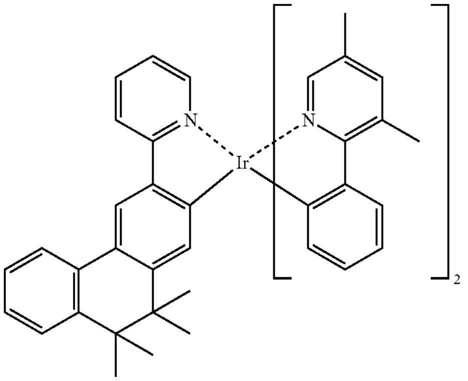
C-13
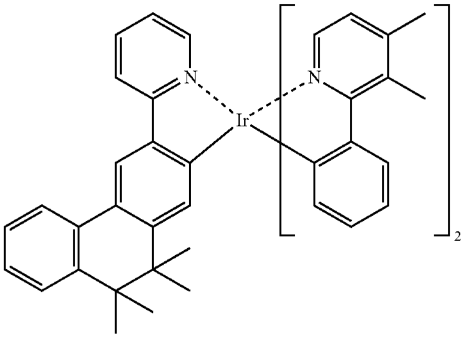
C-14
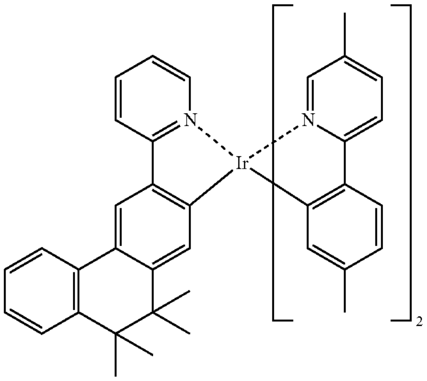
-continued
C-15
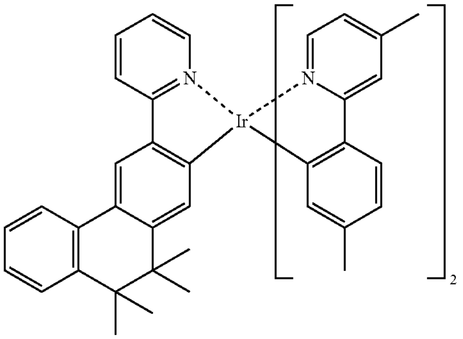
C-16
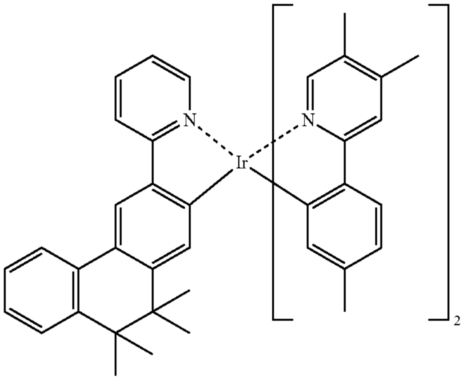
C-17
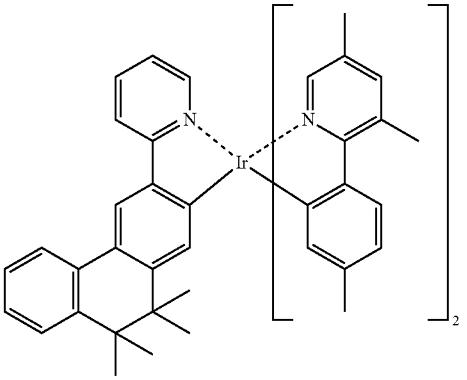
C-18
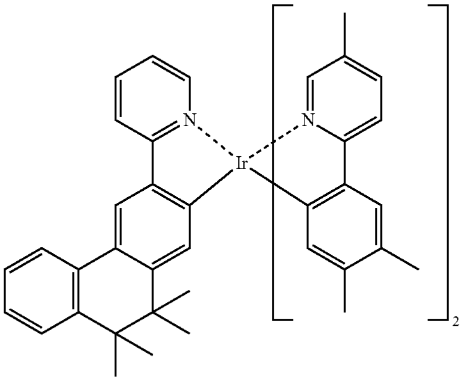

-continued
C-19
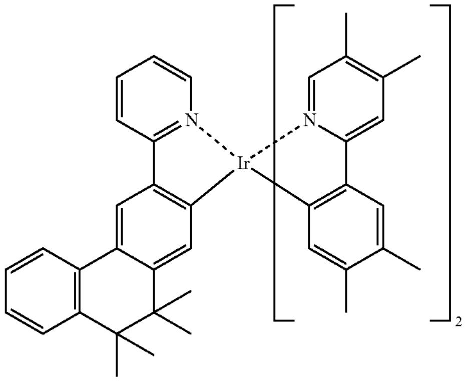
C-20
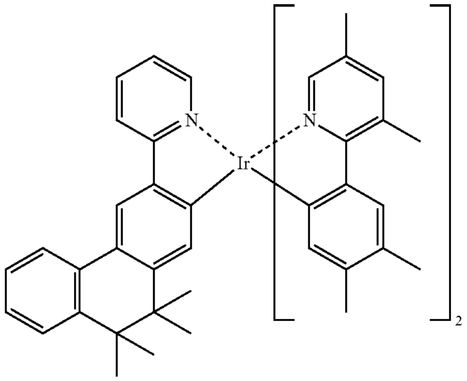
C-21
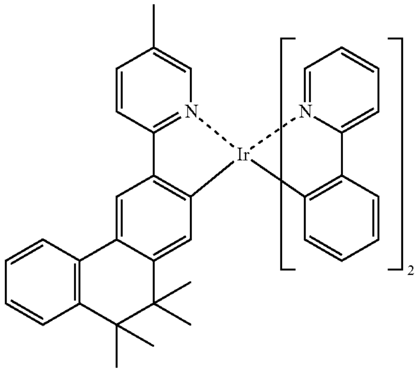
C-22
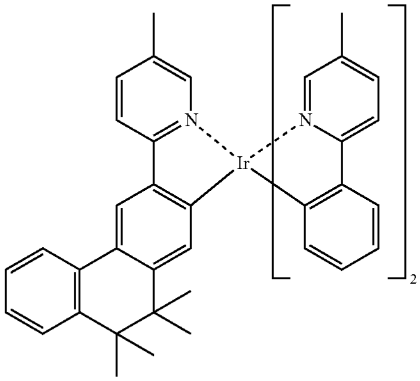
-continued
C-23
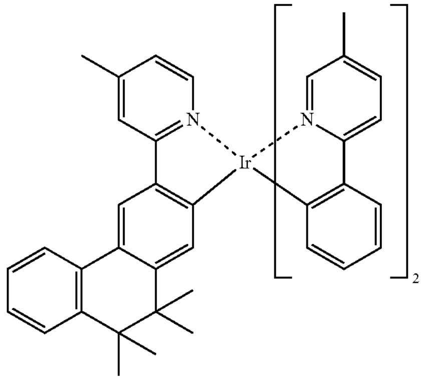
C-24
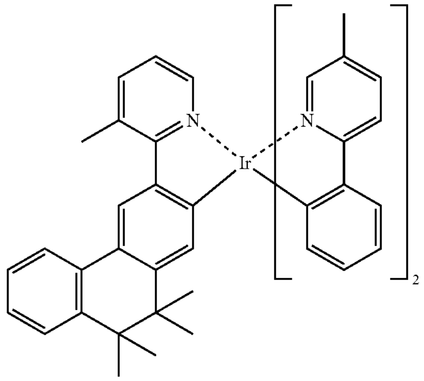
C-25
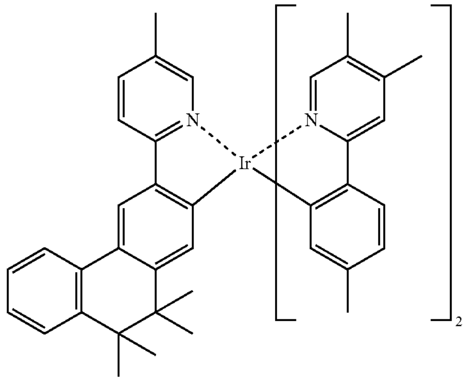
C-26
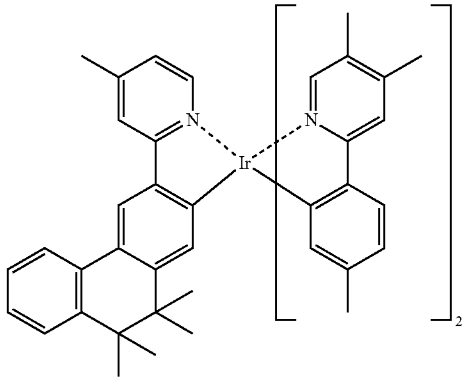

-continued
C-27
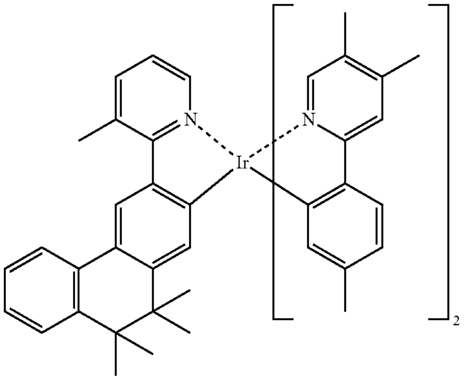
C-28
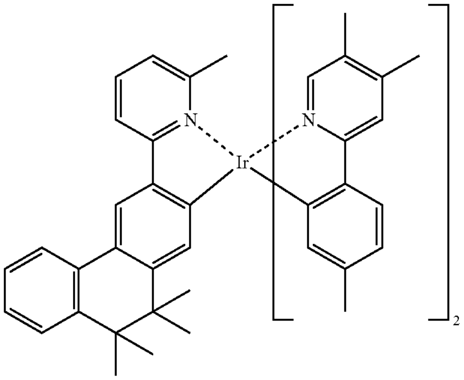
C-29
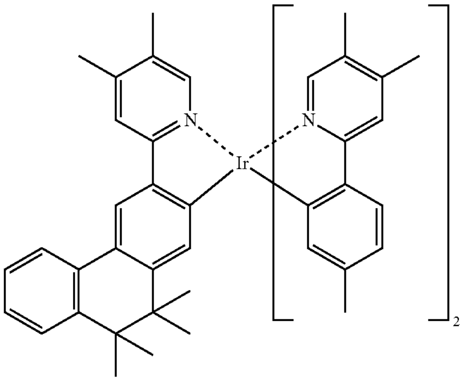
C-30
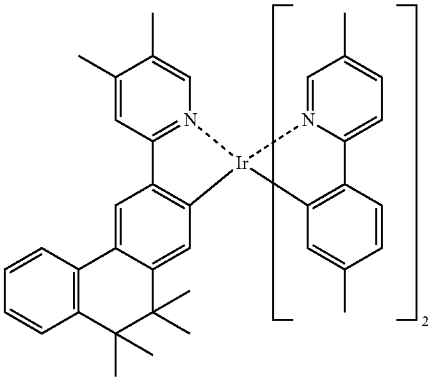
-continued
C-31
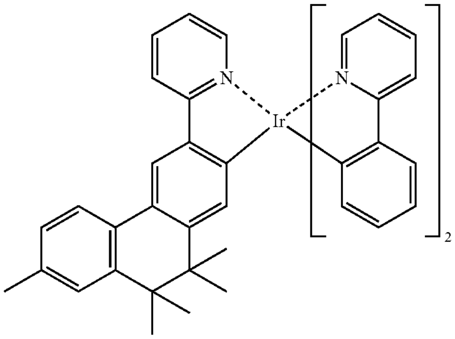
C-32
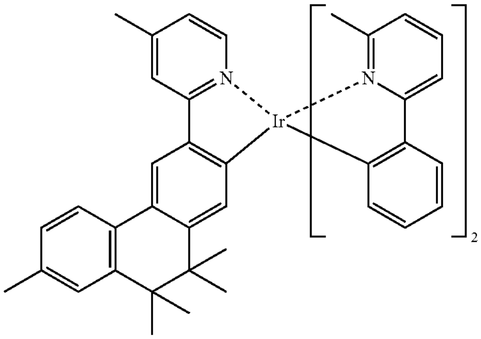
C-33
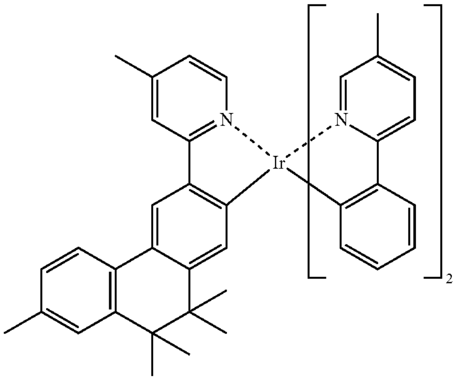
C-34
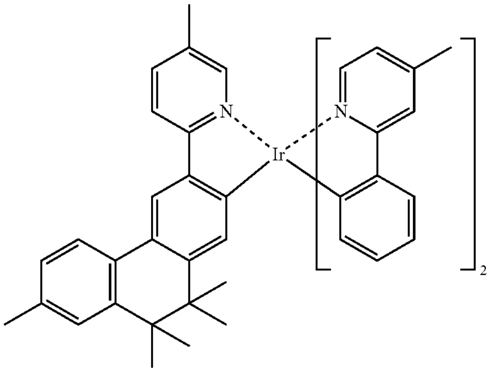

-continued
C-35
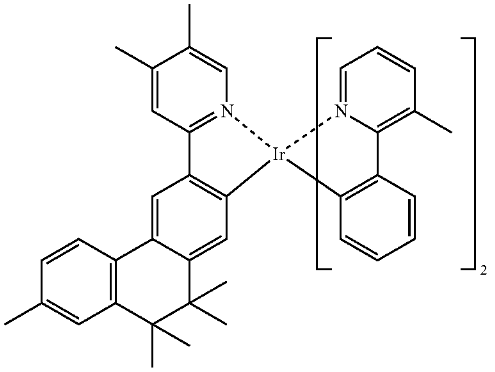
C-36
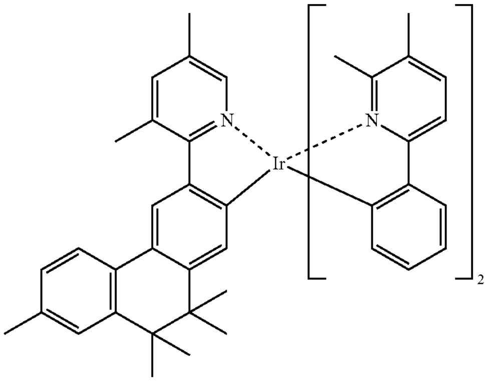
C-37
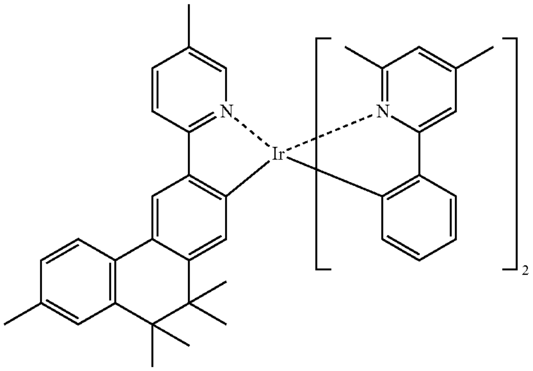
C-38
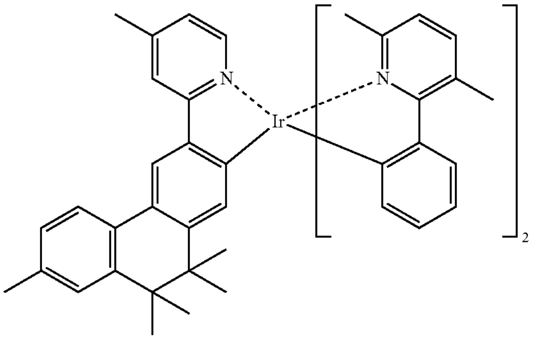
-continued
C-39
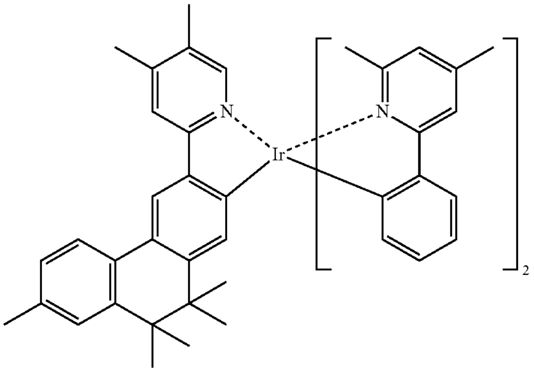
C-40
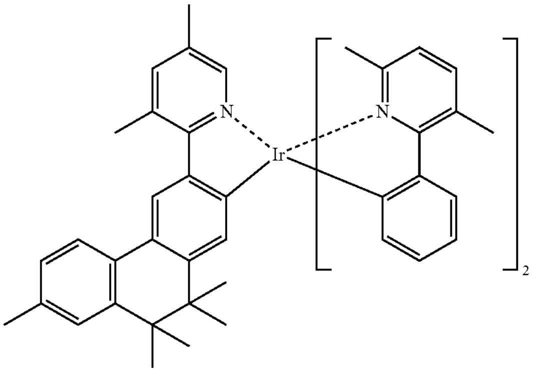
C-41
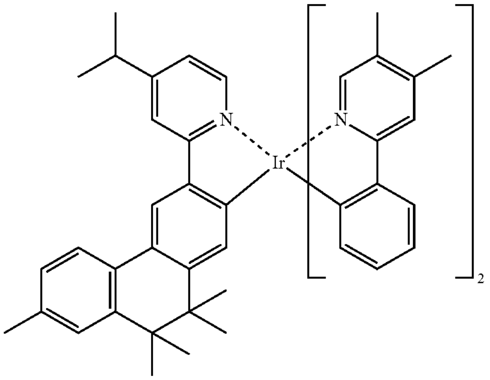
C-42
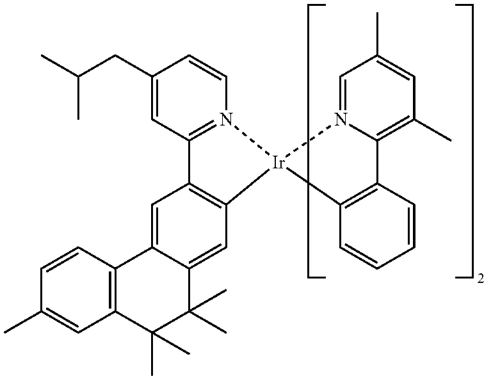

-continued
C-43
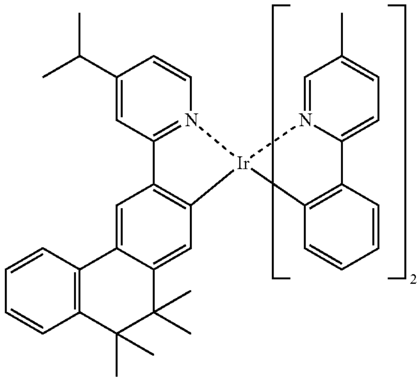
C-44
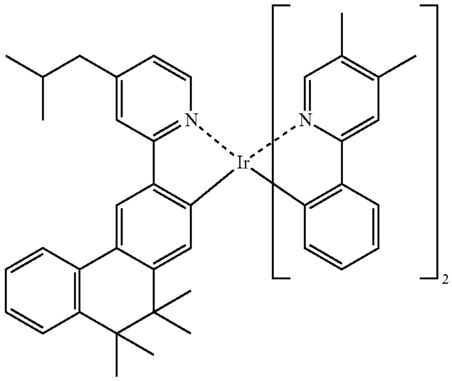
C-45
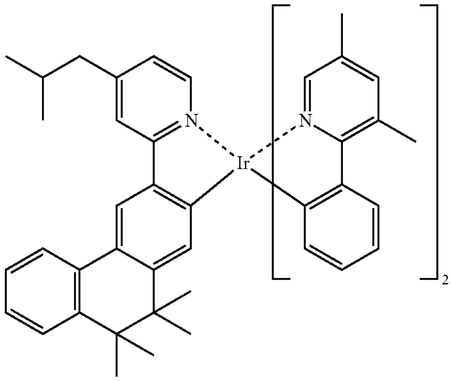
C-46
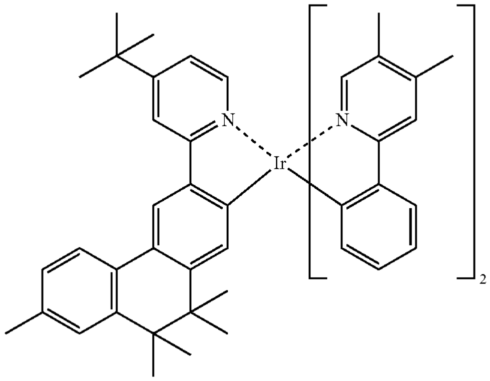
-continued
C-47
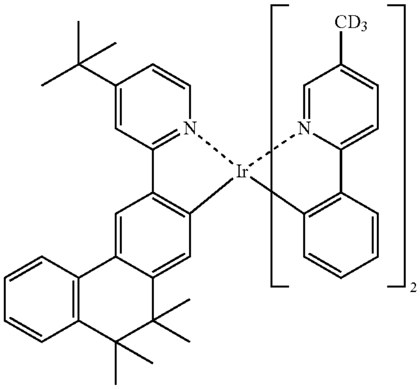
C-48
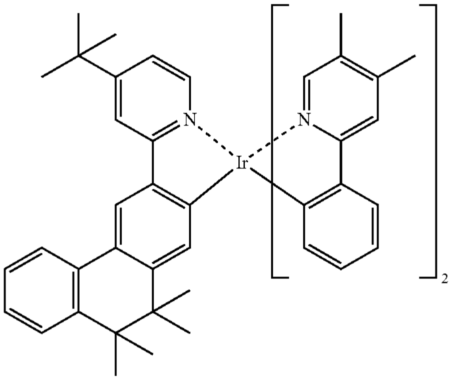
C-49
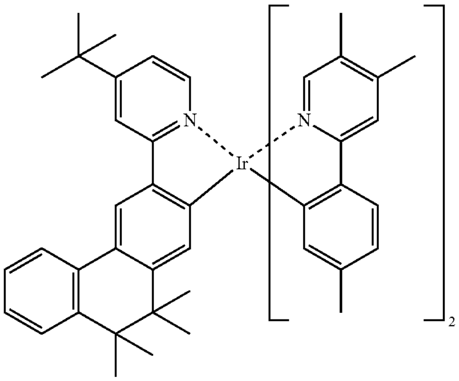
C-50
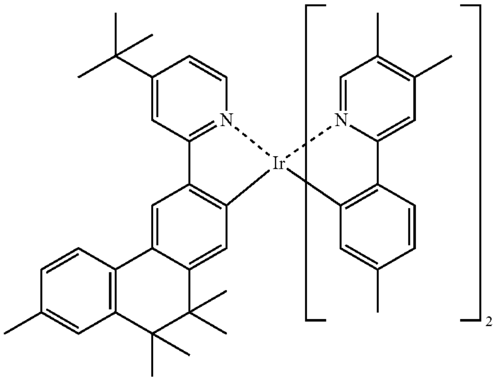

-continued
C-51
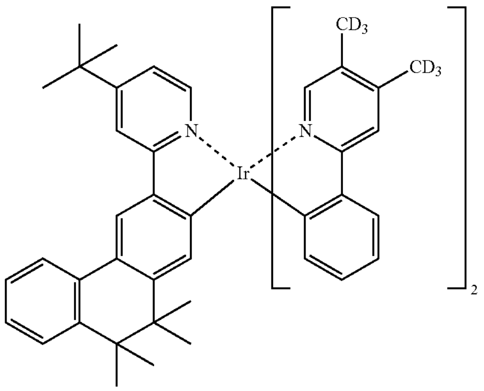
C-52
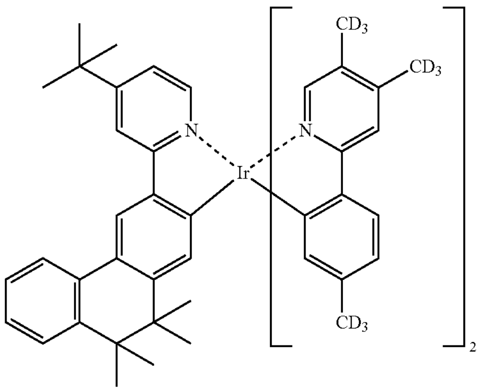
C-53
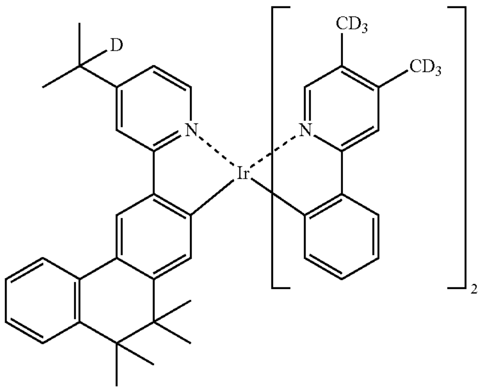
C-54
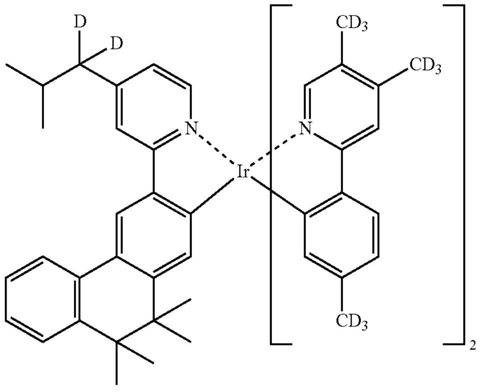
-continued
C-55
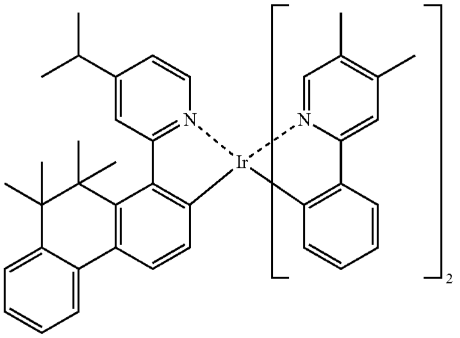
C-56
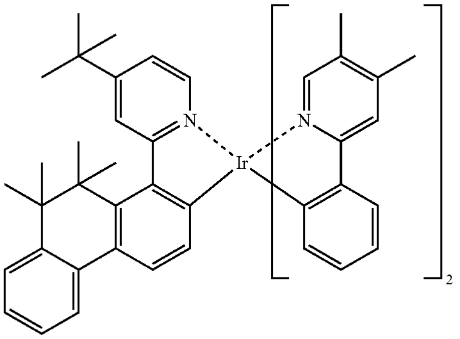
C-57
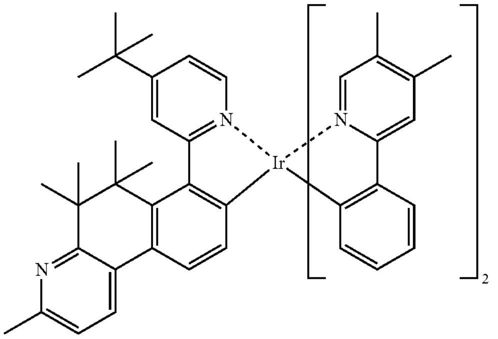
C-58
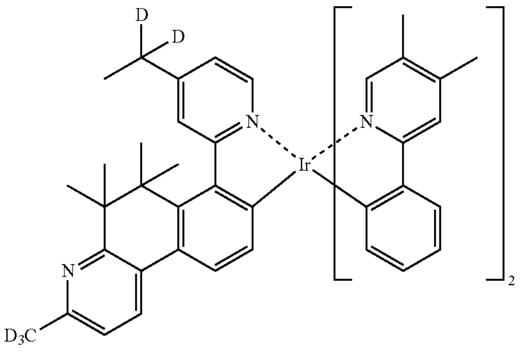

-continued
C-59
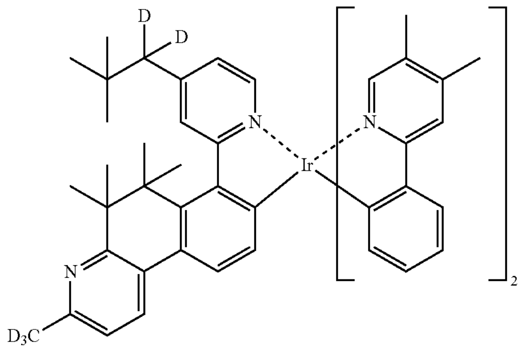
C-60
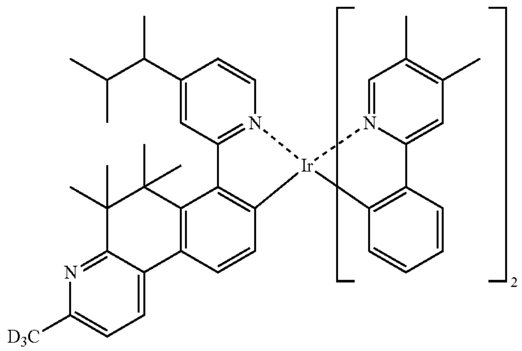
C-61
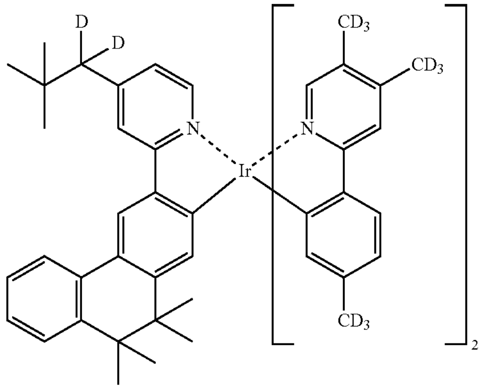
C-62
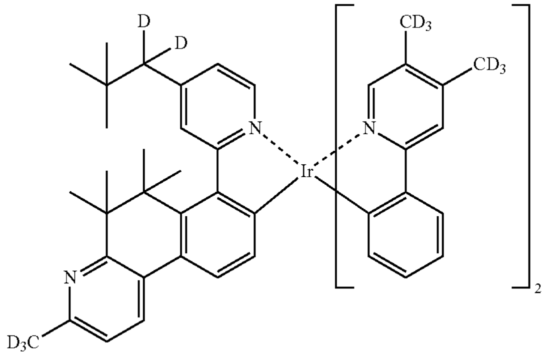
-continued
C-63
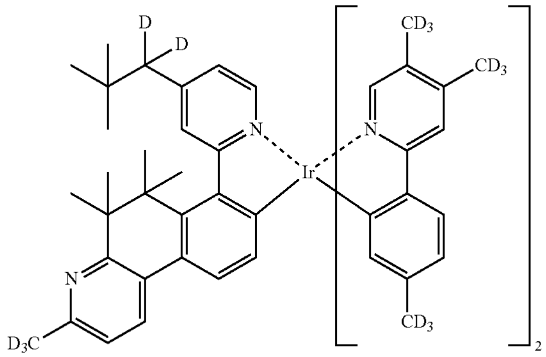
C-64
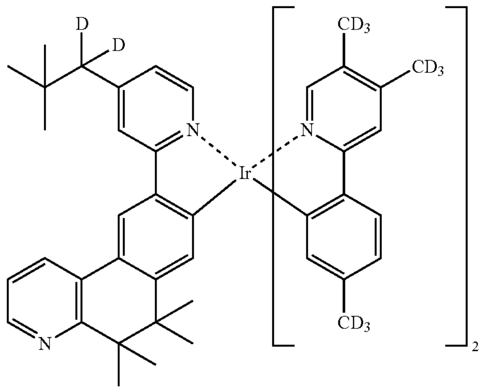
C-65
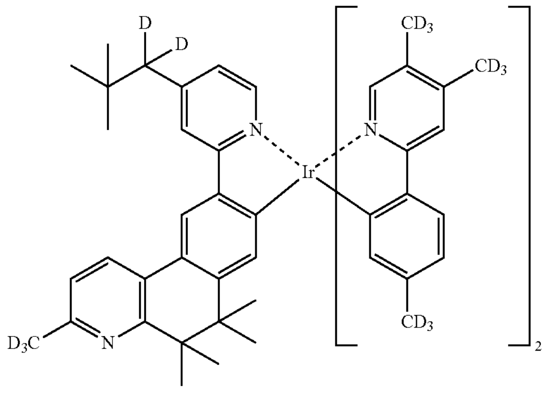
C-66
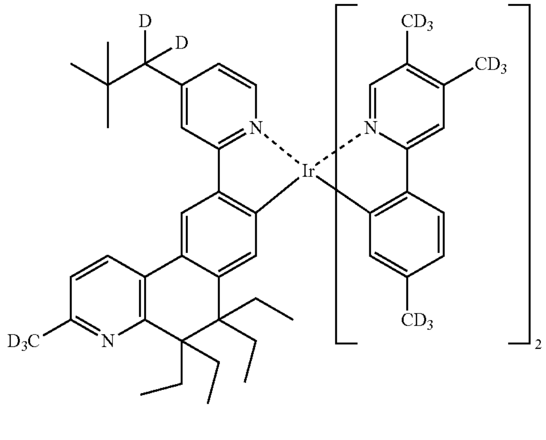

-continued
C-67
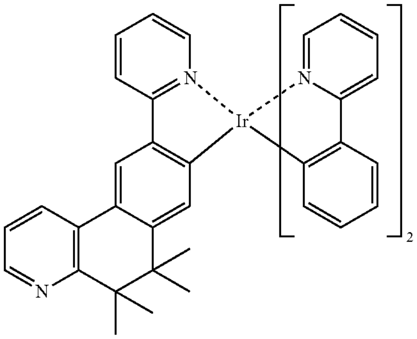
C-68
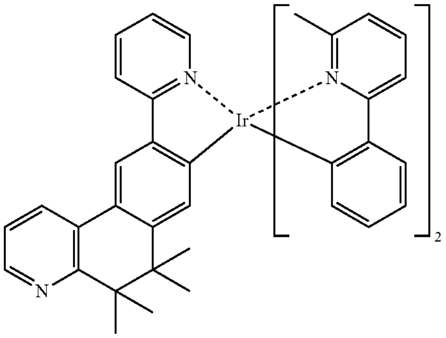
C-69
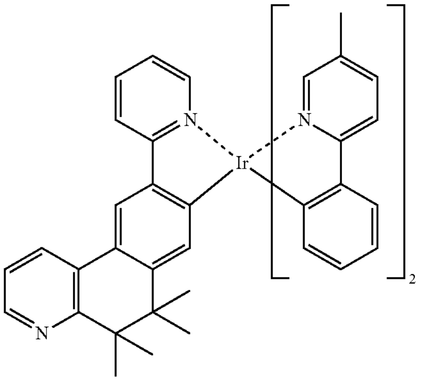
C-70
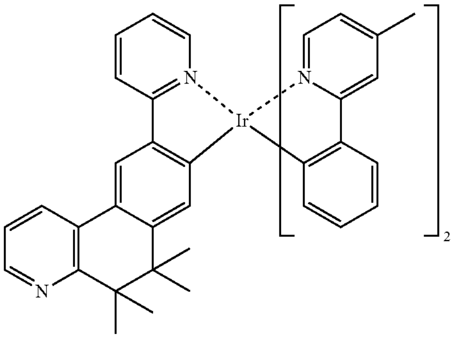
-continued
C-71
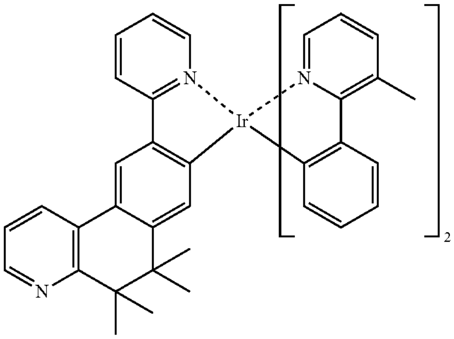
C-72
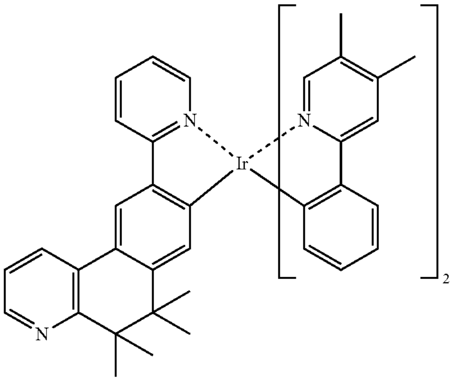
C-73
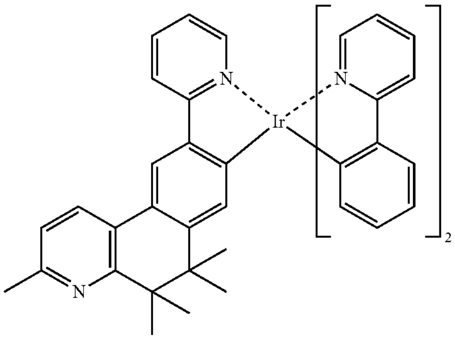
C-74
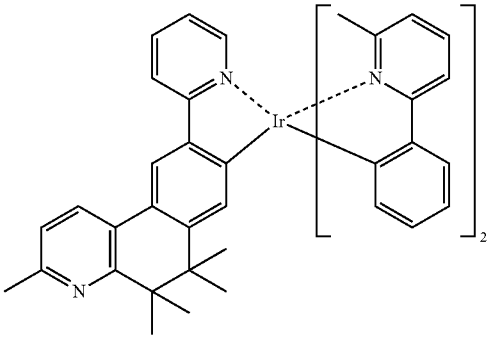

-continued
C-75
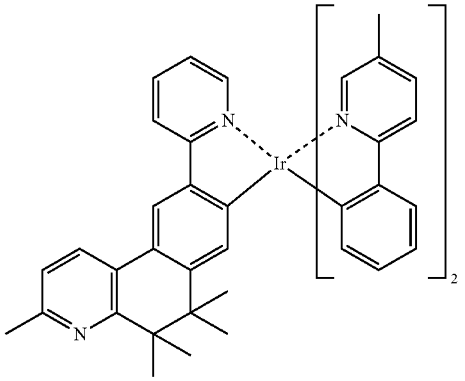
C-76
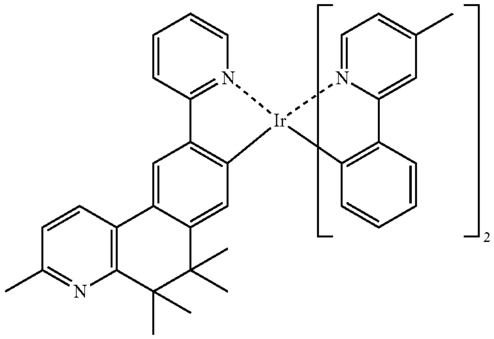
C-77
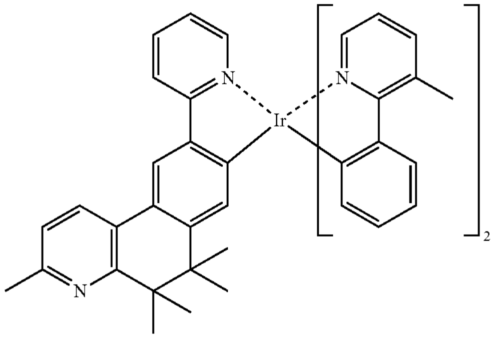
C-78
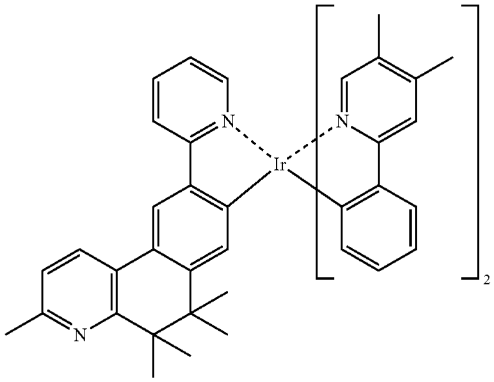
-continued
C-79
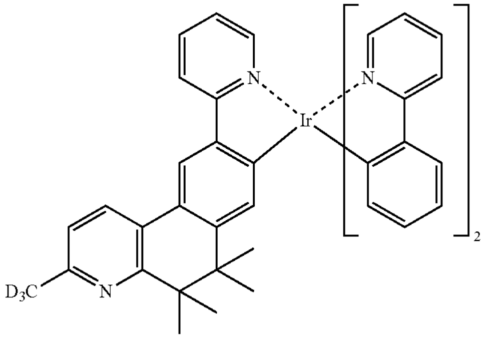
C-80
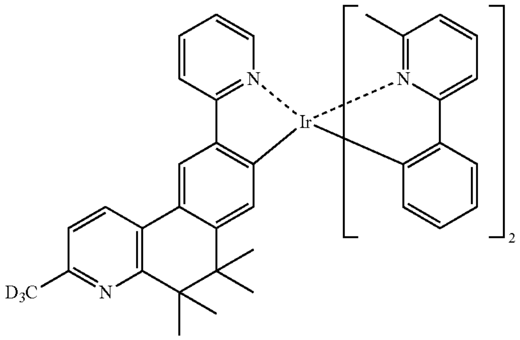
C-81
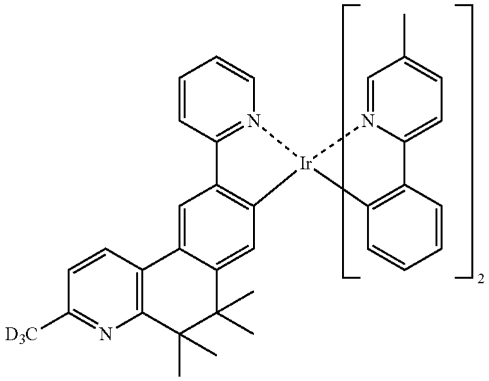
C-82
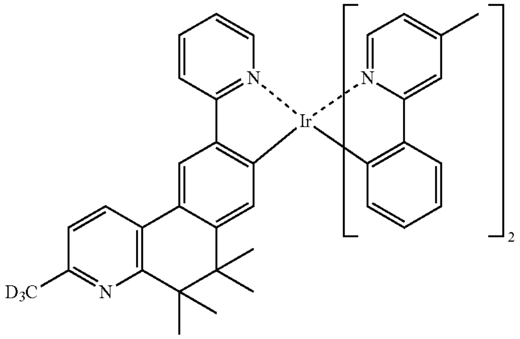

-continued
C-83
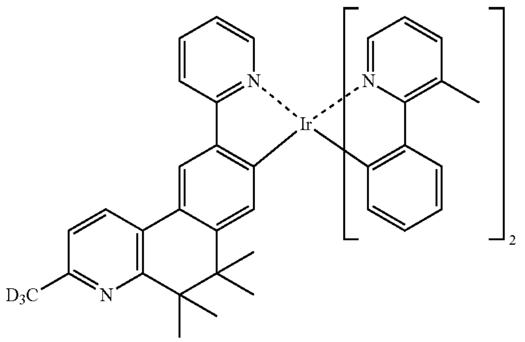
C-84
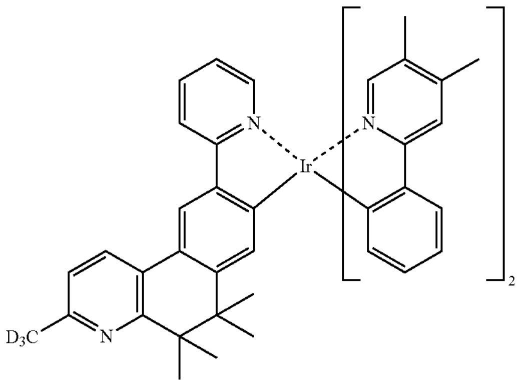
C-85
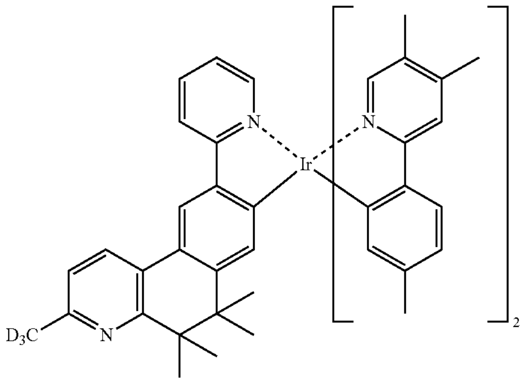
C-86
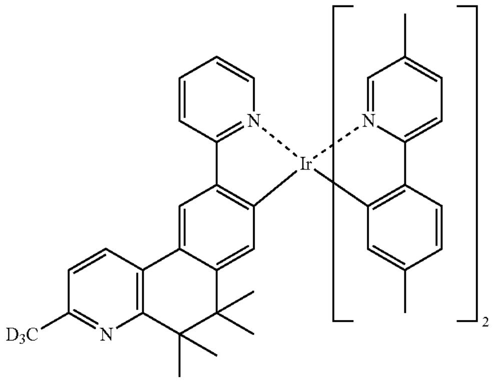
-continued
C-87
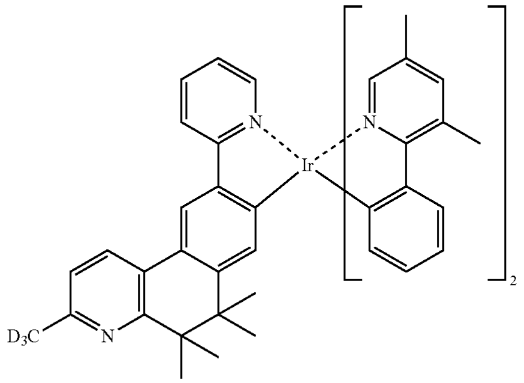
C-88
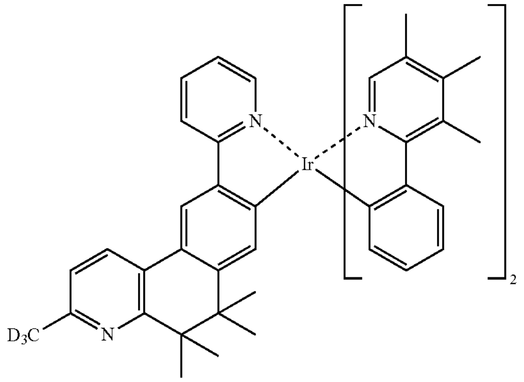
C-89
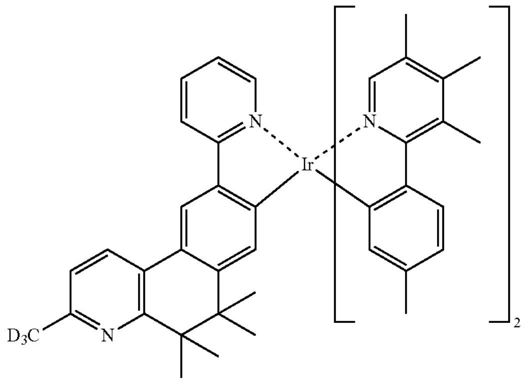
C-90
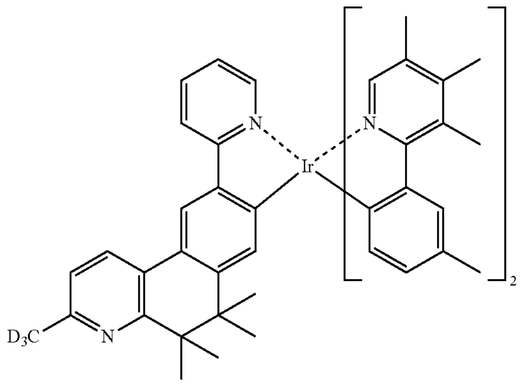

-continued
C-91
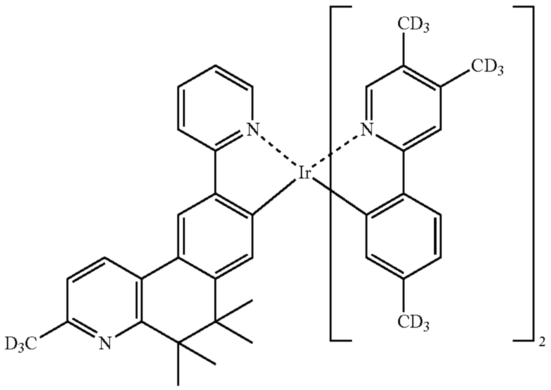
C-92
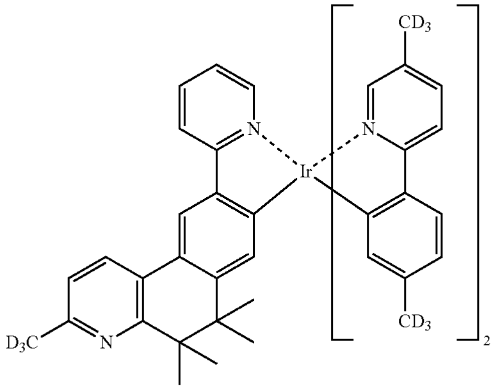
C-93
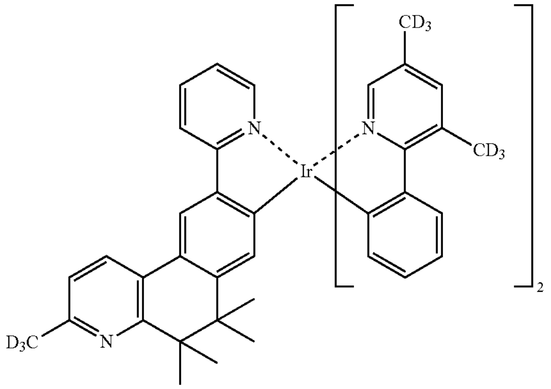
C-94
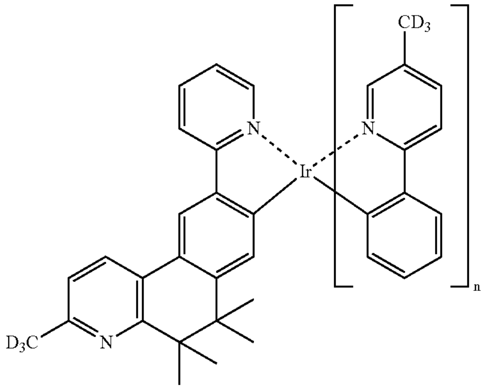
-continued
C-95
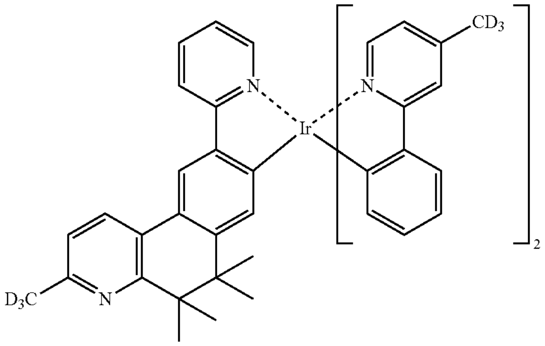
C-96
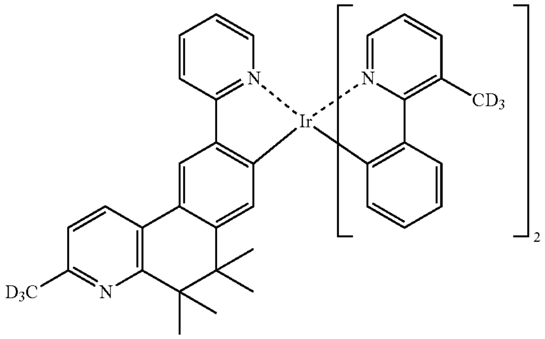
C-97
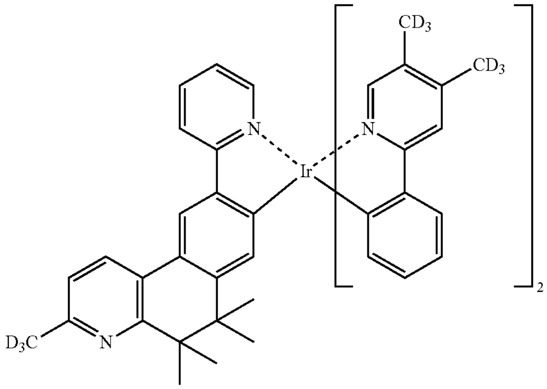
C-98
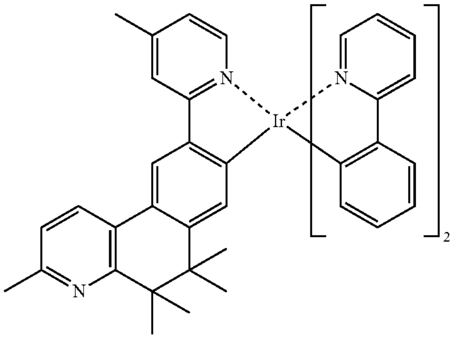

-continued
C-99
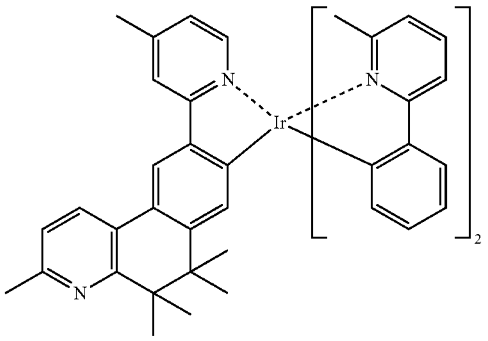
C-100
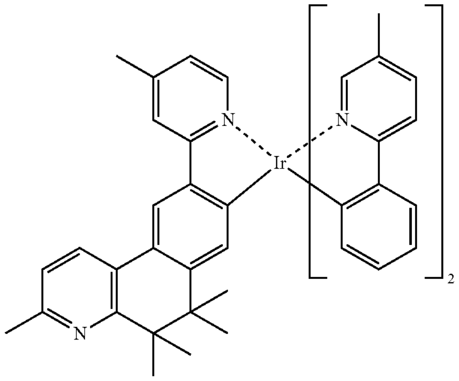
C-101
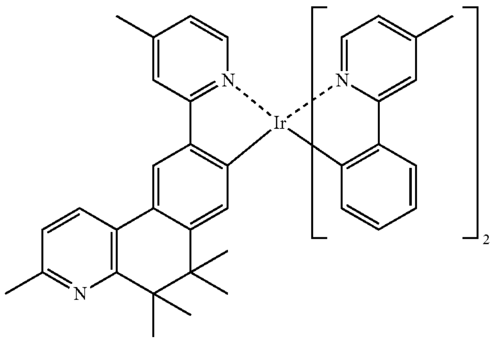
C-102
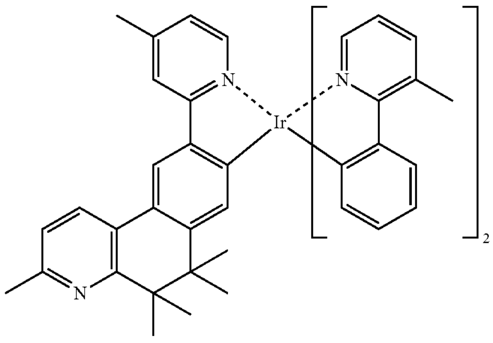
-continued
C-103
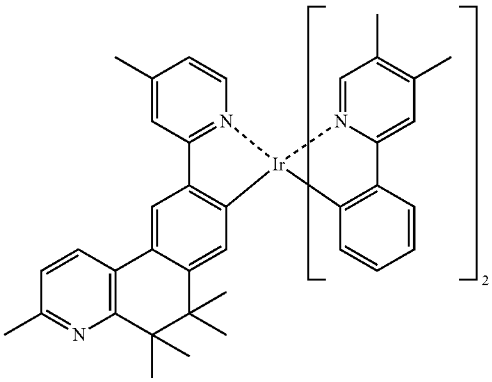
C-104
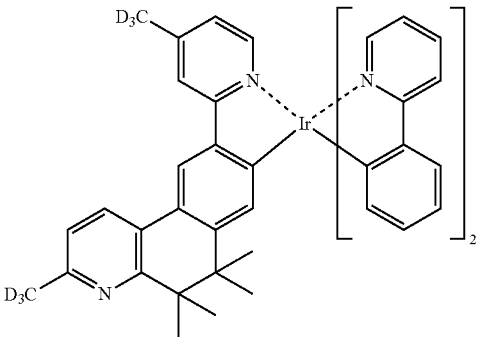
C-105
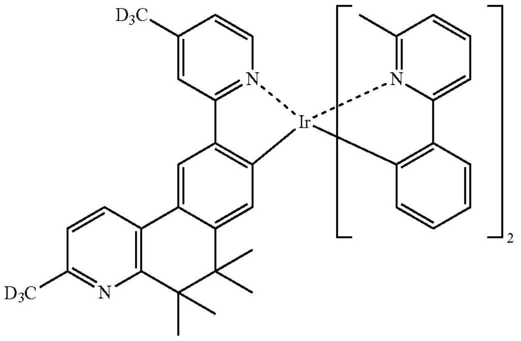
C-106
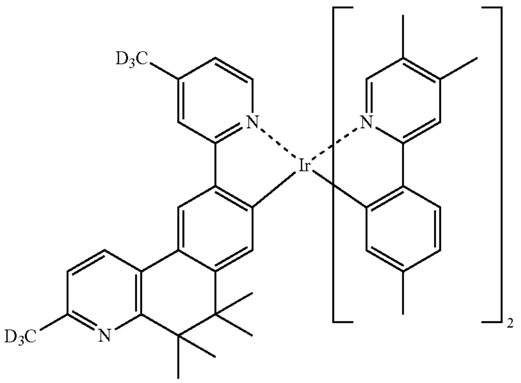

-continued
C-107
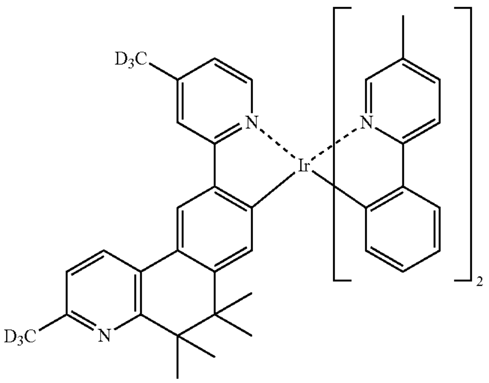
C-108
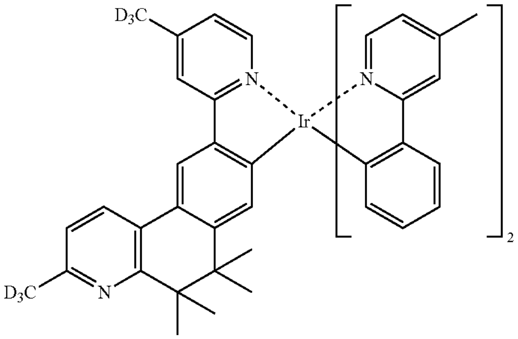
C-109
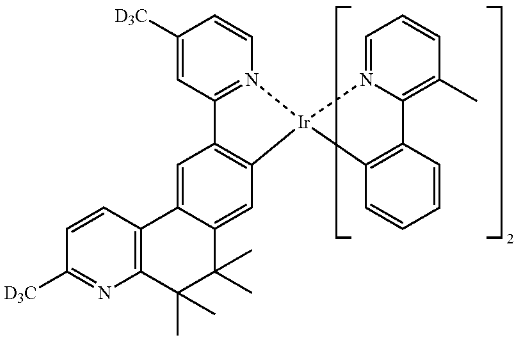
C-110
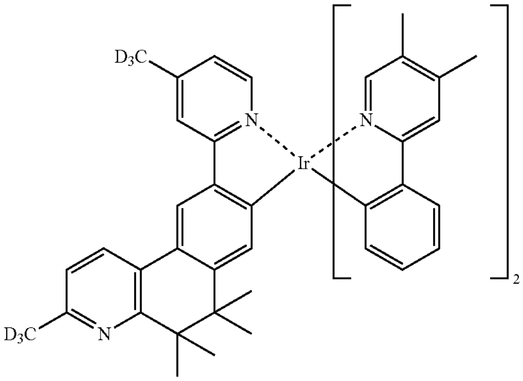
-continued
C-111
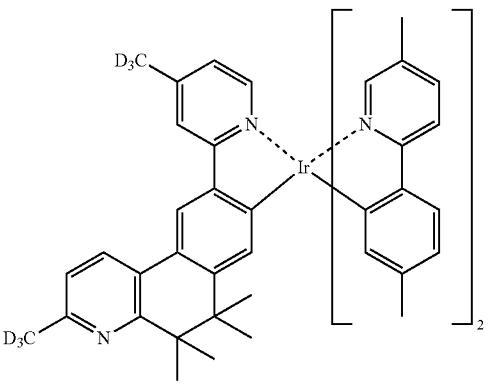
C-112
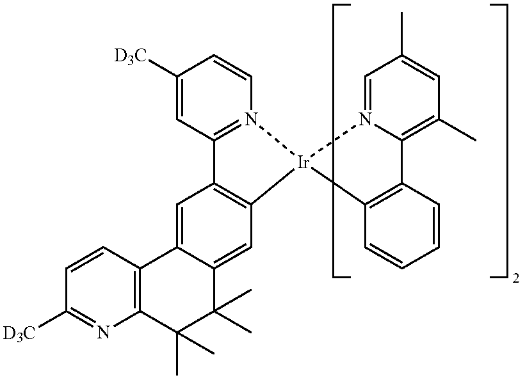
C-113
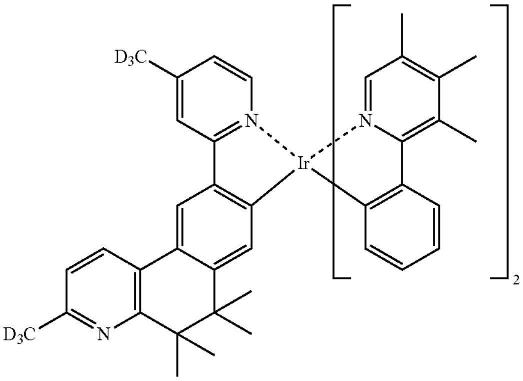
C-114
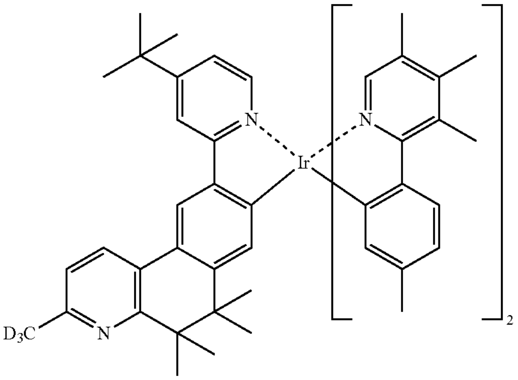

-continued
C-115
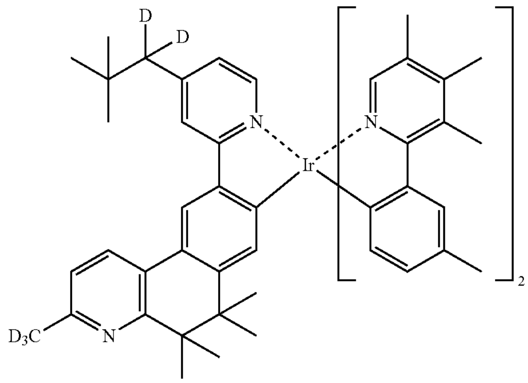
C-116
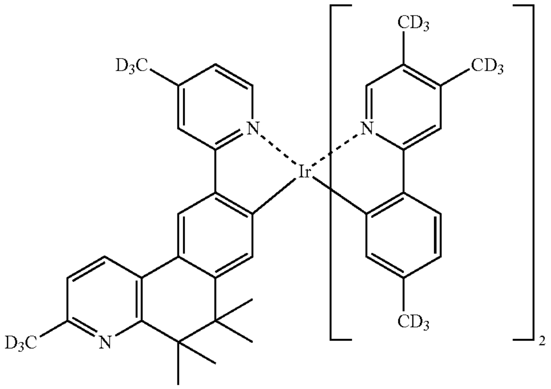
C-117
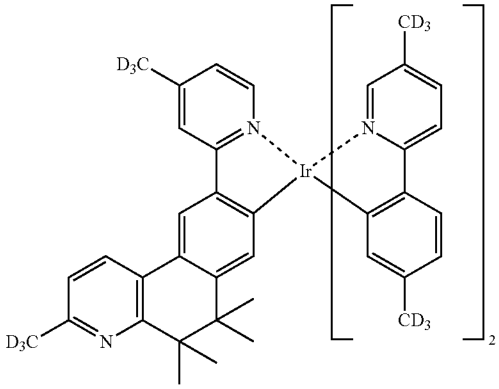
C-118
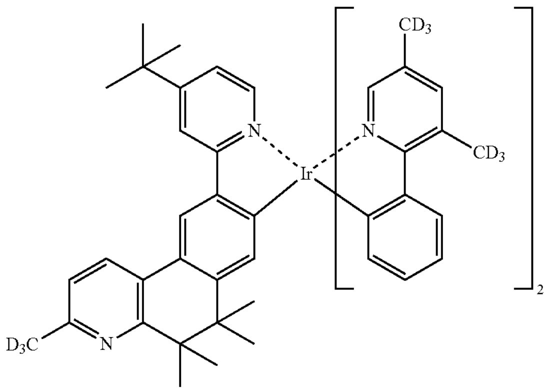
-continued
C-119
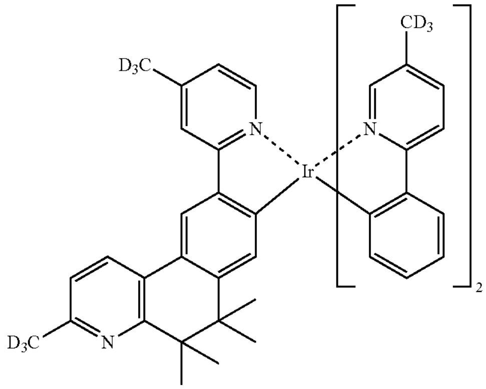
C-120
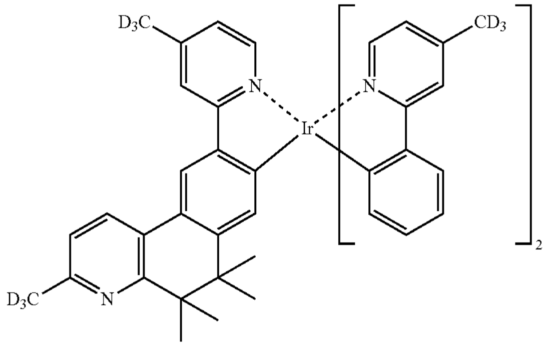
C-121
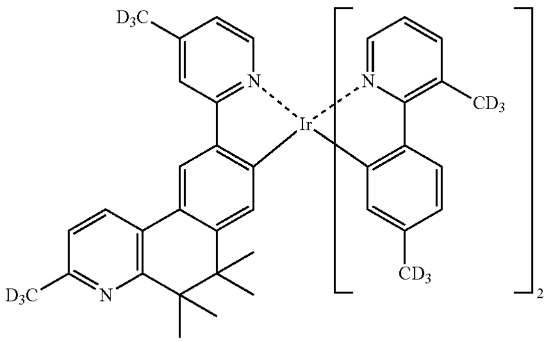
C-122
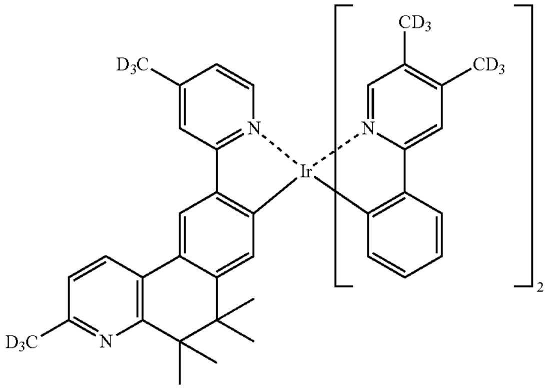
The compound of formula 1 according to the present disclosure may be synthesized as shown in the following reaction scheme 1, but is not limited thereto.

[Reaction Scheme 1]

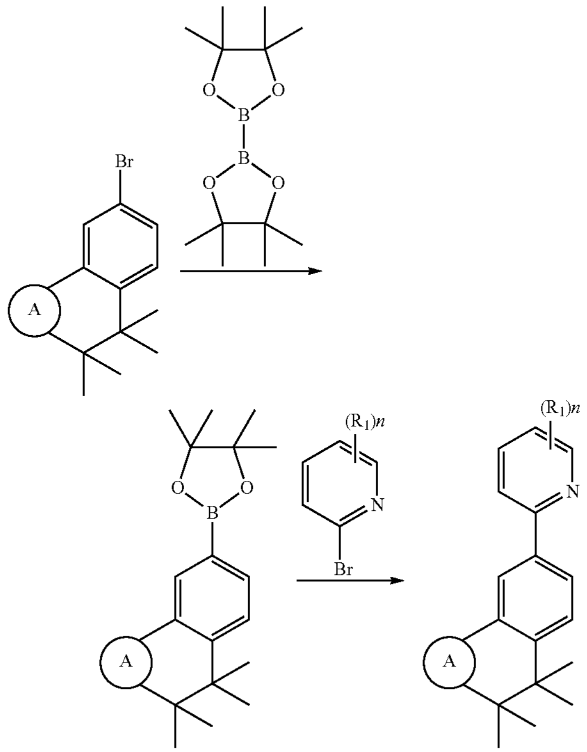

In reaction scheme 1, ring A, $R_1$, and n are as defined in formula 1.

A host compound, which can be used in combination with the organic electroluminescent compound of the present disclosure, includes the compound represented by any one of the following formulas 11 to 13, but is not limited thereto.

(11)

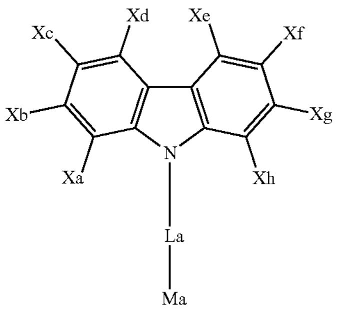

(12)

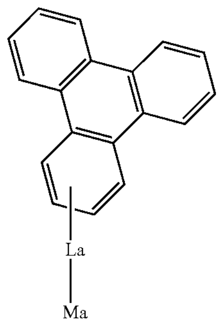

-continued (13)

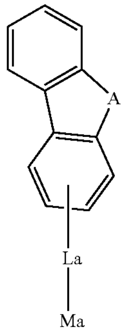

In formulas 11 to 13,

Ma represents a substituted or unsubstituted (C6-C30) aryl, or a substituted or unsubstituted (6- to 30-membered)heteroaryl;

La represents a single bond, a substituted or unsubstituted (C6-C30)arylene, or a substituted or unsubstituted (6- to 30-membered)heteroarylene;

A represents S, O, $NR_9$, or $CR_{10}R_{11}$;

Xa to Xh, each independently, represent hydrogen, deuterium, a halogen, a cyano, a substituted or unsubstituted (C1-C30)alkyl, a substituted or unsubstituted (C2-C30)alkenyl, a substituted or unsubstituted (C2-C30)alkynyl, a substituted or unsubstituted (C3-C30) cycloalkyl, a substituted or unsubstituted (C6-C60)aryl, a substituted or unsubstituted (3- to 30-membered) heteroaryl, a substituted or unsubstituted tri(C1-C30) alkylsilyl, a substituted or unsubstituted tri(C6-C30) arylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted (C1-C30)alkyl(C6-C30)arylamino, or a substituted or unsubstituted mono- or di-(C6-C30)arylamino; or may be linked to an adjacent substituent to form a ring(s); and $R_9$ to $R_{11}$, each independently, represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino; or $R_9$ and $R_{10}$ may be linked to each other to form a ring(s).

In formulas 11 to 13, La represents, preferably a single bond; a substituted or unsubstituted (C6-C25)arylene; or a substituted or unsubstituted (6- to 25-membered)heteroarylene. More preferably, La represents a single bond; an unsubstituted (C6-C18)arylene; or a (6- to 20-membered) heteroarylene unsubstituted or substituted with a phenyl(s), a biphenyl(s), and/or a carbazolyl(s). For example, La may represent a single bond; an unsubstituted phenylene; an unsubstituted naphthylene; an unsubstituted biphenylene; a pyridinylene unsubstituted or substituted with a phenyl(s); a pyrimidinylene unsubstituted or substituted with a phenyl(s), a biphenyl(s), and/or a carbazolyl(s); a triazinylene unsubstituted or substituted with a phenyl(s), a biphenyl(s), and/or a carbazolyl(s); an unsubstituted quinolinylene; a quinazolinylene unsubstituted or substituted with a phenyl(s); an unsubstituted quinoxalinylene; an unsubstituted carbazolylene; an unsubstituted dibenzothiophenylene; an unsubstituted benzofuropyrimidinylene; an unsubstituted benzothienopyrimidinylene; an unsubstituted benzoquinazolinylene; or an unsubstituted nitrogen- and/or sulfur-containing (20-membered)heteroarylene.

In formulas 11 to 13, Ma represents, preferably a substituted or unsubstituted (C6-C25)aryl, or a substituted or unsubstituted (6- to 25-membered)heteroaryl; and more preferably a substituted or unsubstituted (C6-C18)aryl, or a substituted or unsubstituted (6- to 20-membered)heteroaryl. For example, Ma may represent a substituted or unsubstituted phenyl, a substituted or unsubstituted naphthylphenyl, an unsubstituted naphthyl, an unsubstituted biphenyl, a fluorenyl substituted with a methyl(s), an unsubstituted terphenyl, an unsubstituted triphenylenyl, a substituted pyrimidinyl, a substituted triazinyl, a substituted quinoxalinyl, a substituted quinazolinyl, a substituted or unsubstituted carbazolyl, an unsubstituted dibenzothiophenyl, a benzofuropyrimidinyl substituted with a phenyl(s), a benzothienopyrimidinyl substituted with a phenyl(s), a benzoquinazolinyl substituted with a phenyl(s), or an indolocarbazolyl substituted with a phenyl(s), in which the substituent of the substituted phenyl may be at least one selected from the group consisting of a carbazolyl unsubstituted or substituted with a phenyl(s), a pyrimidinyl substituted with a phenyl(s), a triphenylsilyl, a dibenzothiophenyl, dimethylfluorenyl, and a triphenylenyl; the substituent of the substituted pyrimidinyl may be at least one selected from the group consisting of a phenyl, a biphenyl, and a terphenyl; the substituent of the substituted triazinyl may be at least one selected from the group consisting of a phenyl unsubstituted or substituted with a triphenylsilyl(s), a biphenyl, a naphthyl, and a terphenyl; the substituent of the substituted quinoxalinyl may be at least one selected from the group consisting of a phenyl, a naphthyl, a biphenyl, and a naphthylphenyl; the substituent of the substituted quinazolinyl may be at least one selected from the group consisting of a phenyl and a biphenyl; and the substituent of the substituted carbazolyl may be at least one selected from the group consisting of a phenyl unsubstituted or substituted with a diphenyltriazinyl(s), a biphenyl, a naphthyl, and a terphenyl.

In formula 11, Xa to Xh, each independently, represent, preferably hydrogen, a substituted or unsubstituted (C6-C18)aryl, or a substituted or unsubstituted (6- to 20-membered)heteroaryl; or may be linked to an adjacent substituent to form a substituted or unsubstituted, mono- or polycyclic, (C6-C20) aromatic ring, whose carbon atom(s) may be replaced with at least one heteroatom selected from nitrogen, oxygen, and sulfur; and more preferably, hydrogen, a substituted or unsubstituted (C6-C15)aryl, or a substituted or unsubstituted (10- to 20-membered)heteroaryl unsubstituted or substituted with a (C6-C18)aryl(s); or may be linked to an adjacent substituent to form a substituted or unsubstituted benzene ring, a substituted or unsubstituted indole ring, a substituted or unsubstituted benzoindole ring, a substituted or unsubstituted indene ring, a substituted or unsubstituted benzofuran ring, or a substituted or unsubstituted benzothiophene ring. For example, Xa to Xh, each independently, may represent hydrogen, a substituted or unsubstituted phenyl, an unsubstituted biphenyl, a substituted or unsubstituted carbazolyl, an unsubstituted dibenzofuranyl, or an unsubstituted dibenzothiophenyl; or may be linked to an adjacent substituent to form an unsubstituted benzene ring, a substituted indene ring, a substituted indole ring, a substituted or unsubstituted benzothiophene ring, an unsubstituted benzofuran ring, or a substituted benzoindole ring, in which the substituent of the substituted phenyl may be at least one selected from the group consisting of a carbazolyl unsubstituted or substituted with a phenyl(s), and dibenzothiophenyl; the substituent of the substituted carbazolyl may be at least one selected from the group consisting of a phenyl, a biphenyl, a naphthyl, and a terphenyl; the substituent of the substituted indene ring may be at least one selected from the group consisting of a methyl and a phenyl; the substituent of the substituted indole ring may be at least one selected from the group consisting of a phenyl, a naphthyl, and a biphenyl; the substituent of the substituted benzothiophene ring may be a triazinyl substituted with at least one phenyl; and the substituent of the substituted benzoindole ring may be at least one selected from the group consisting of a phenyl and a naphthyl.

In formula 13, A represents preferably S or $CR_{12}R_{13}$, in which $R_{12}$ and $R_{13}$, each independently, represent, preferably hydrogen, a substituted or unsubstituted (C1-C30)alkyl, or a substituted or unsubstituted (C6-C25)aryl; or may be linked to each other to form a substituted or unsubstituted, mono- or polycyclic, (C3-C25) alicyclic or aromatic ring, or the combination thereof; and more preferably an unsubstituted (C6-C18)aryl, or may be linked to each other to form an unsubstituted, mono- or polycyclic, (C3-C18) alicyclic or aromatic ring, or the combination thereof. For example, $R_{12}$ and $R_{13}$, each independently, represent a phenyl, or may be linked to each other to form a fluorene ring, a spiro structure.

The compound represented by any one of formulas 11 to 13 includes the following compounds, but is not limited thereto.

B-1

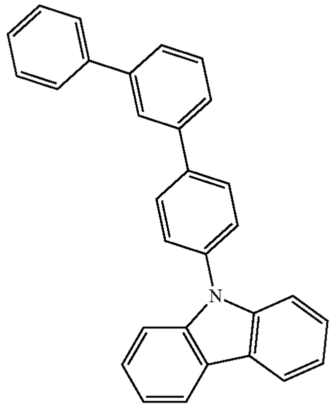

B-2

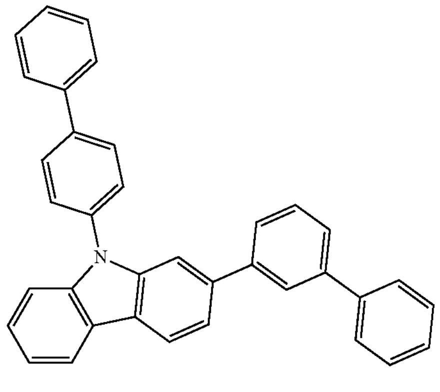

-continued
B-3
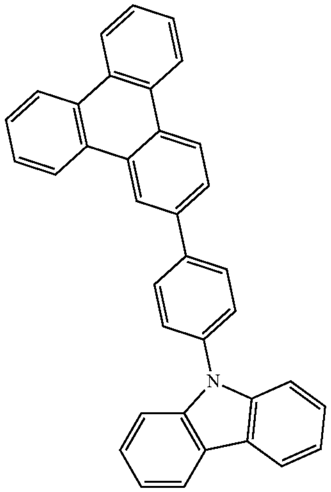
B-4
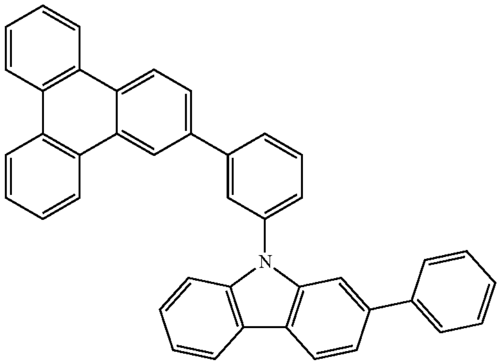
B-5
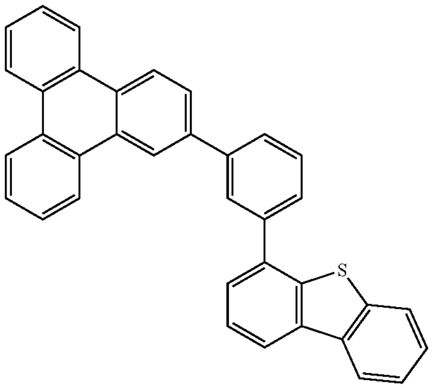
-continued
B-6
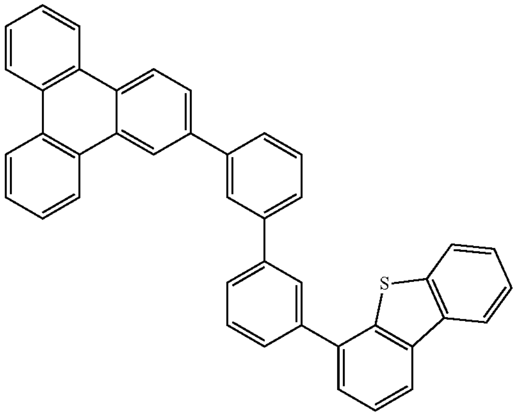
B-7
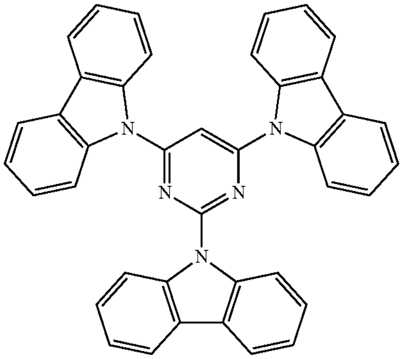
B-8
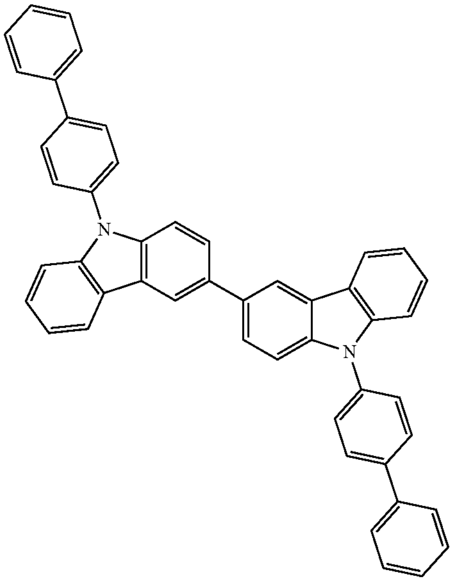

-continued
B-9
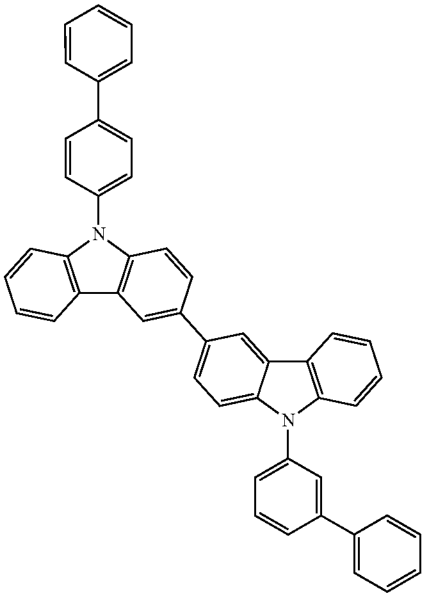
B-11
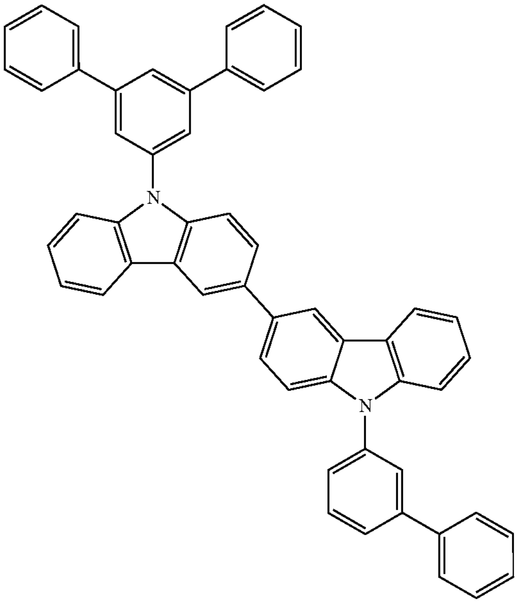
B-10
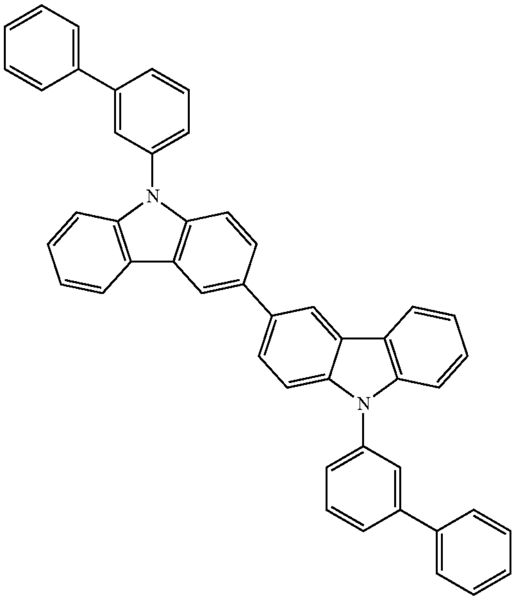
B-12
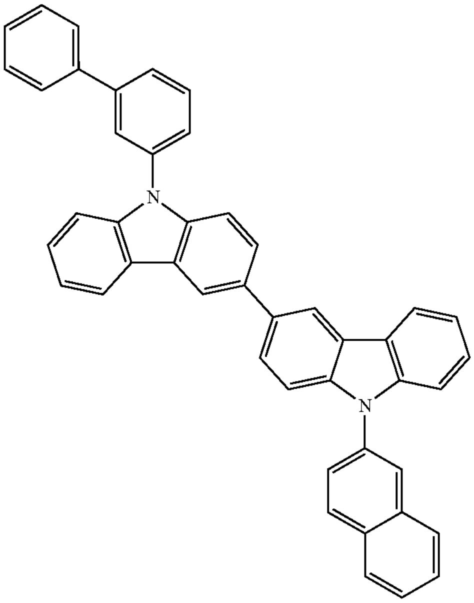

-continued
B-13
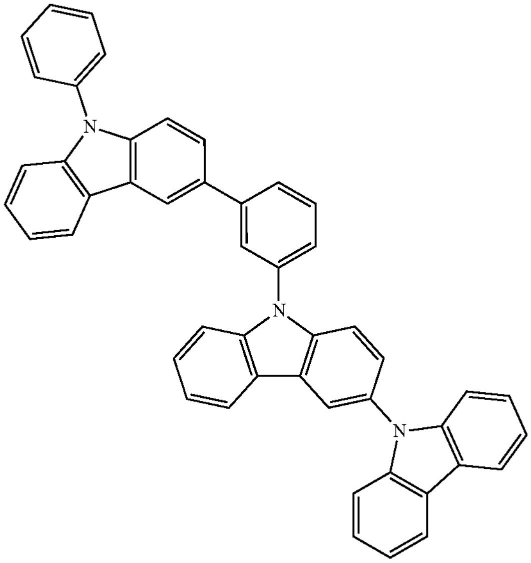
B-14
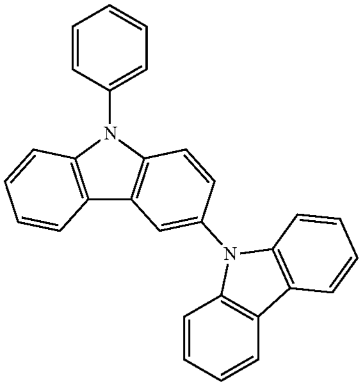
B-15
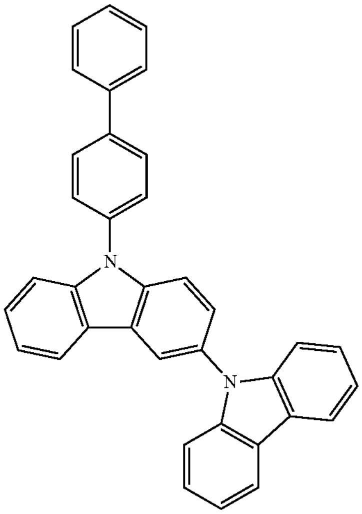
-continued
B-16
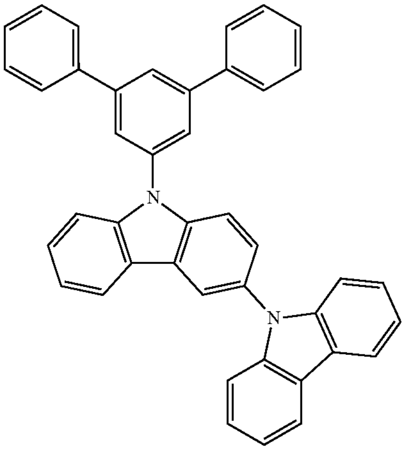
B-17
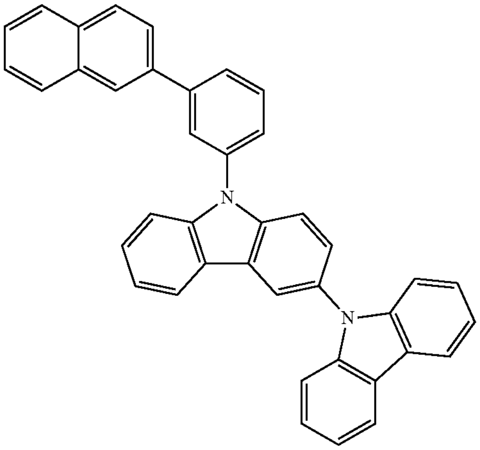
B-18
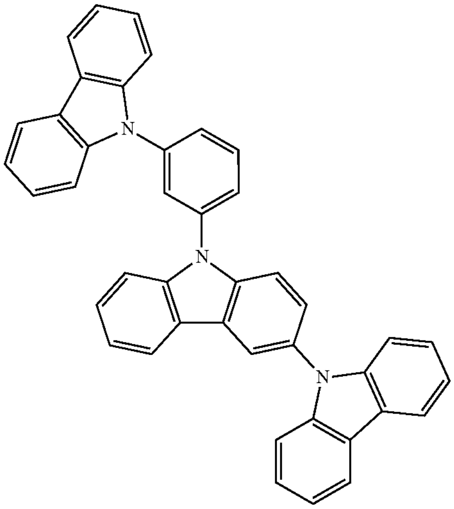

-continued
B-19
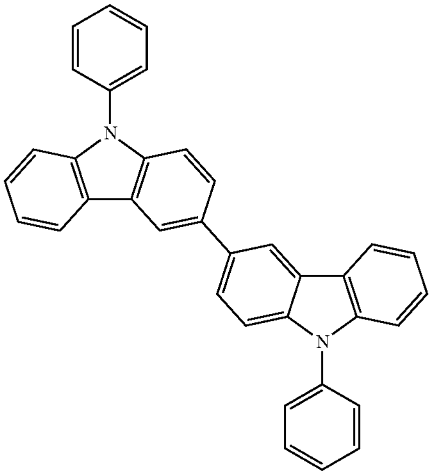
B-20
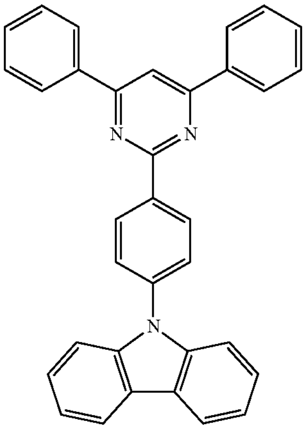
B-21
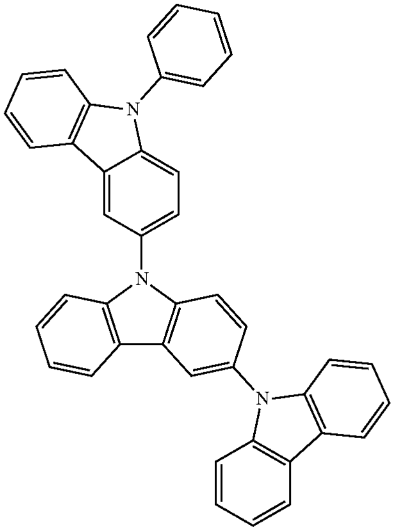
-continued
B-22
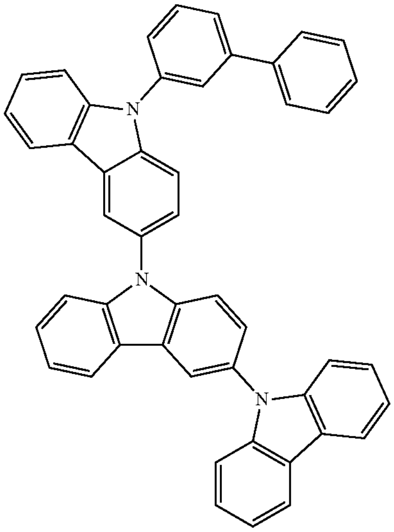
B-23
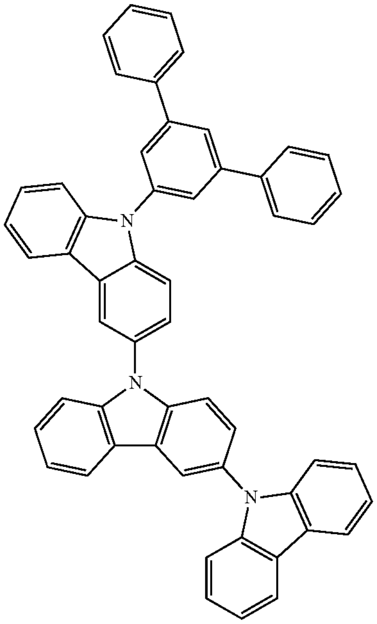

-continued
B-24
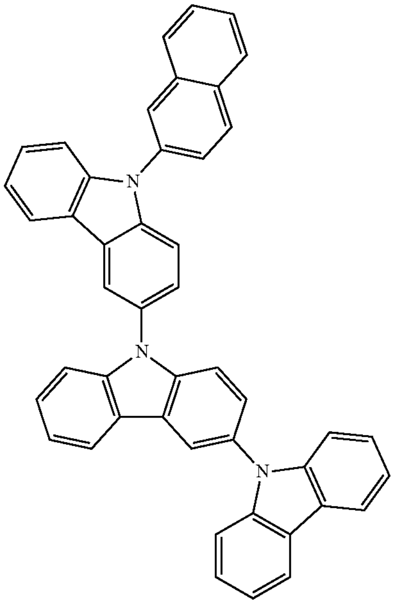
B-25
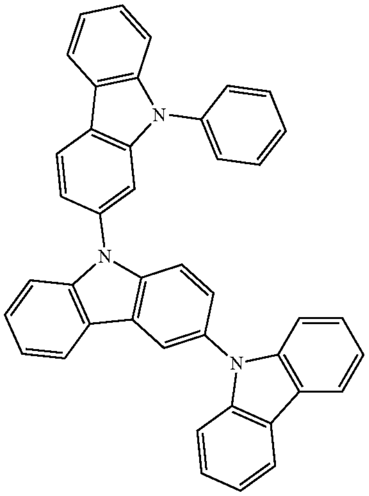
B-26
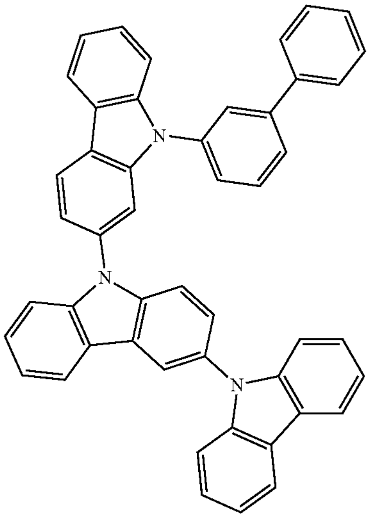
-continued
B-27
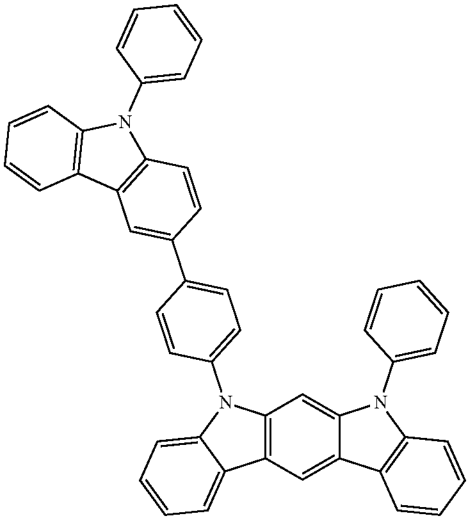
B-28
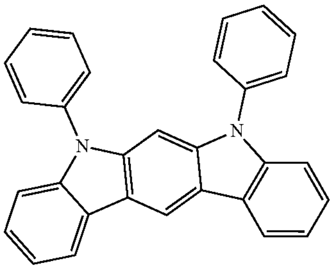
B-29
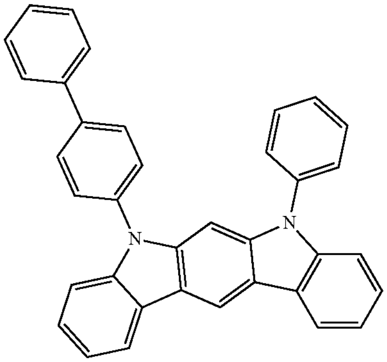
B-30
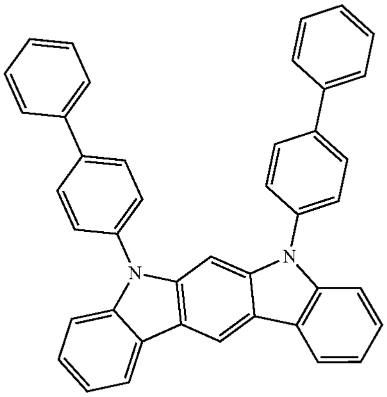

-continued
B-31
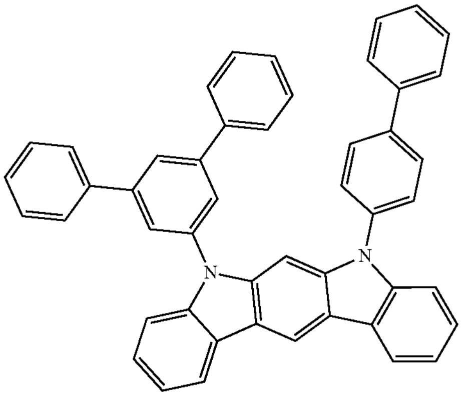
B-32
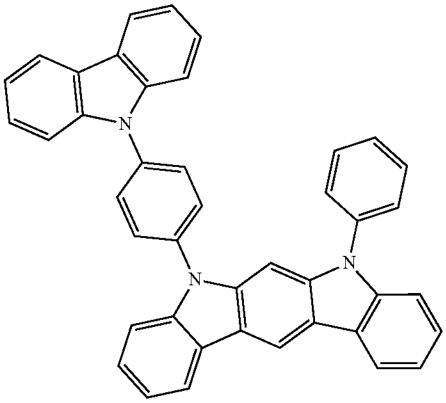
B-33
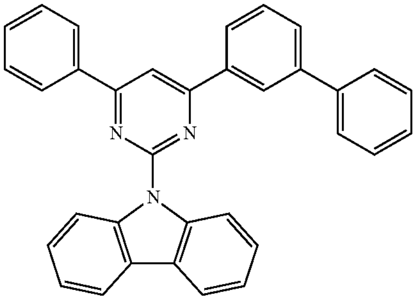
B-34
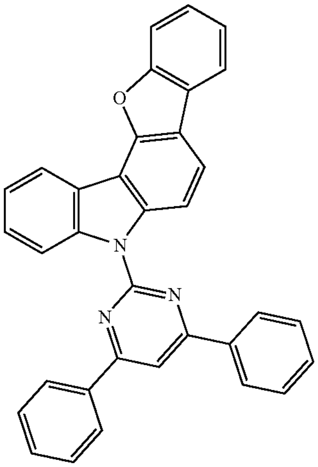
-continued
B-35
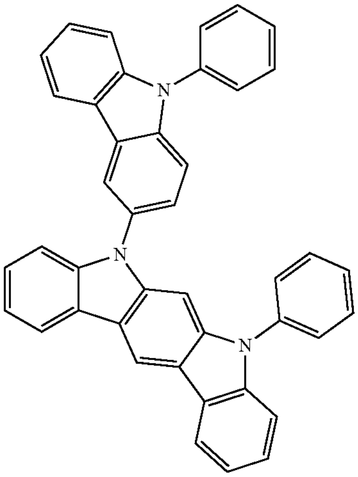
B-36
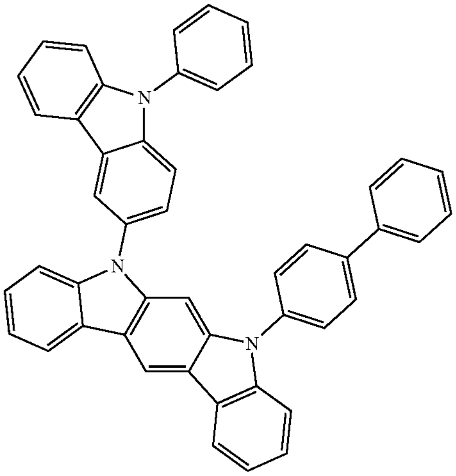
B-37
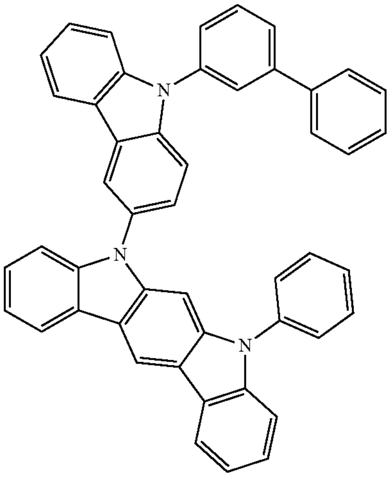

-continued
B-38
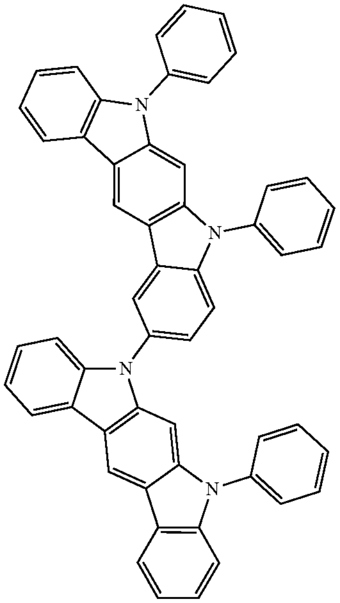
B-39
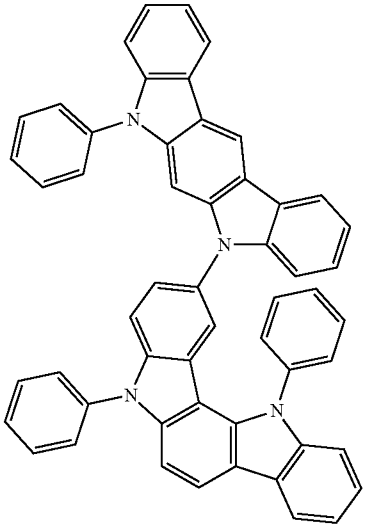
B-40
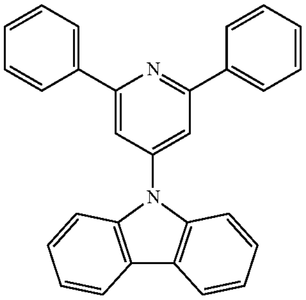
-continued
B-41
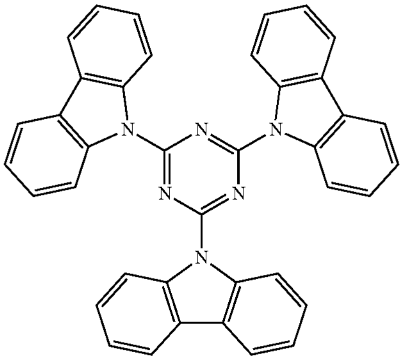
B-42
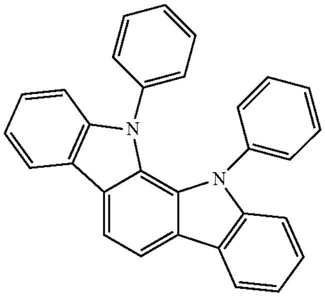
B-43
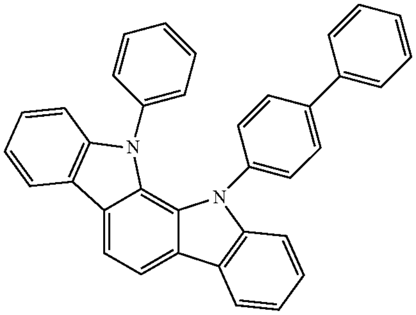
B-44
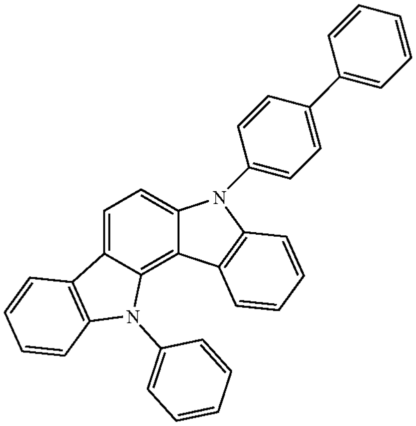

-continued
B-45
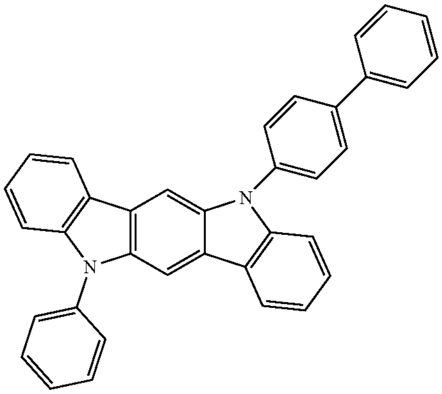
B-46
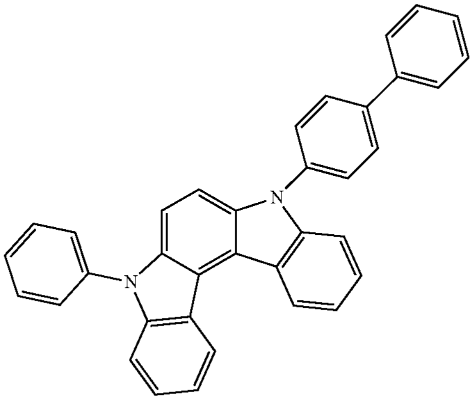
B-47
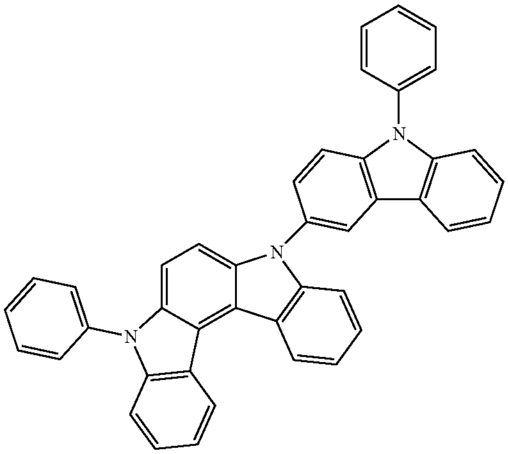
-continued
B-48
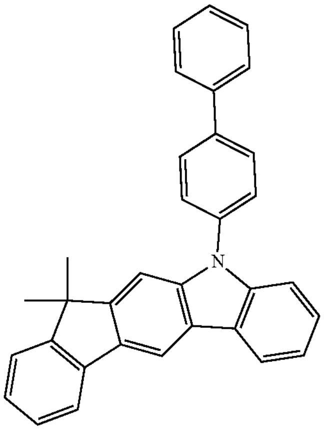
B-49
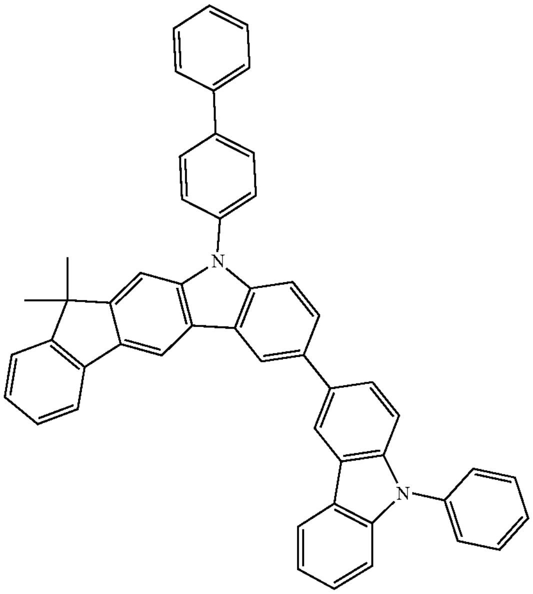
B-50
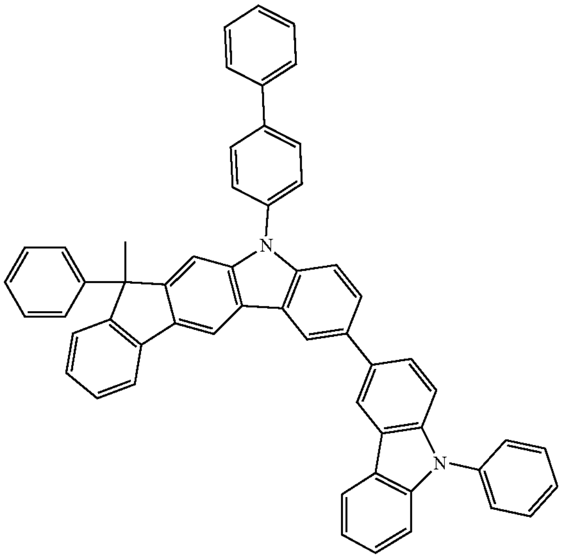

-continued
B-51
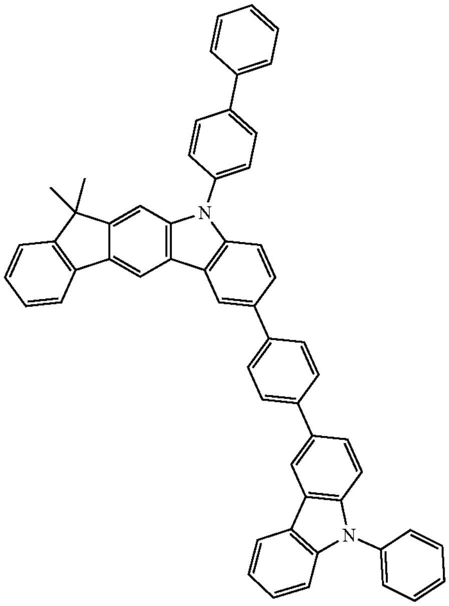
B-52
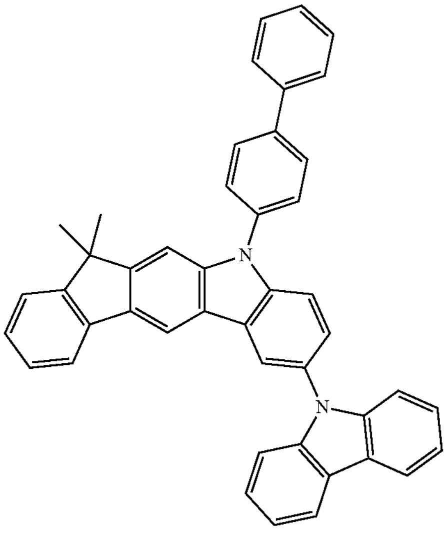
-continued
B-53
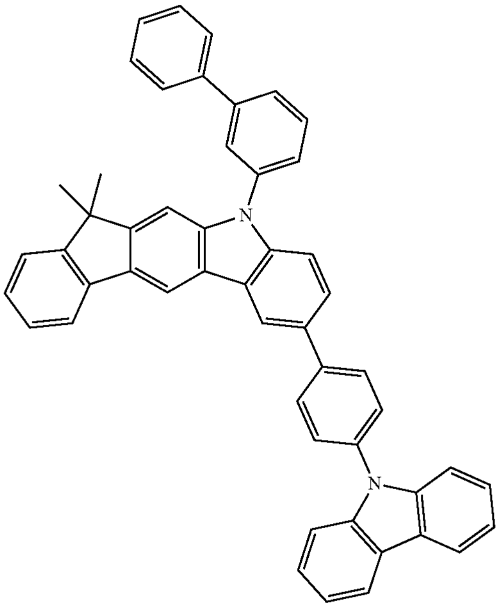
B-54
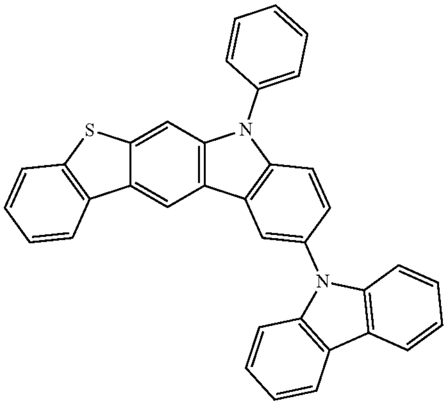
B-55
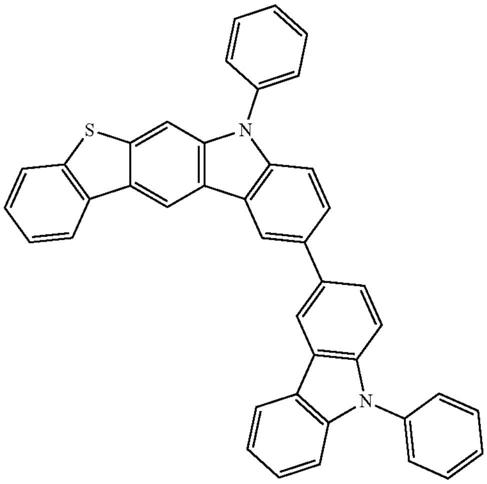

B-56
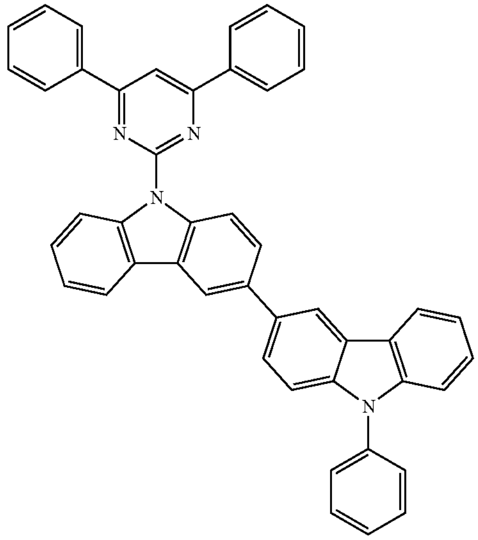
B-57
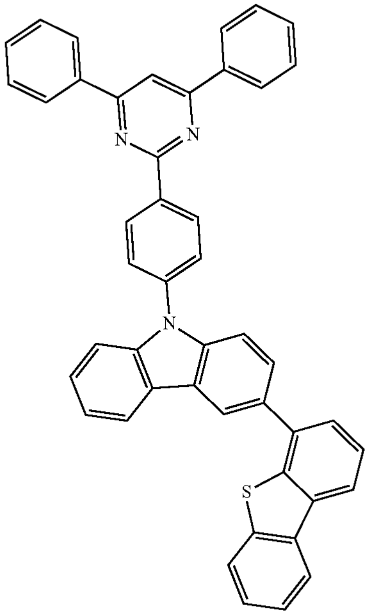
B-58
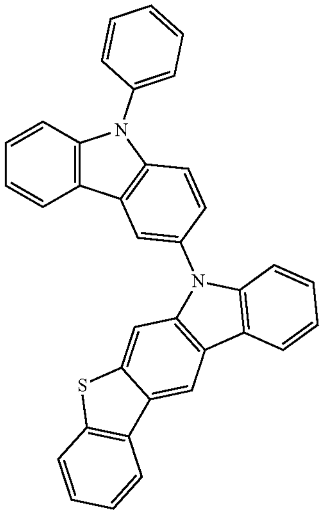
B-59
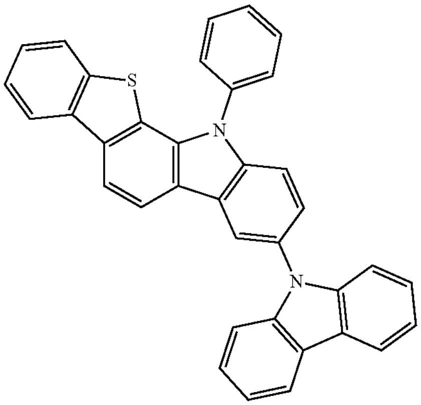
B-60
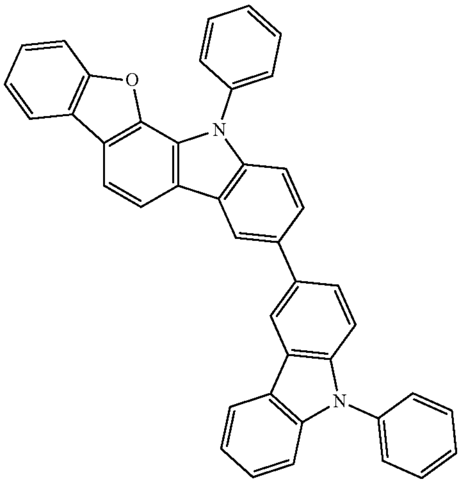
B-61
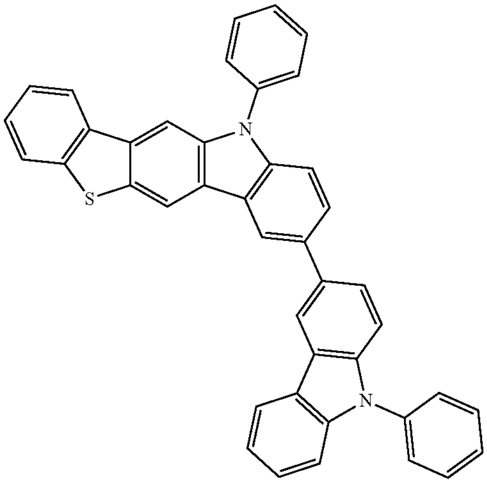

-continued
B-62
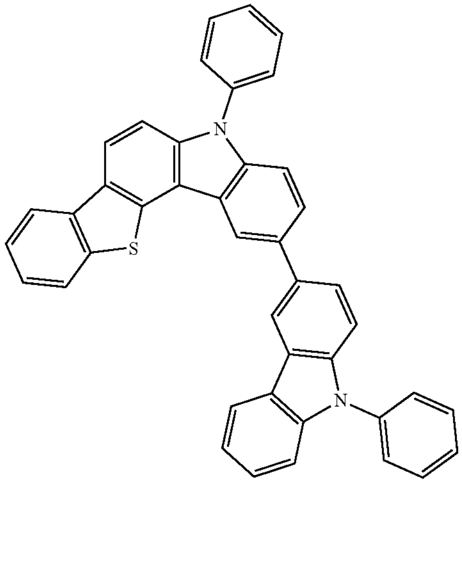
B-63
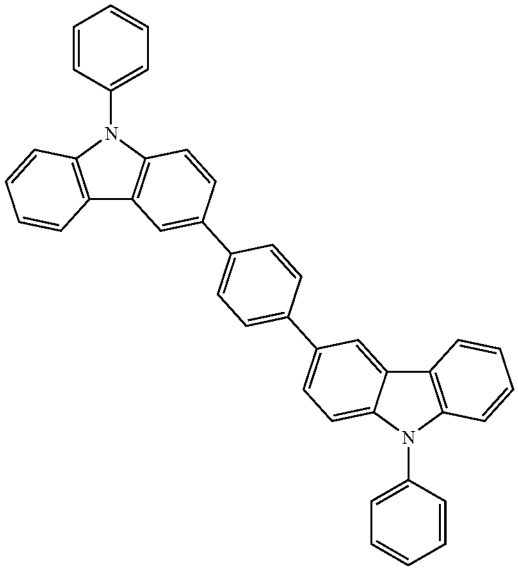
-continued
B-64
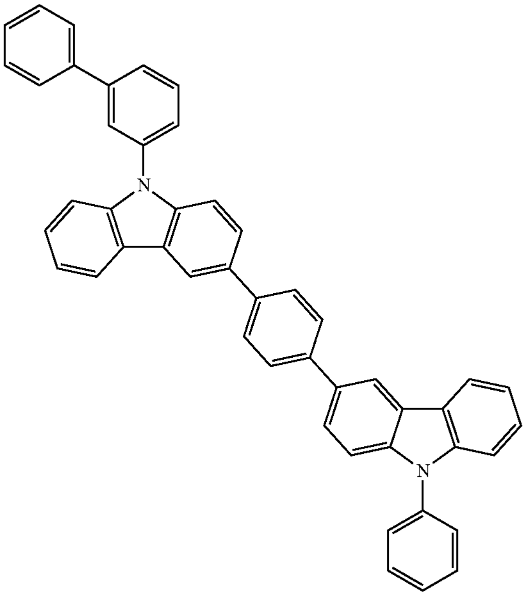
B-65
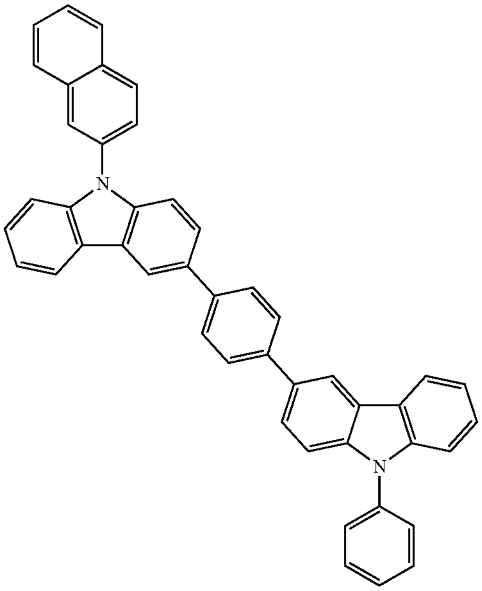

-continued
B-66
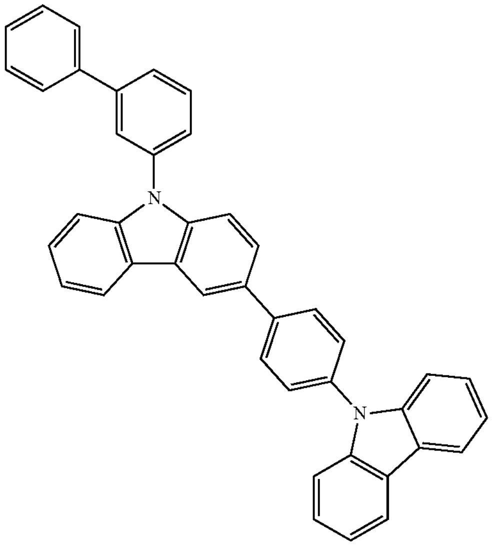
B-67
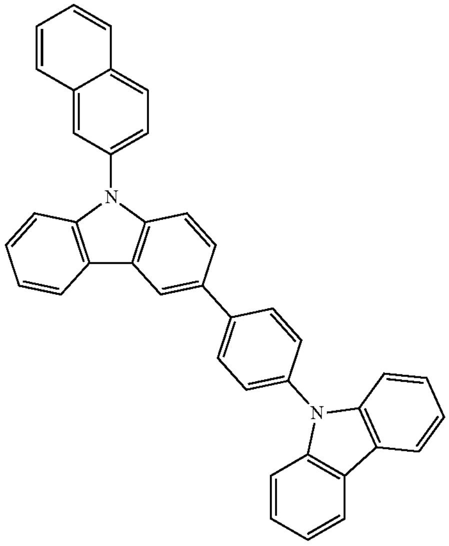
-continued
B-68
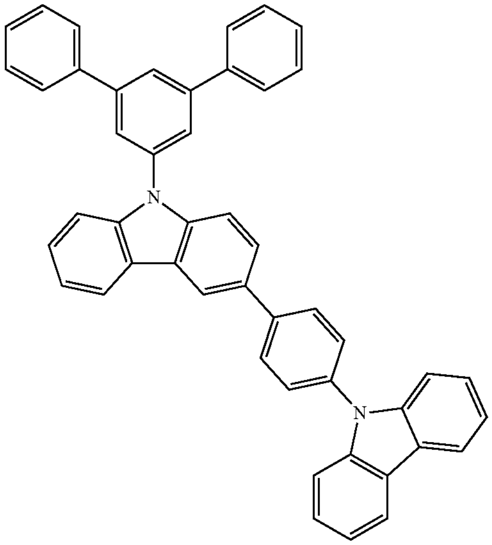
B-69
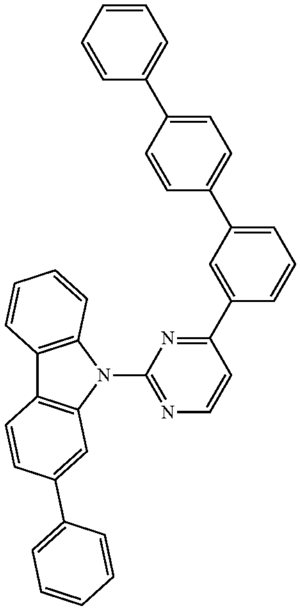

-continued
B-70
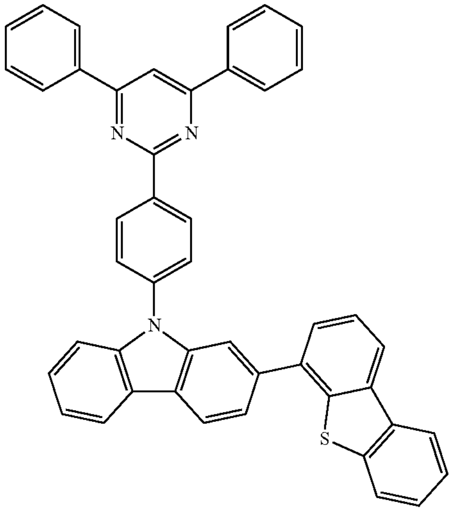
B-71
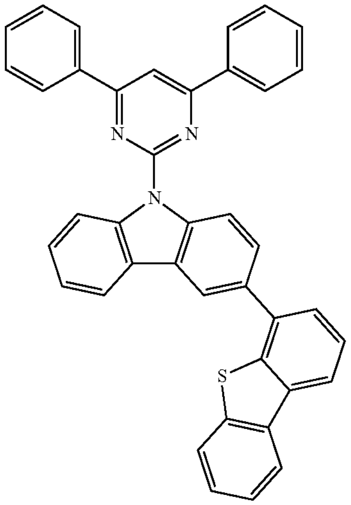
B-72
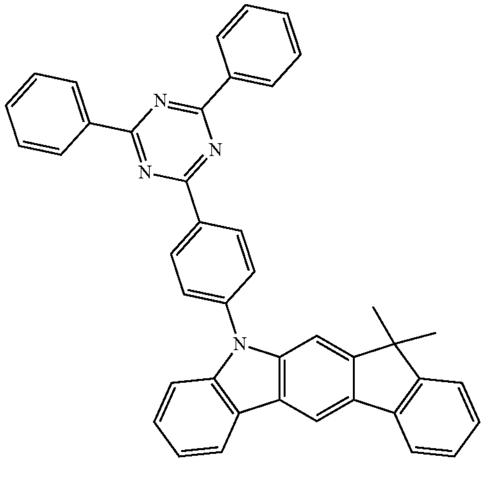
-continued
B-73
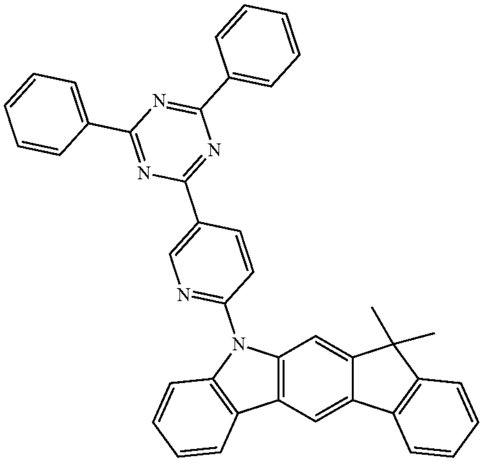
B-74
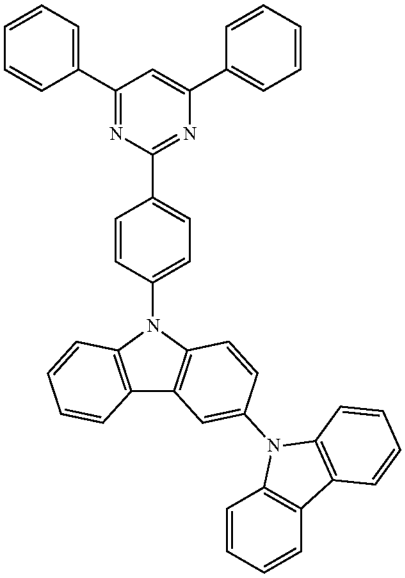
B-75
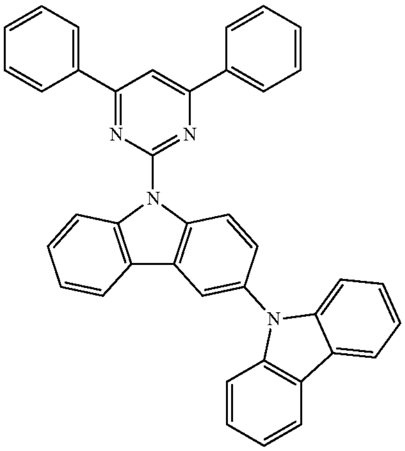

-continued
B-76
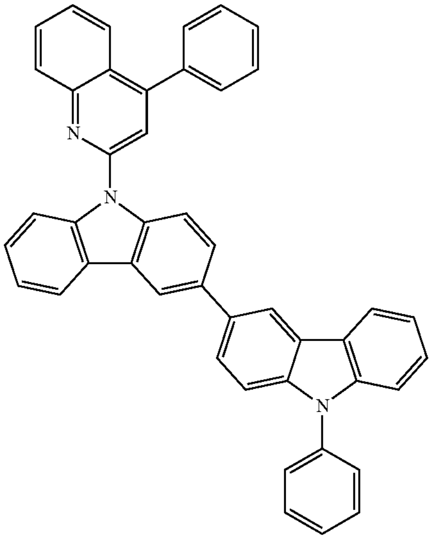
B-77
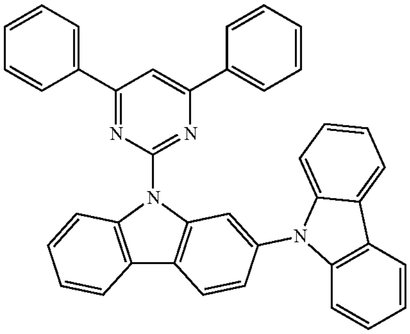
B-78
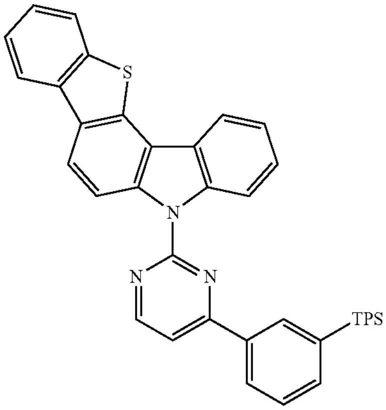
-continued
B-79
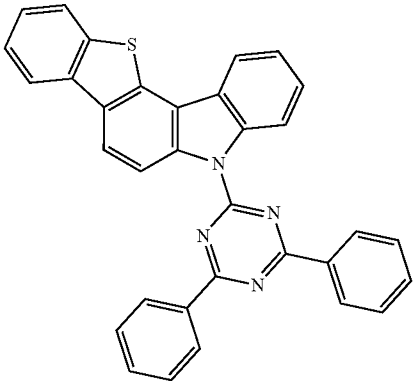
B-80
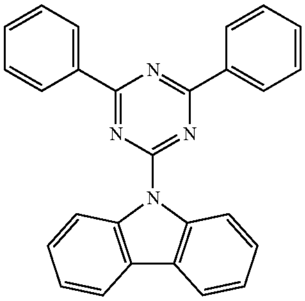
B-81
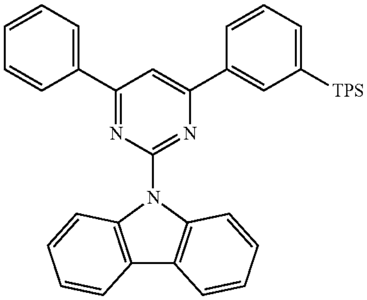
B-82
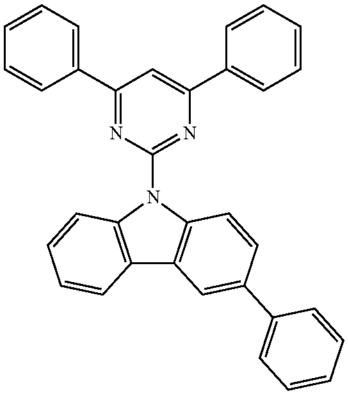

-continued
B-83
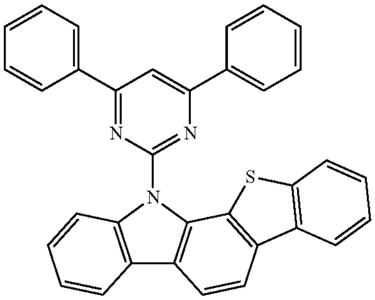
B-84
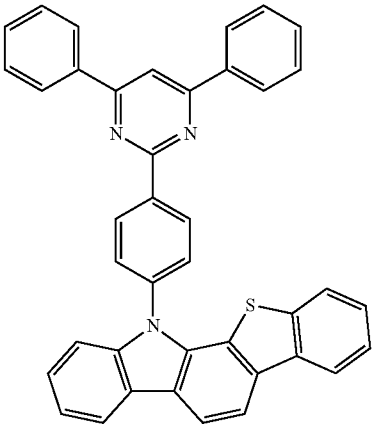
B-85
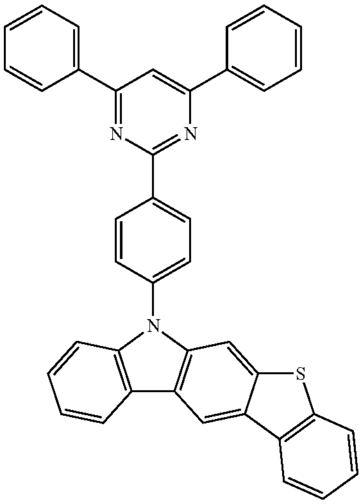
-continued
B-86
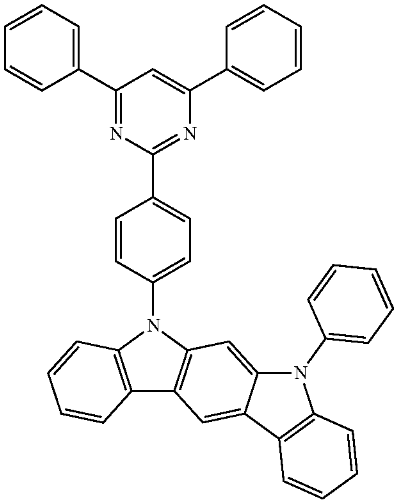
B-87
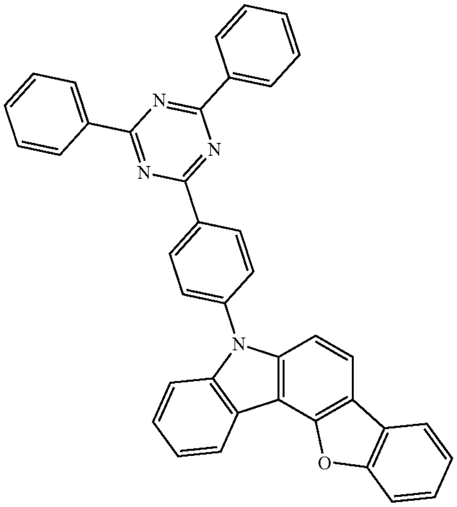
B-88
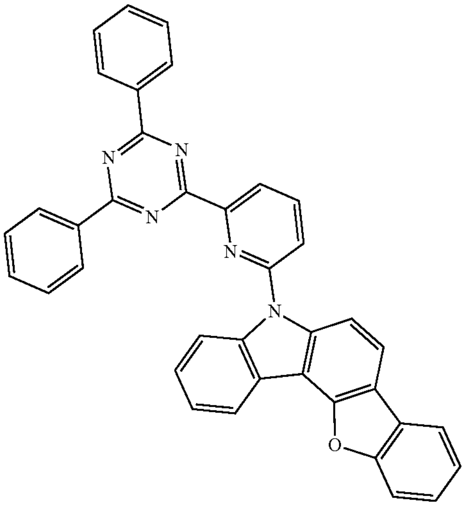

-continued
B-89
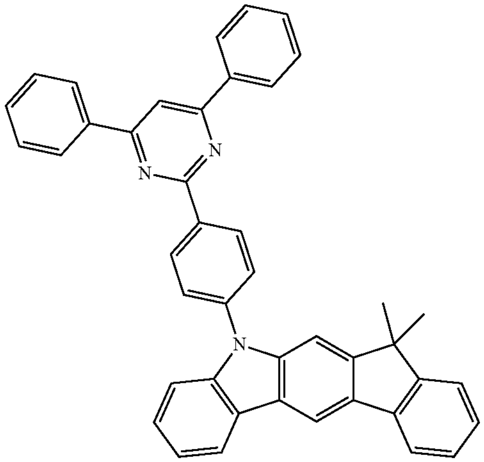
B-90
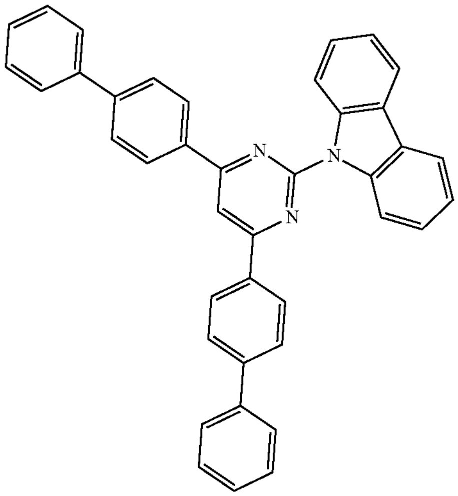
B-91
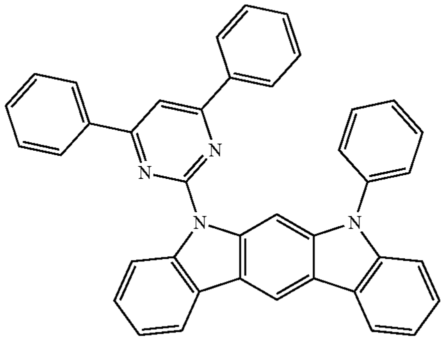
-continued
B-92
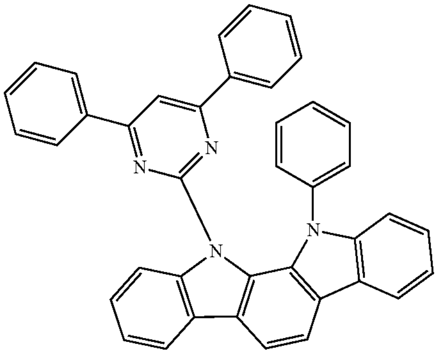
B-93
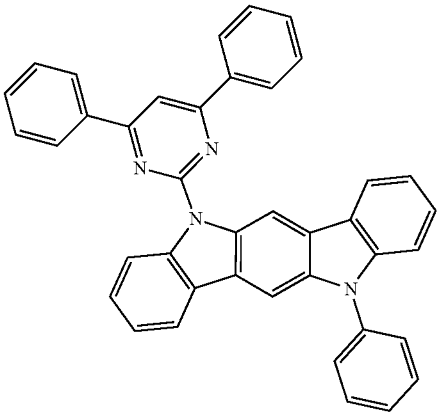
B-94
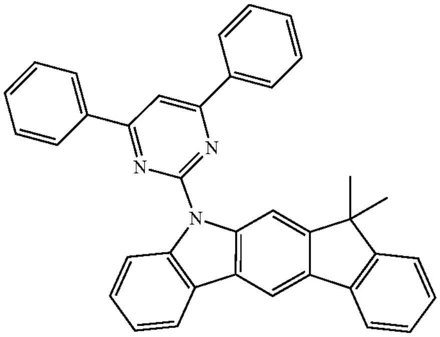
B-95
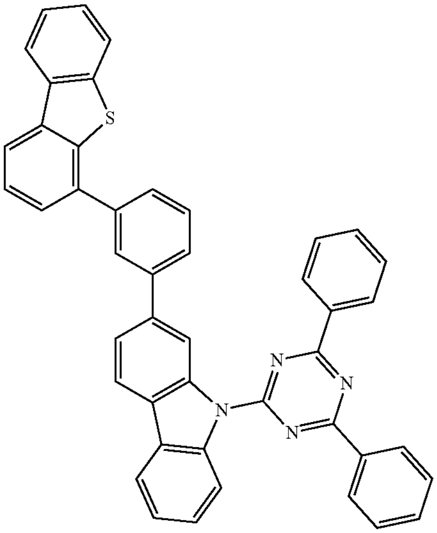

-continued
B-96
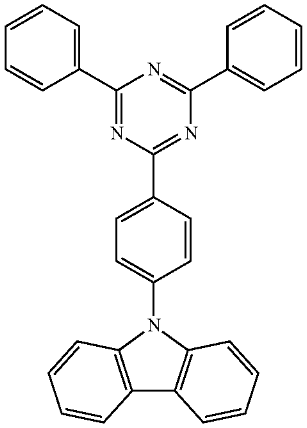
B-97
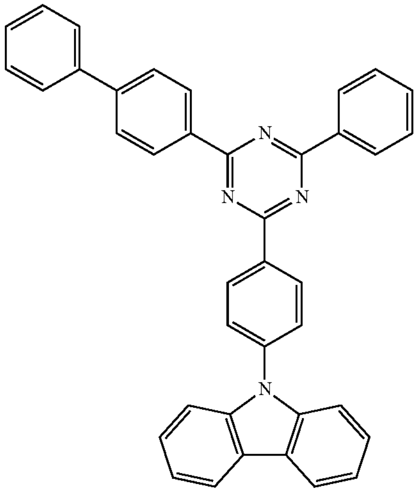
B-98
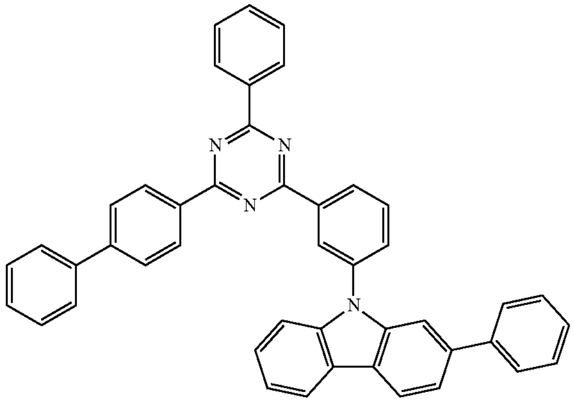
-continued
B-99
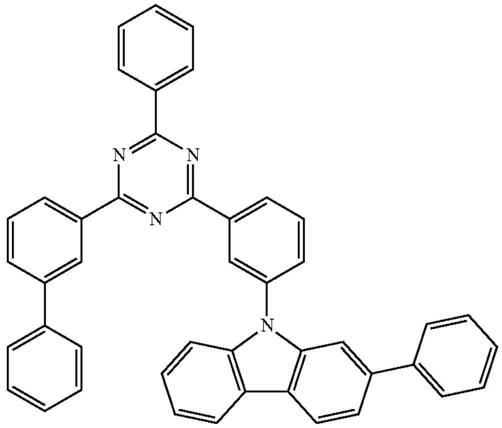
B-100
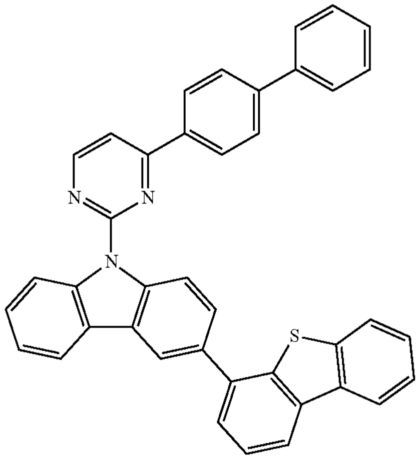
B-101
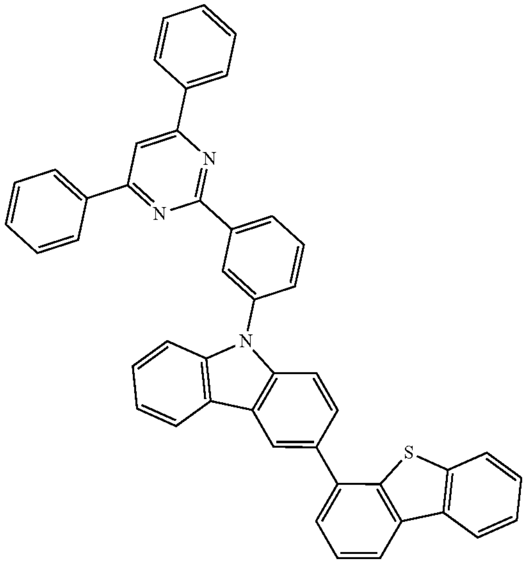

-continued
B-102
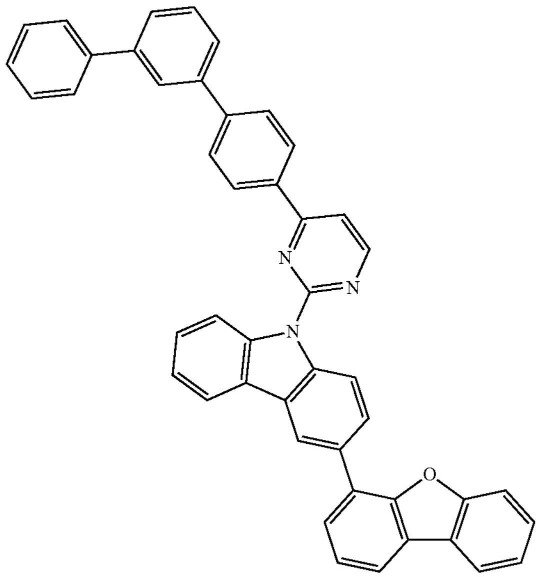
B-103
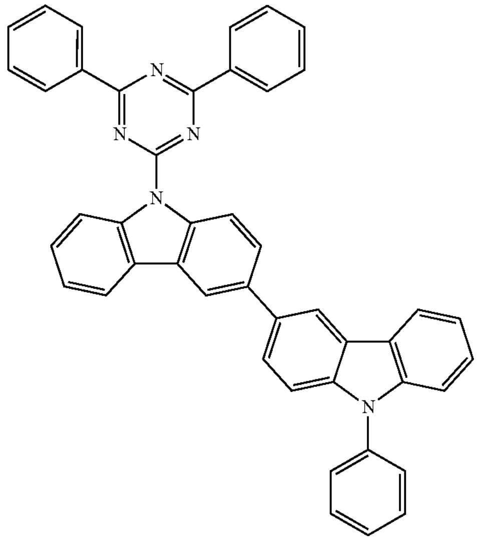
-continued
B-104
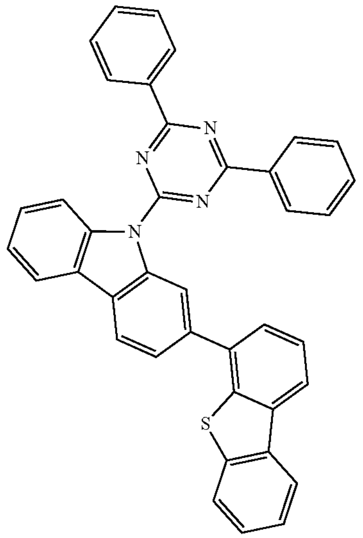
B-105
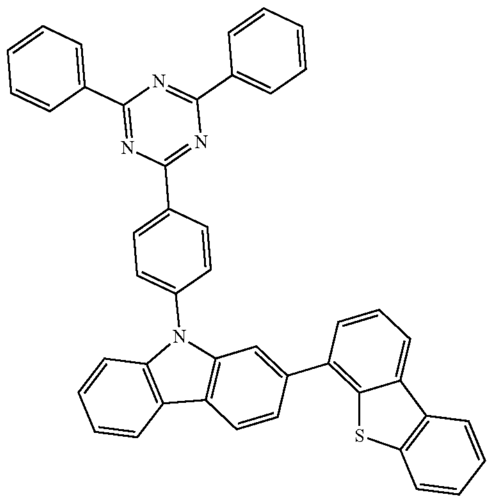
B-106
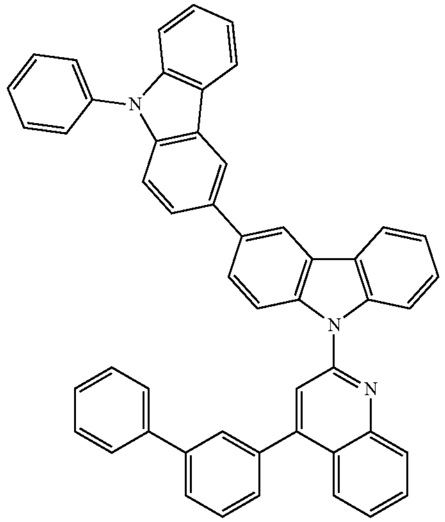

-continued
B-107
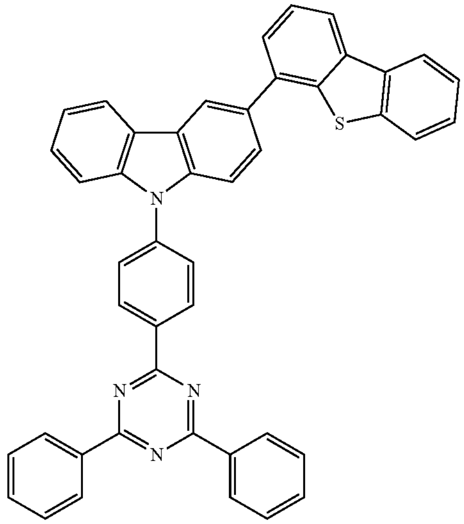
B-108
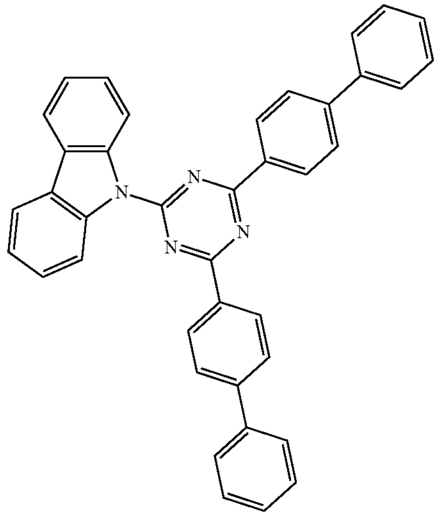
B-109
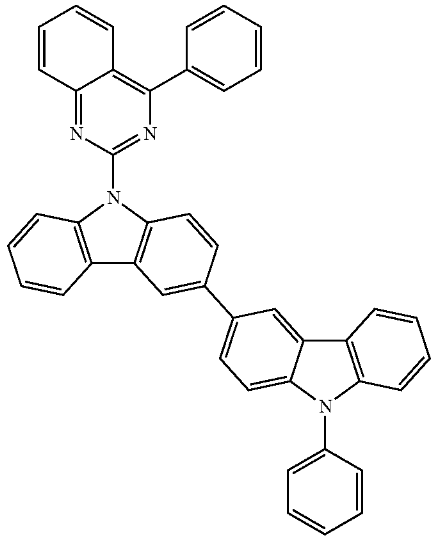
-continued
B-110
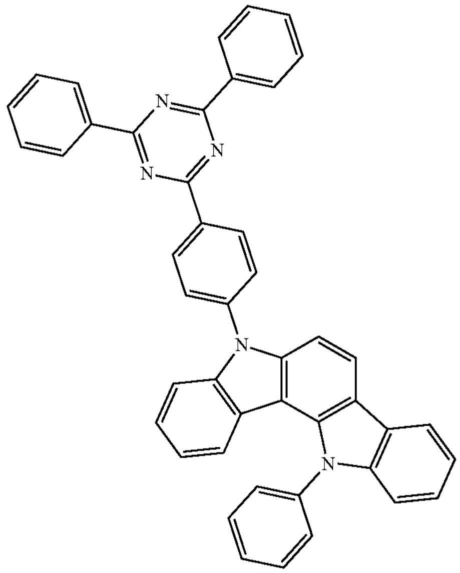
B-111
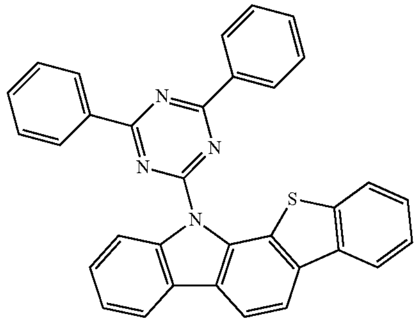
B-112
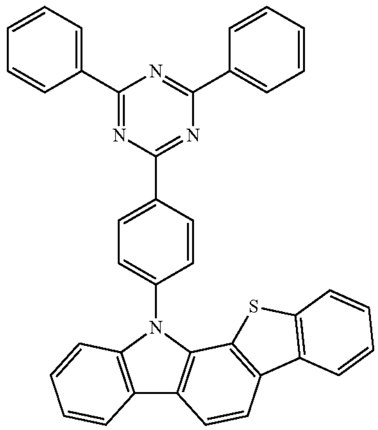

-continued
B-113
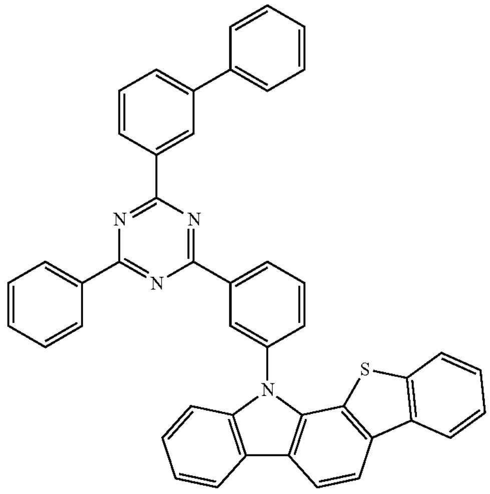
B-114
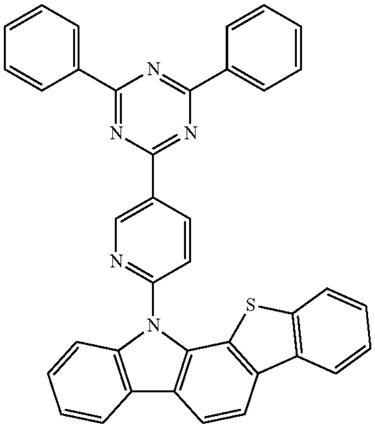
B-115
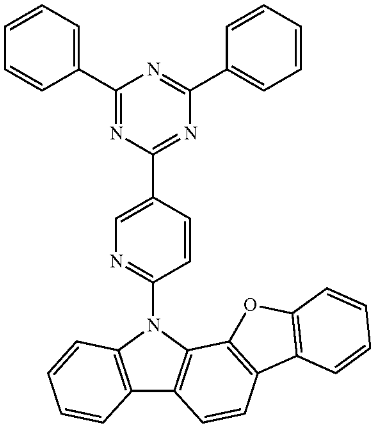
-continued
B-116
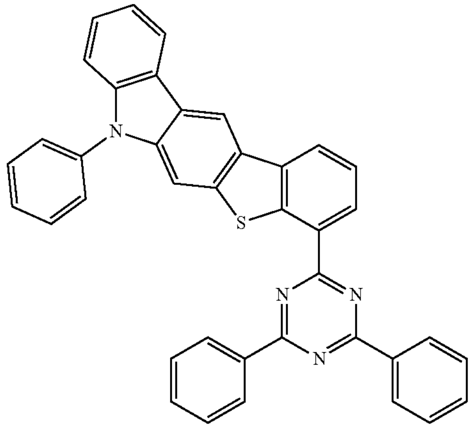
B-117
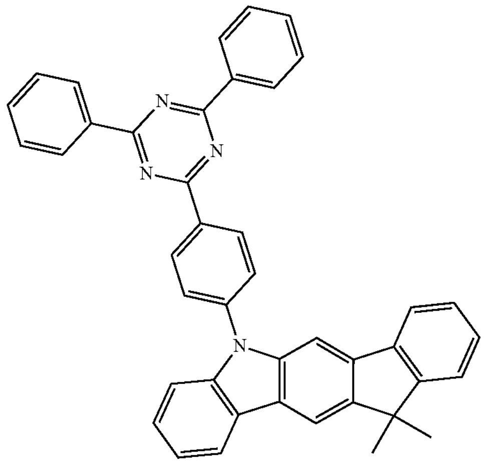
B-118
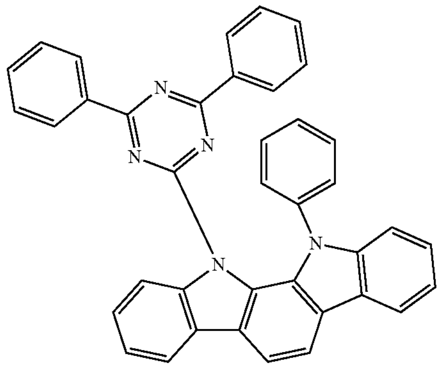

-continued
B-119
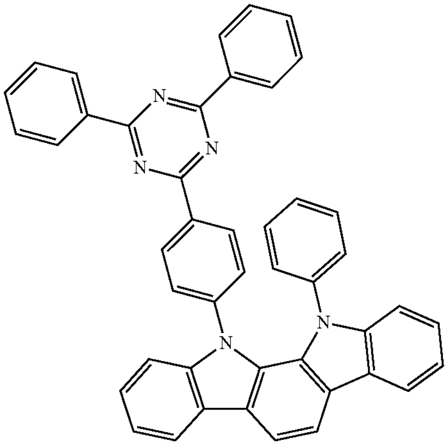
B-120
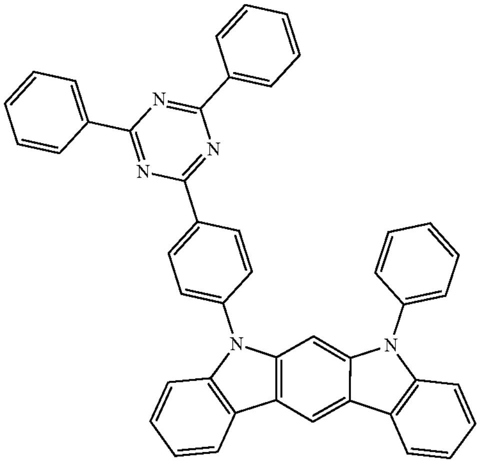
B-121
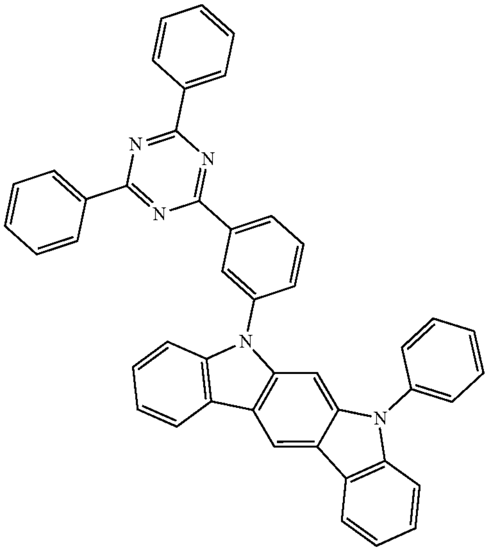
-continued
B-122
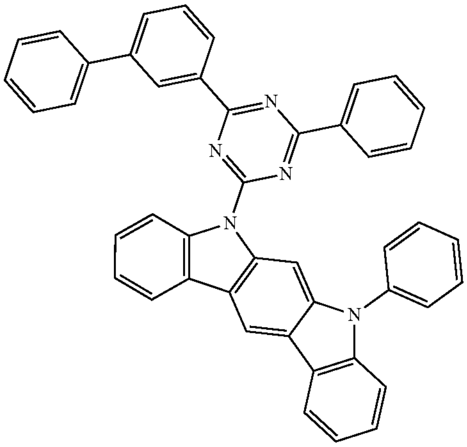
B-123
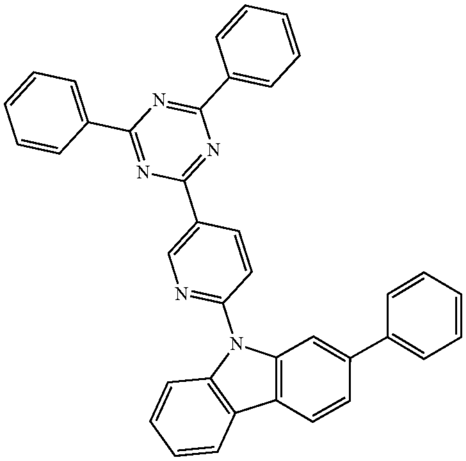
B-124
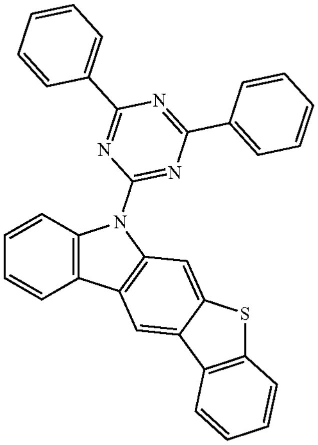

-continued
B-125
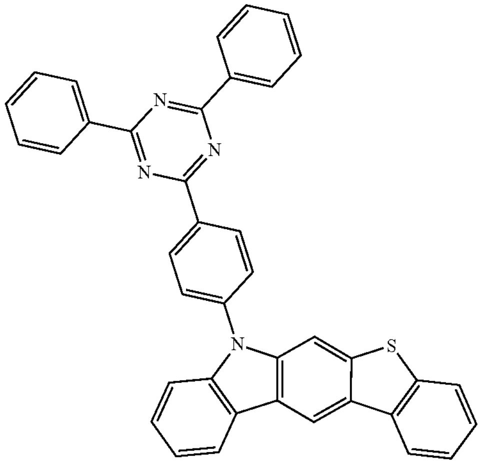
B-126
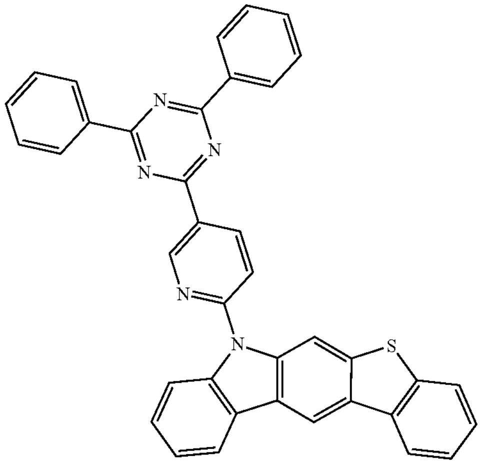
B-127
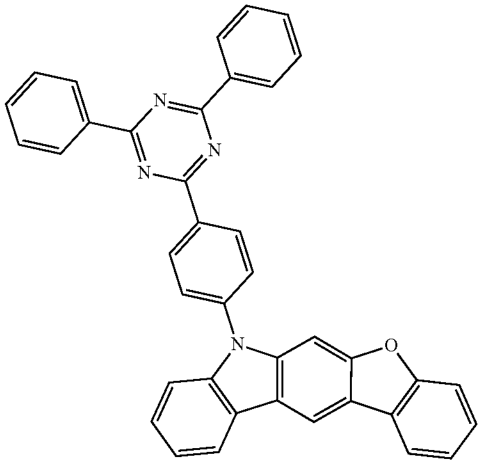
-continued
B-128
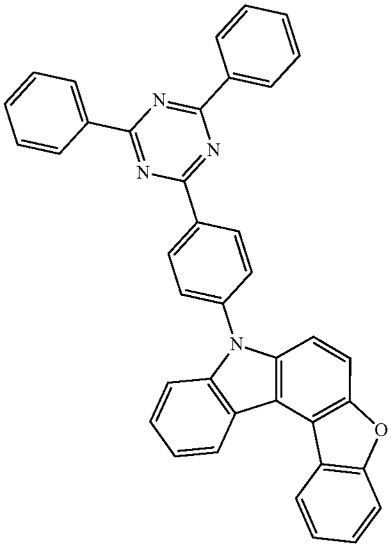
B-129
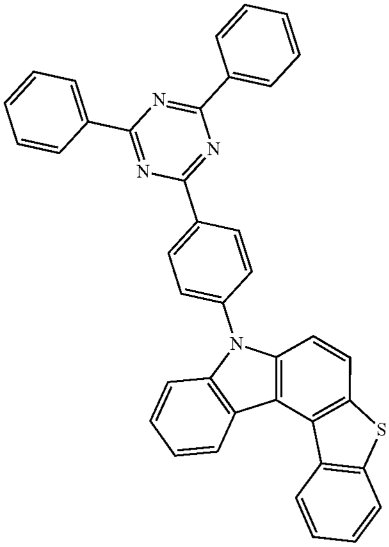
B-130
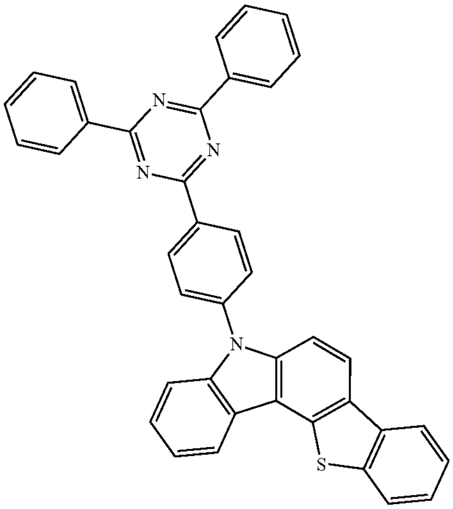

-continued
B-131
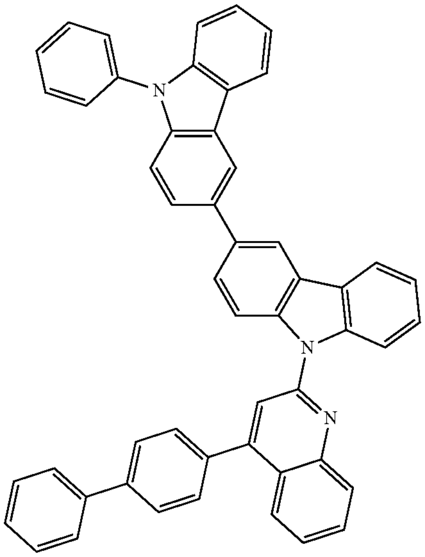
B-132
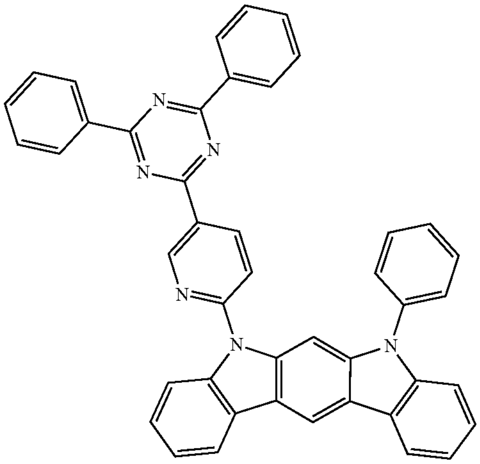
B-133
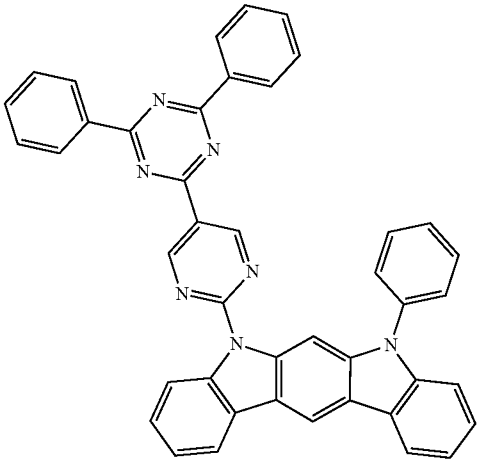
-continued
B-134
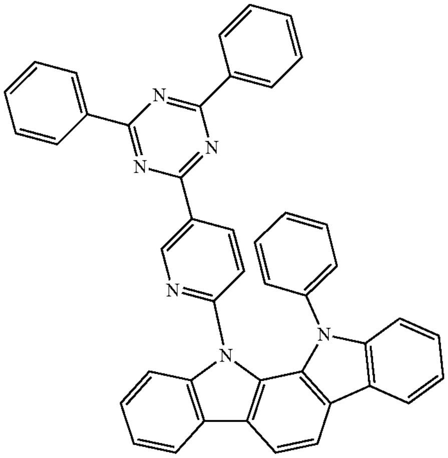
B-135
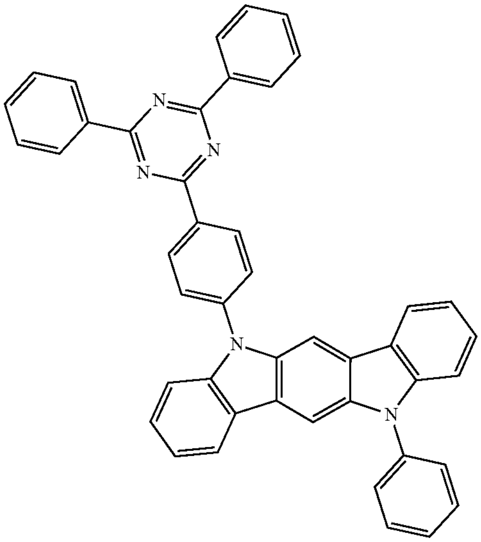
B-136
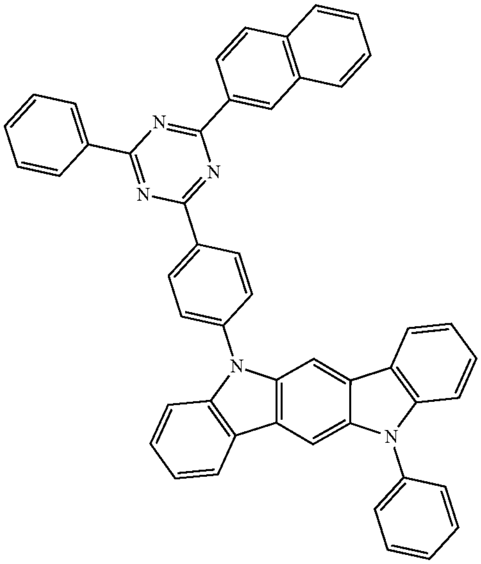

B-137
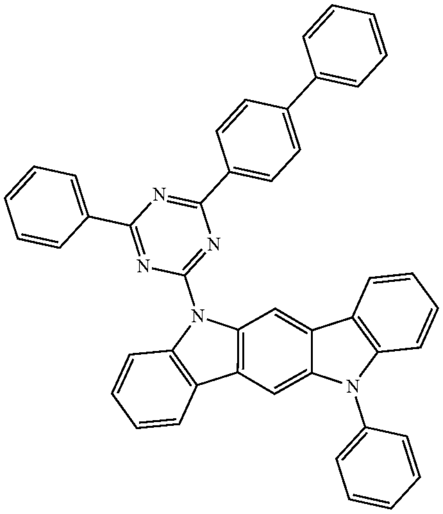
B-138
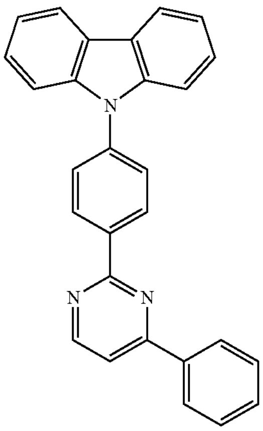
B-139
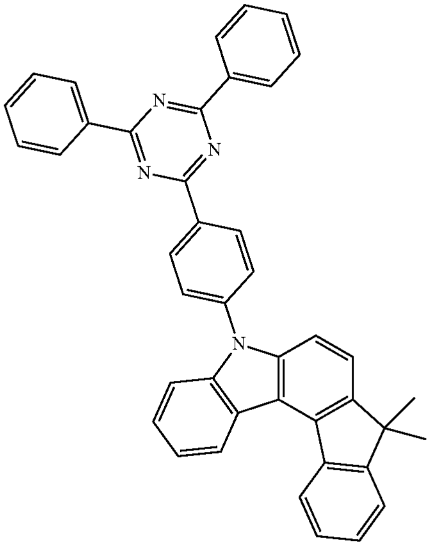
B-140
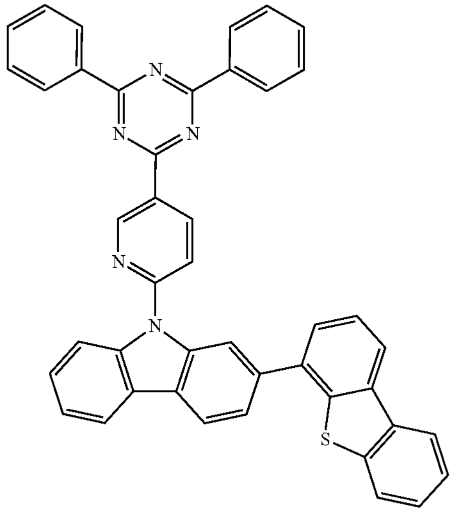
B-141
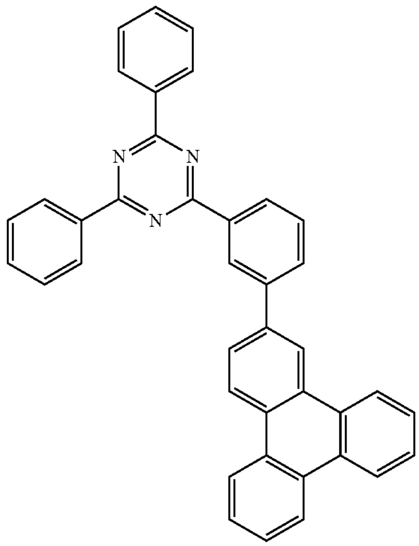
B-142
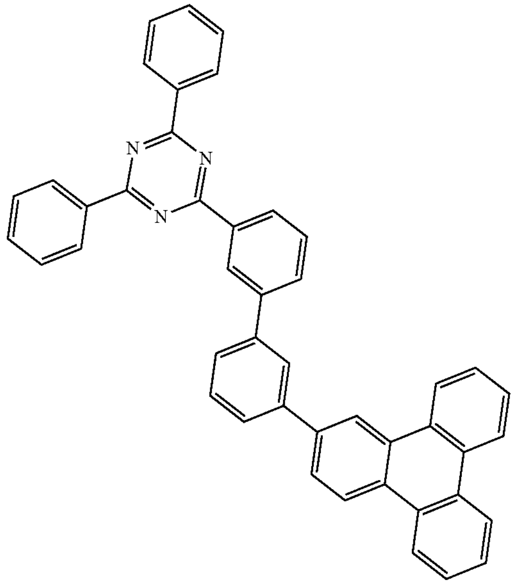

-continued
B-143
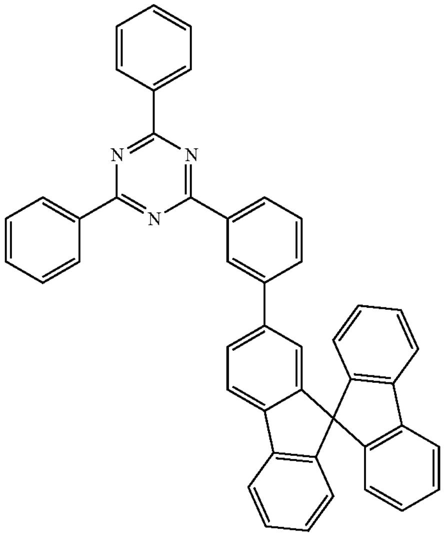
B-144
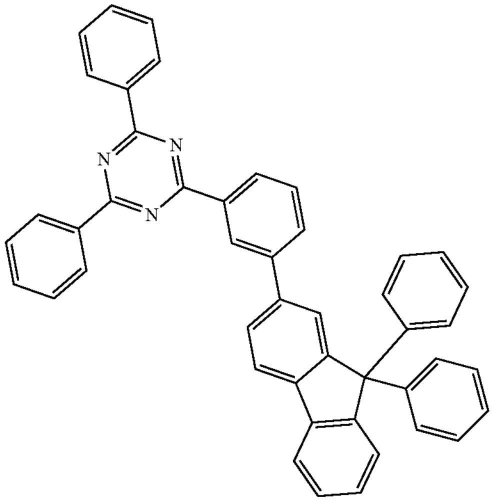
B-145
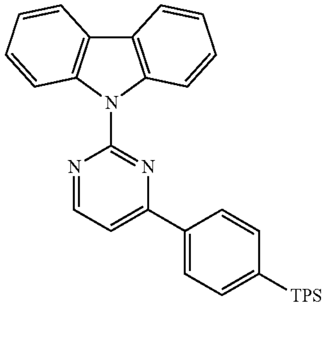
B-146
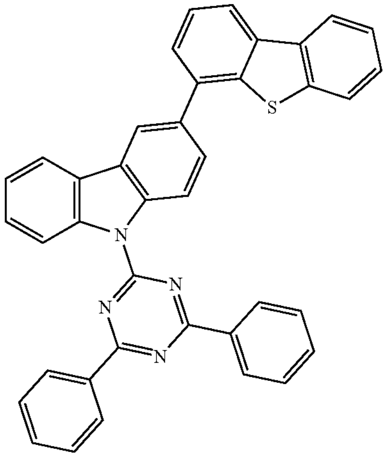
B-147
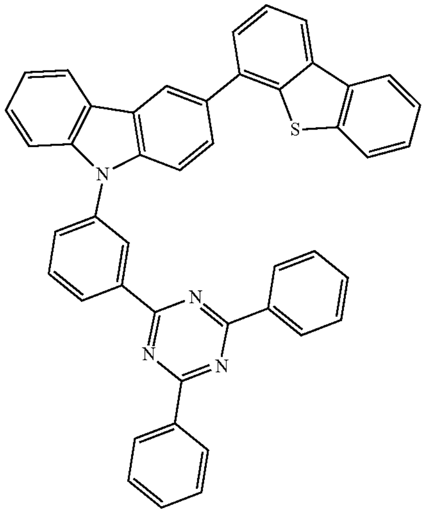
B-148
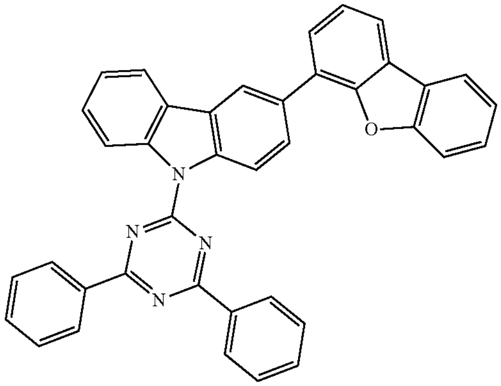

-continued
B-149
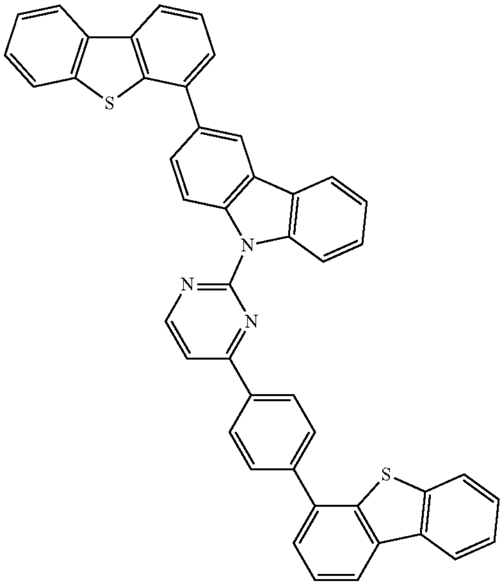
B-150
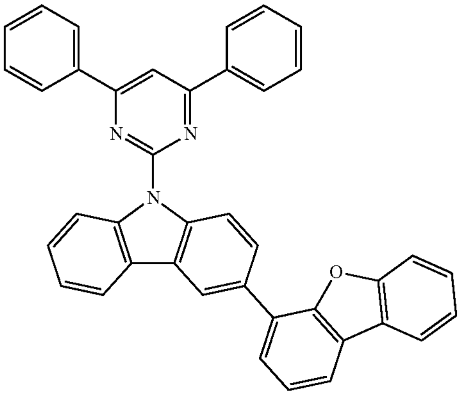
B-151
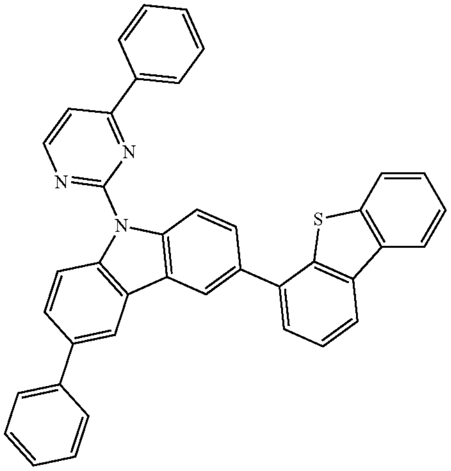
-continued
B-152
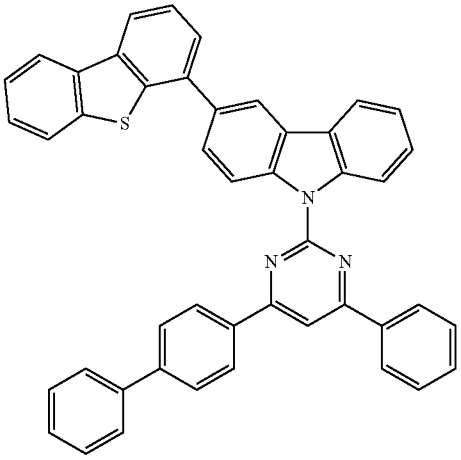
B-153
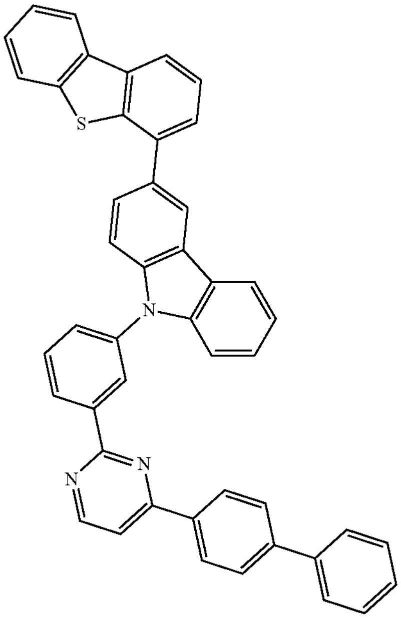

-continued
B-154
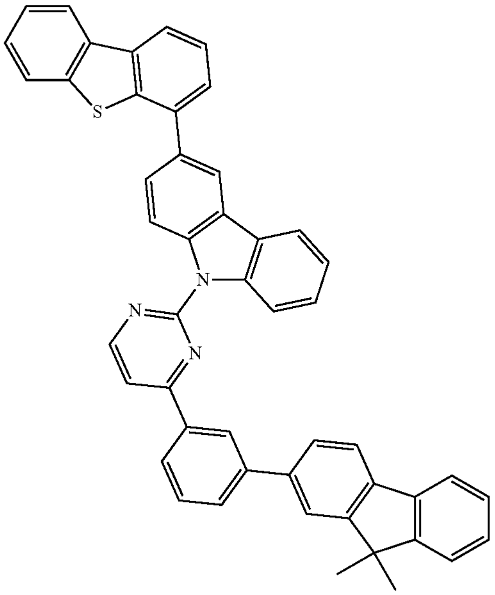
B-155
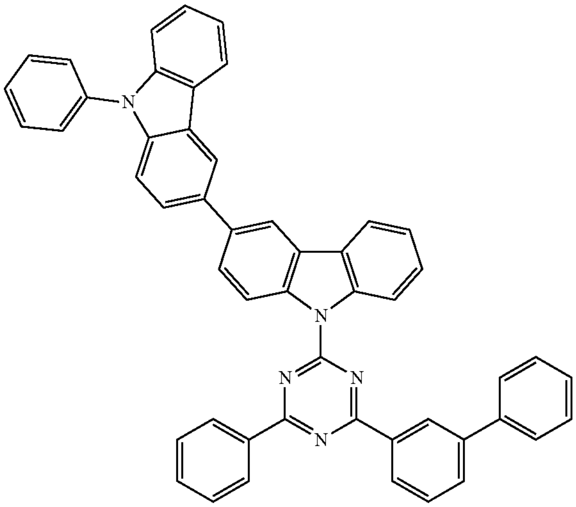
-continued
B-156
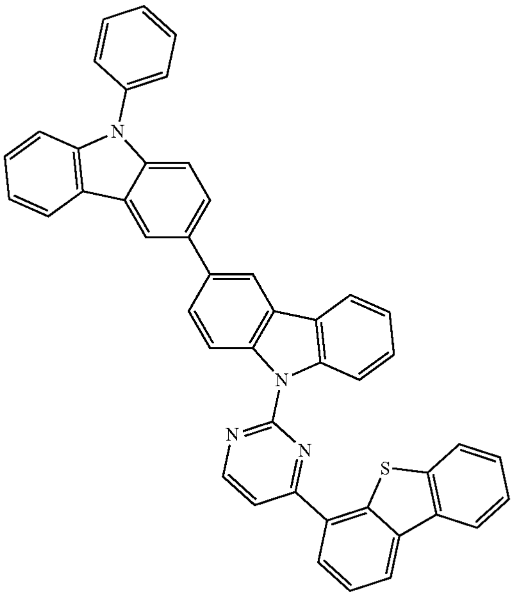
B-157
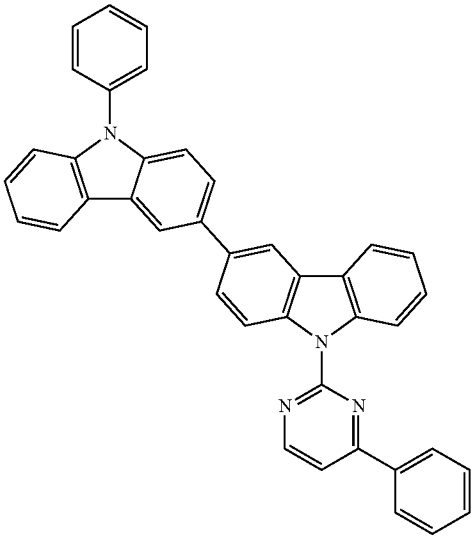

-continued
B-158
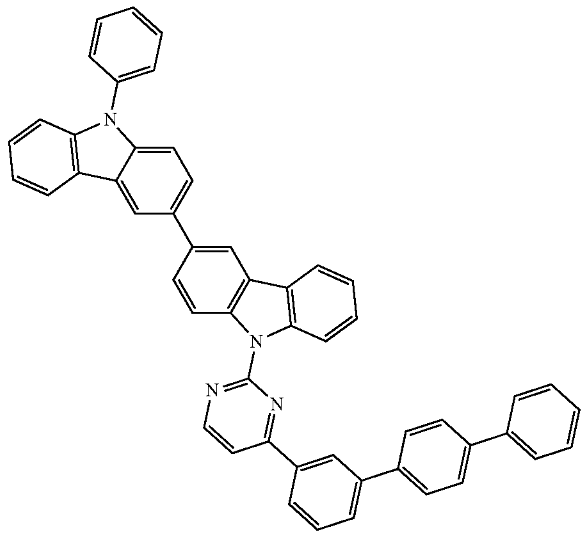
B-159
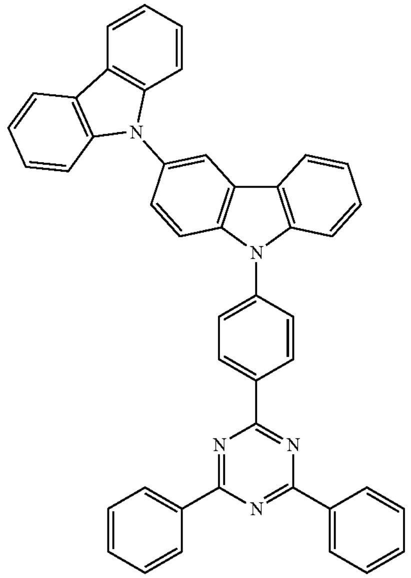
-continued
B-160
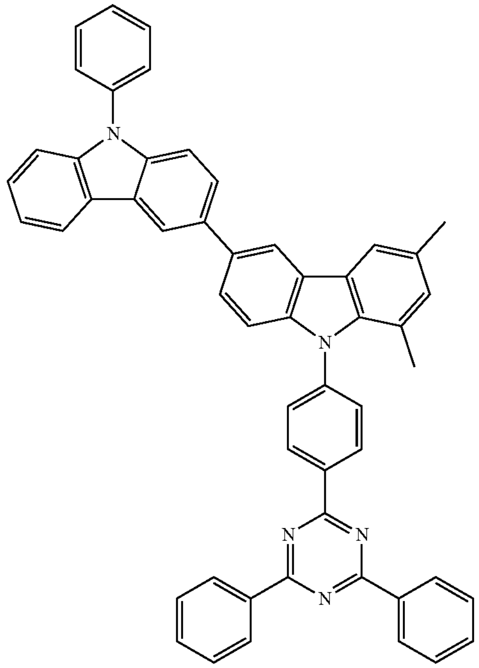
B-161
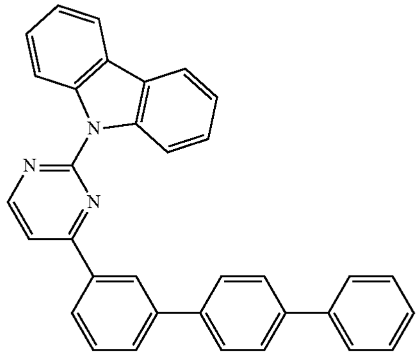
B-162
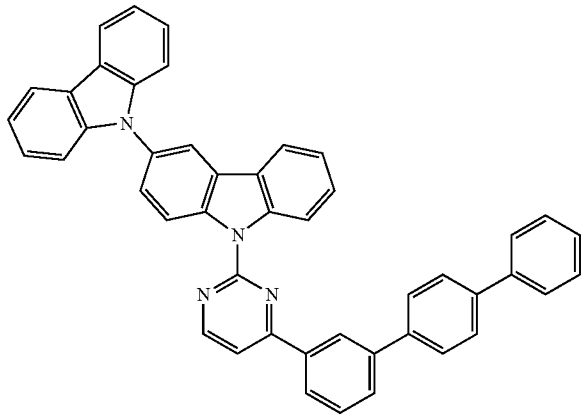

-continued
B-163
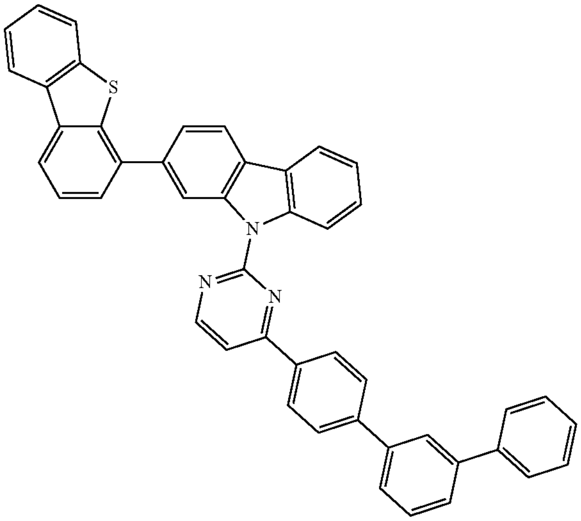
B-164
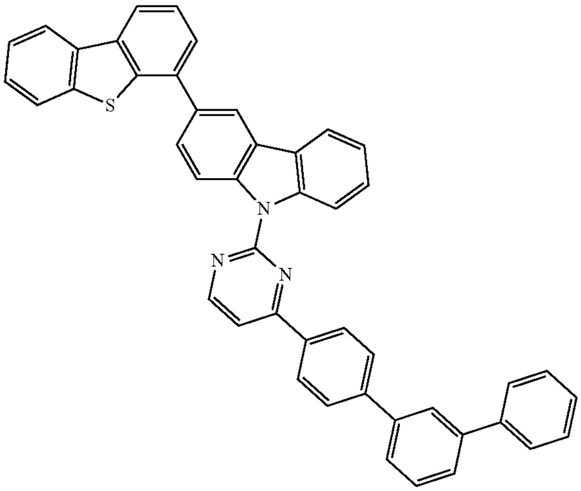
B-165
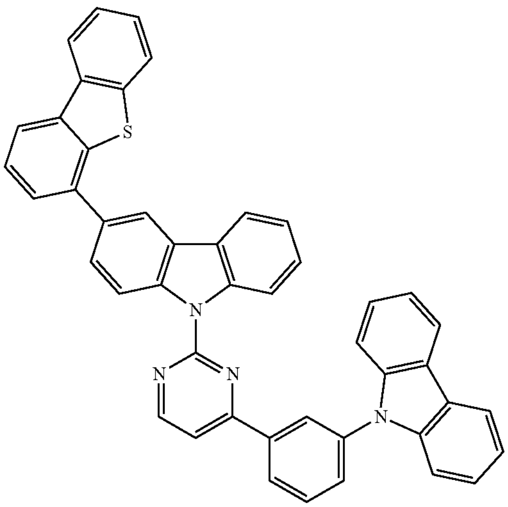
-continued
B-166
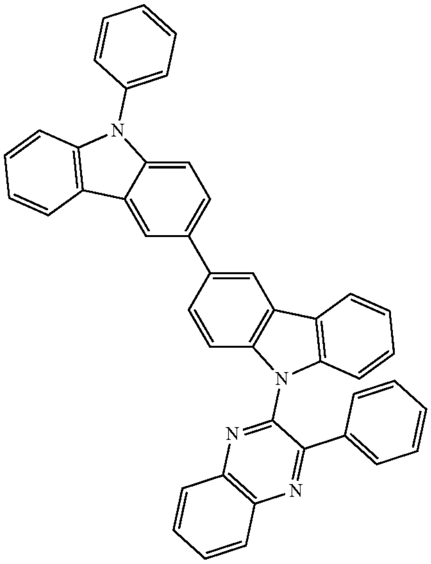
B-167
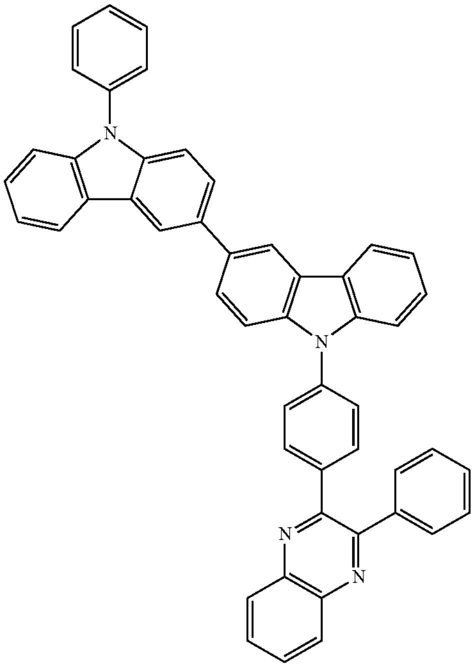

B-168
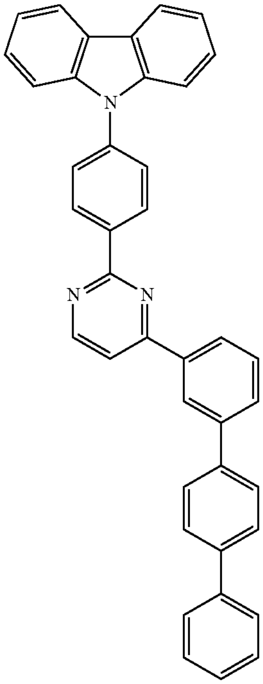
B-169
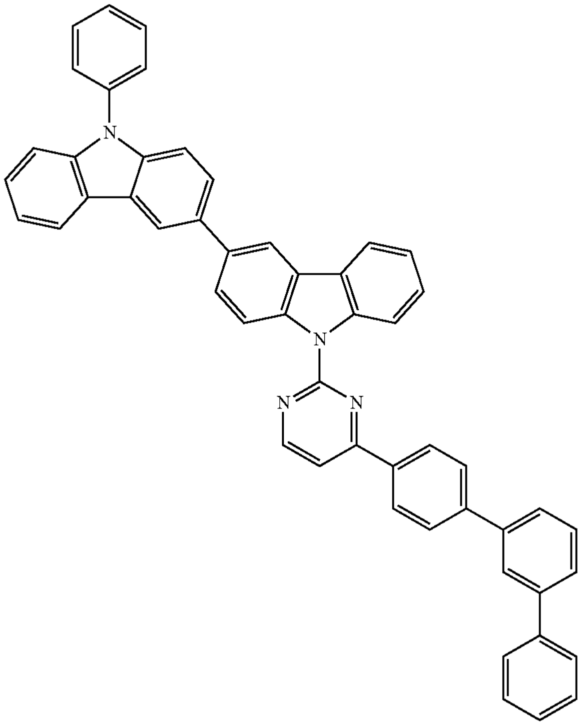
B-170
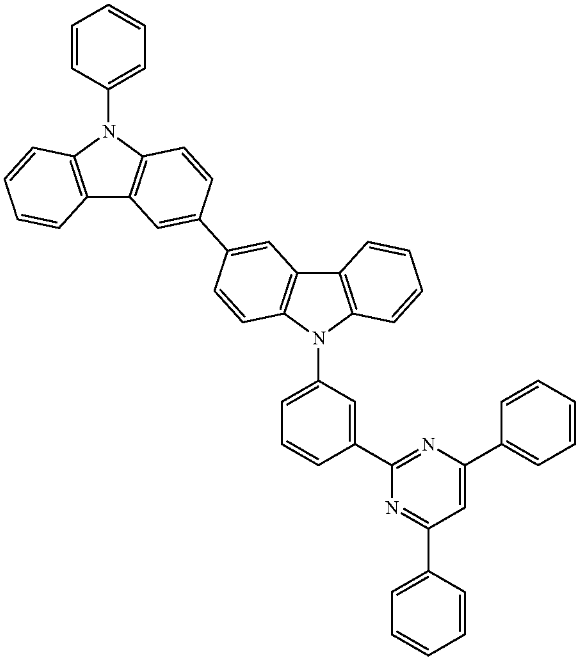
B-171
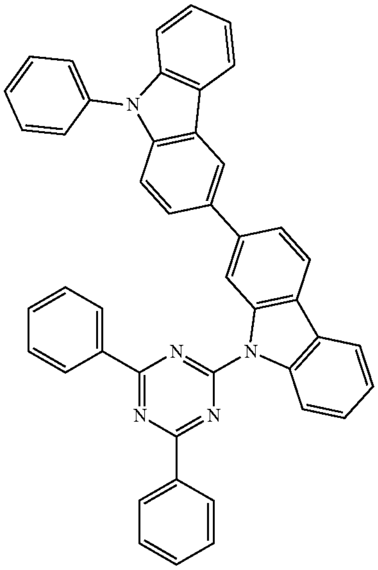

B-172
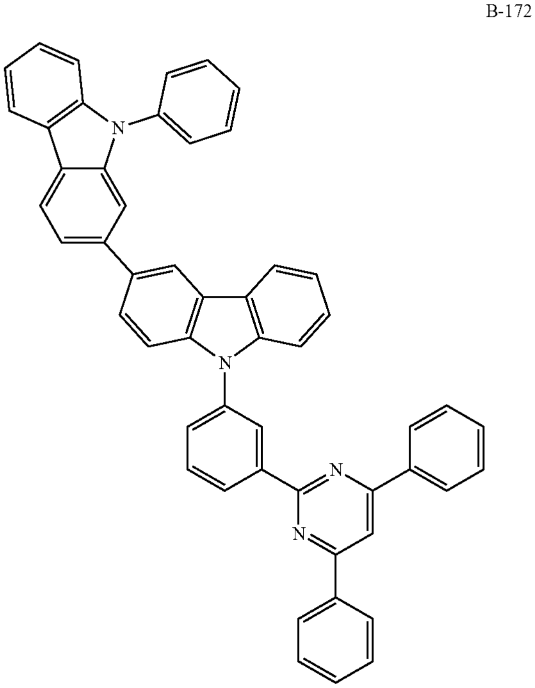 [SMILES: c1ccc(-c2cc(-c3ccccc3)nc(-c3cccc(-n4c5ccccc5c5cc(-c6ccc7c8ccccc8n(-c8ccccc8)c7c6)ccc54)c3)n2)cc1]
B-173
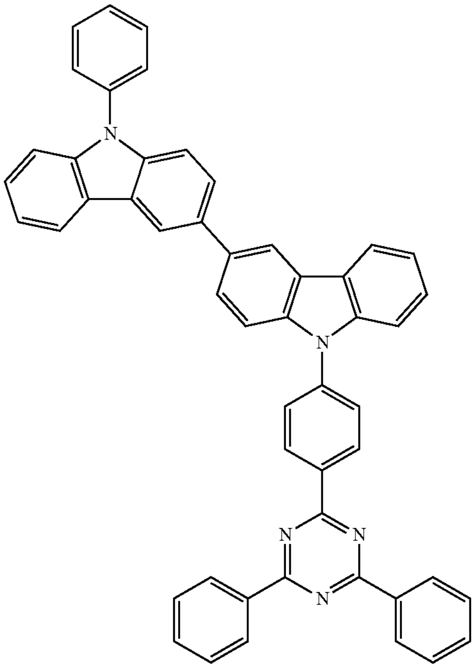
B-174
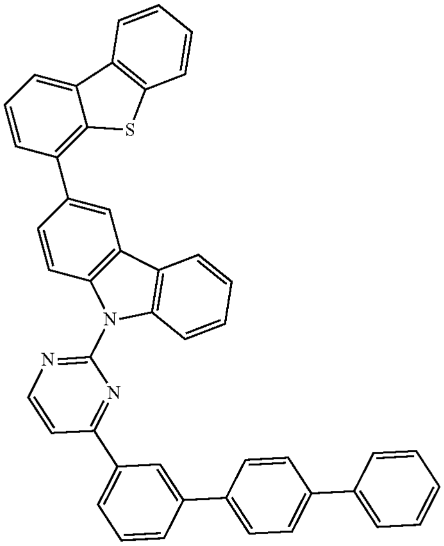
B-175
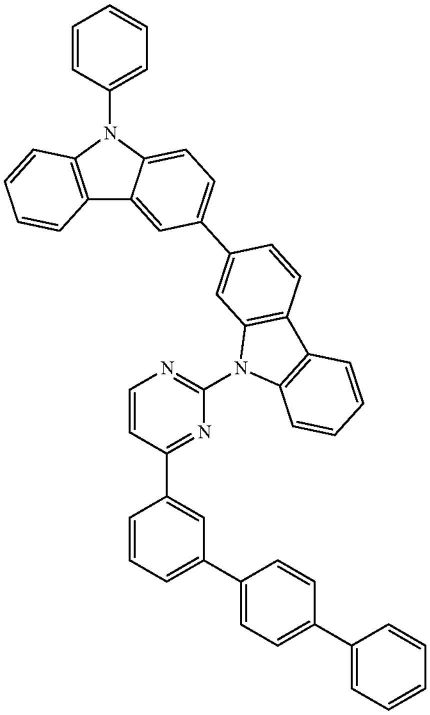

-continued
B-176
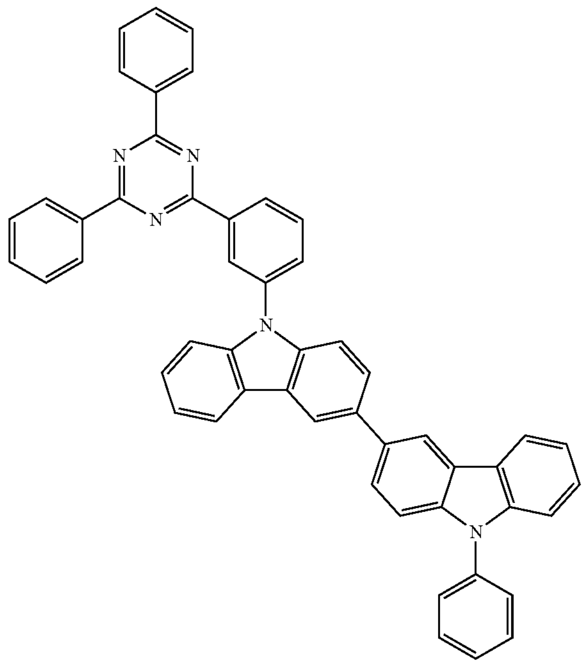
B-177
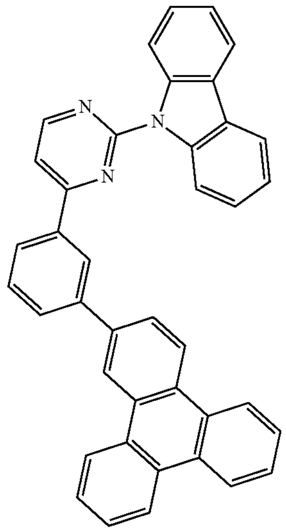
-continued
B-178
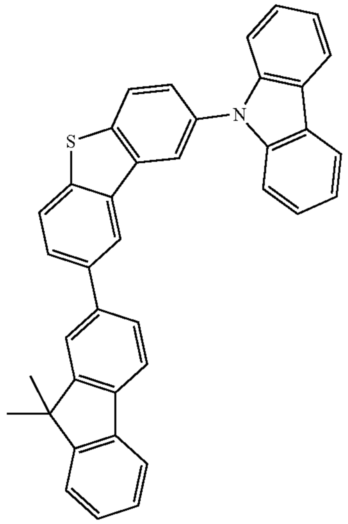
B-179
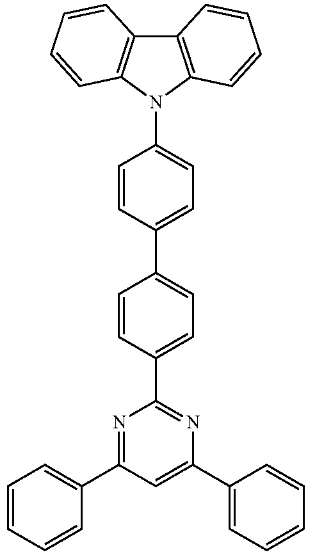

-continued
B-180
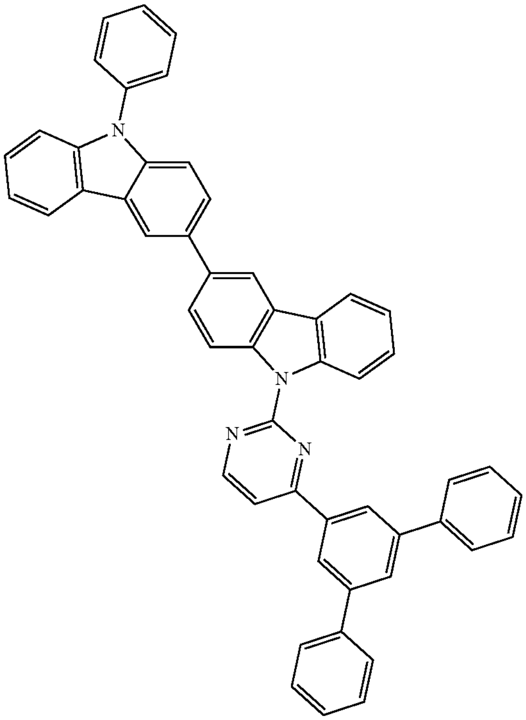
B-181
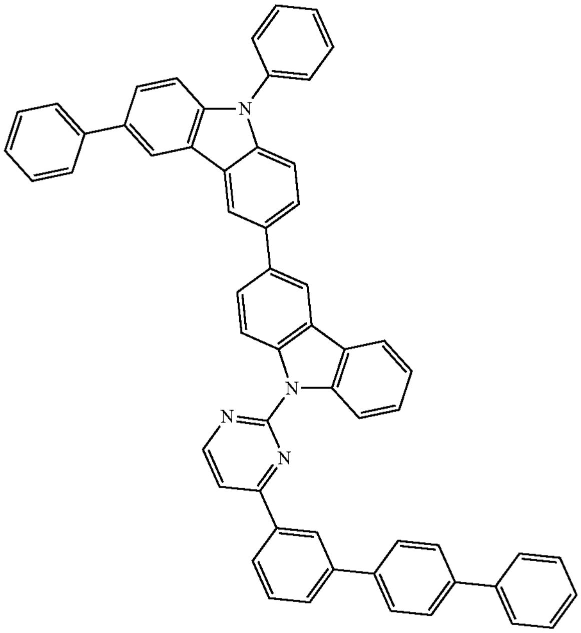
-continued
B-182
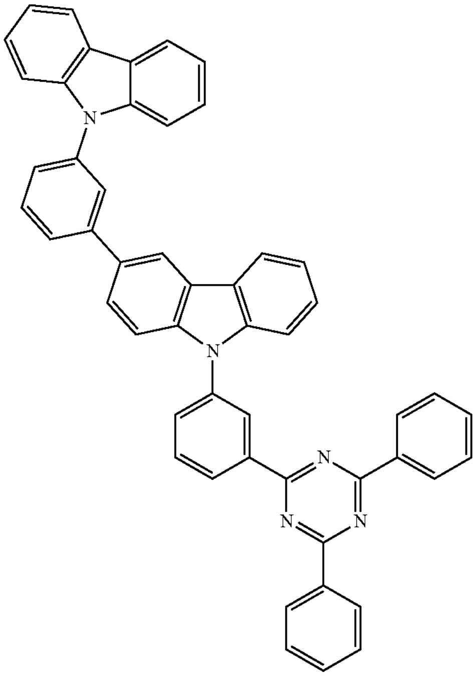
B-183
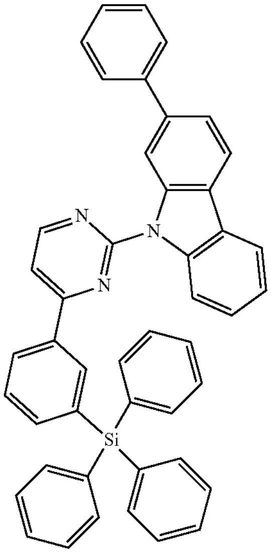

-continued
B-184
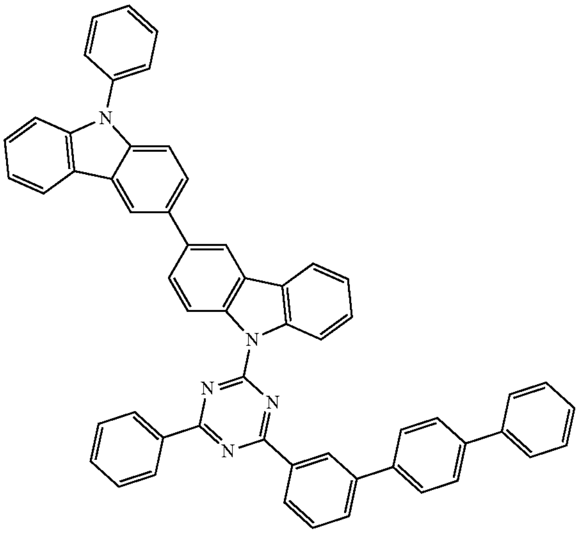
B-185
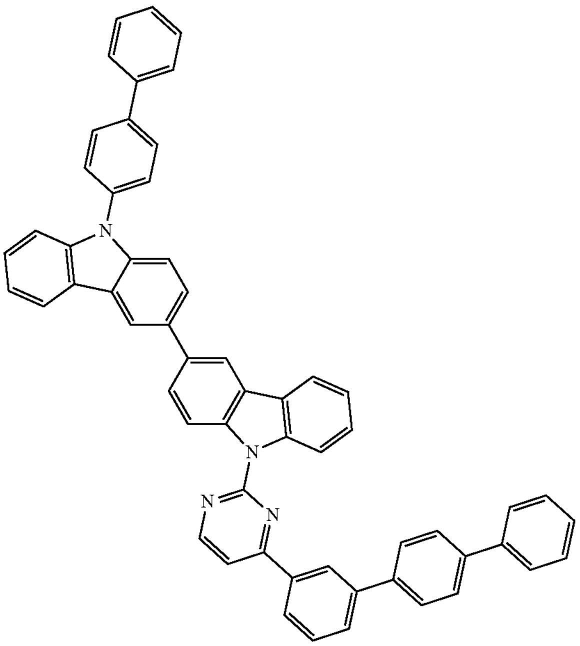
B-186
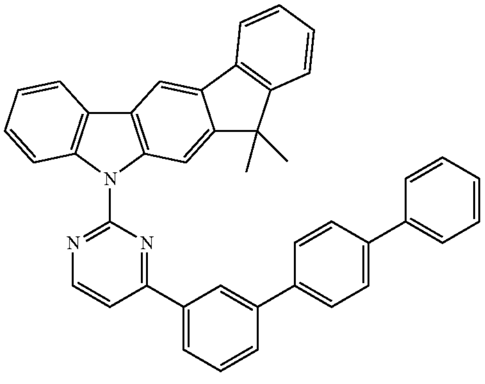
-continued
B-187
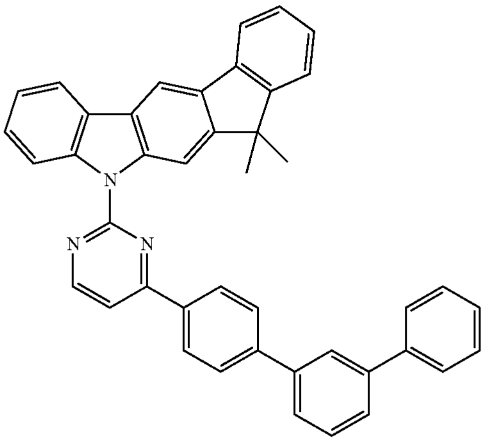
B-188
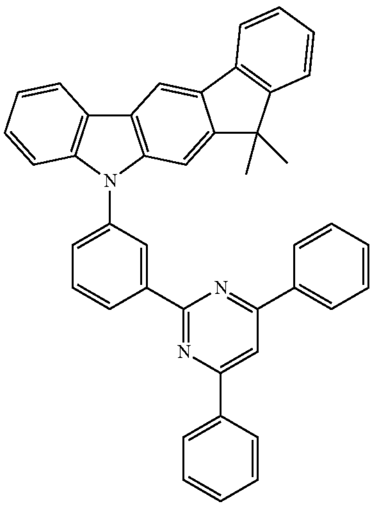
B-189
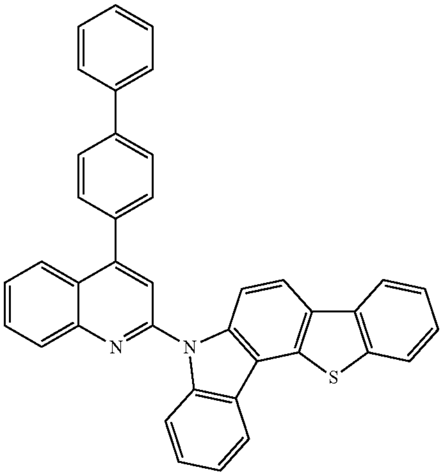

-continued
B-190
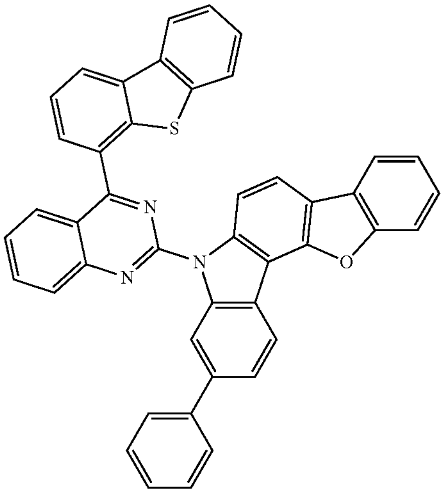
B-191
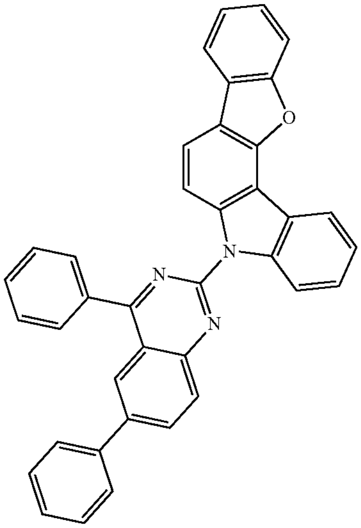
B-192
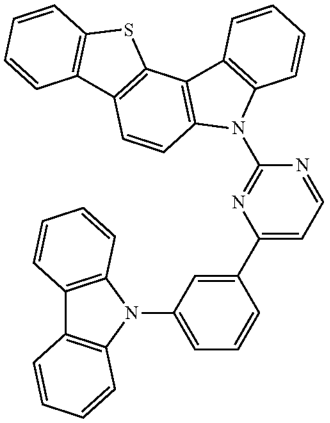
-continued
B-193
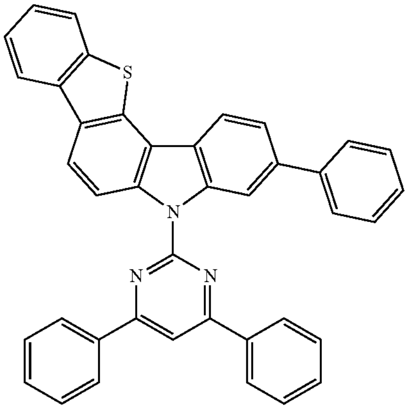
B-194
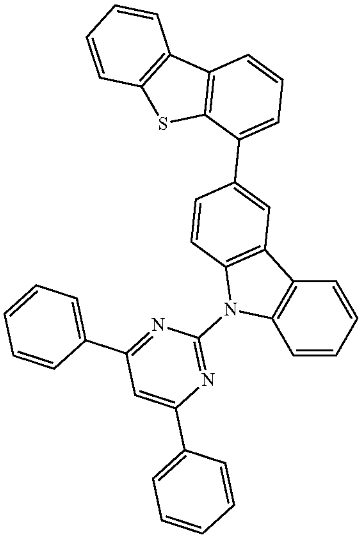
B-195
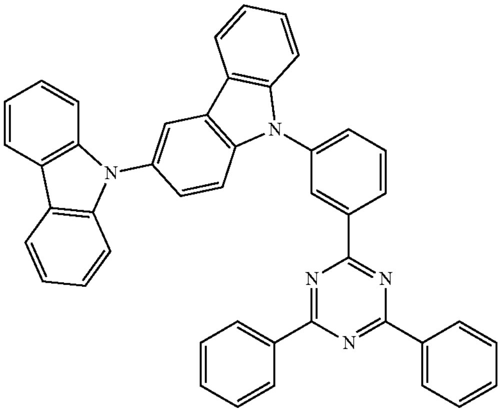

-continued
B-196
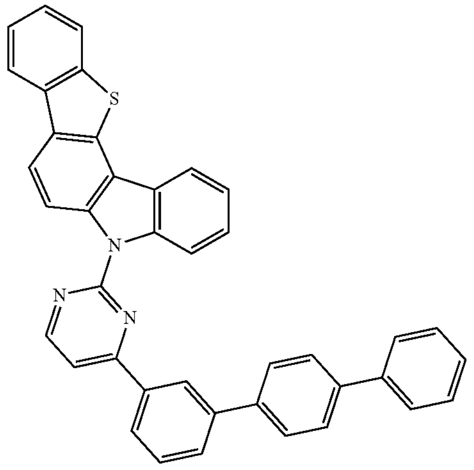
B-197
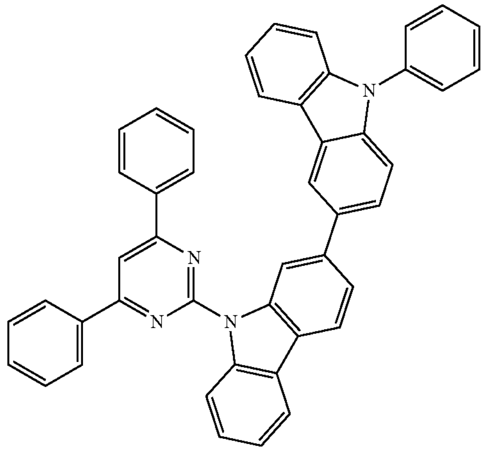
B-198
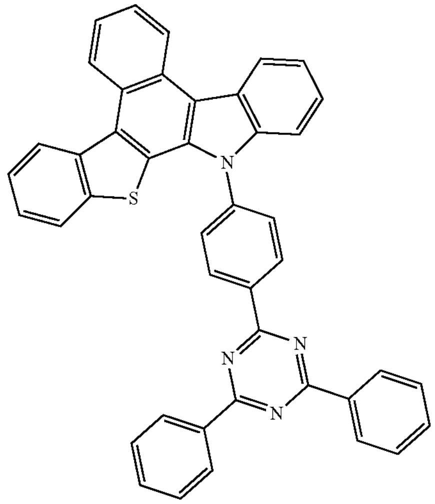
-continued
B-199
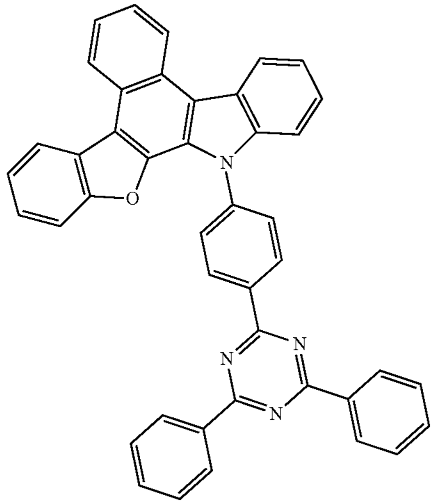
B-200
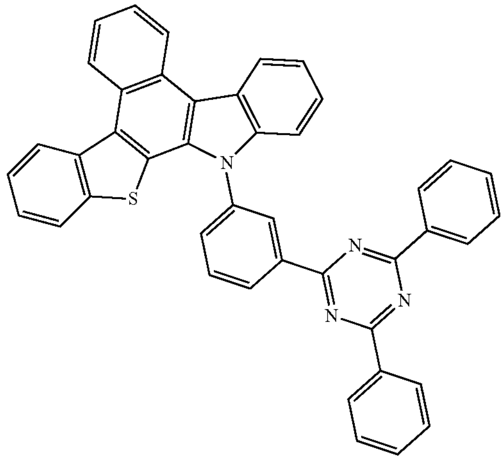
B-201
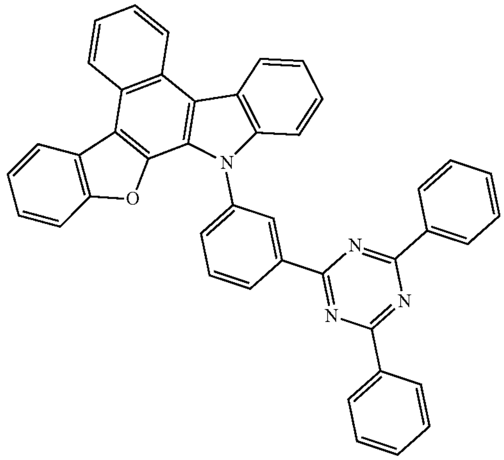

-continued
B-202
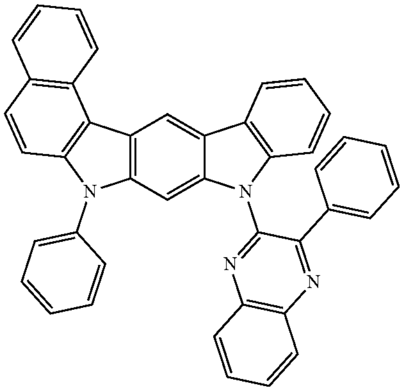
B-203
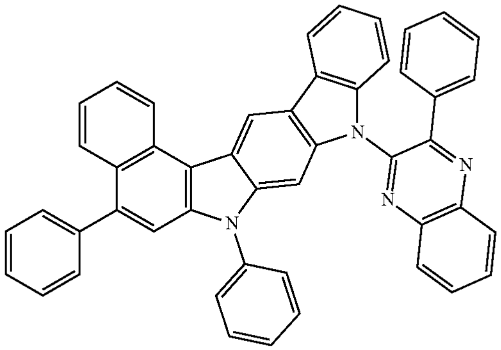
B-204
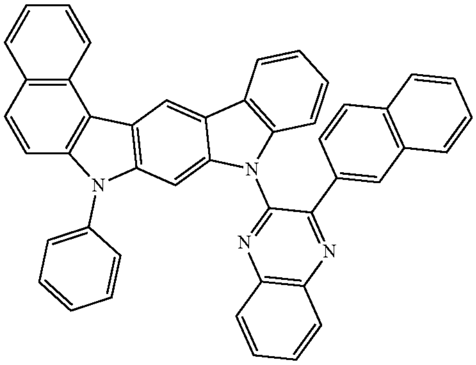
B-205
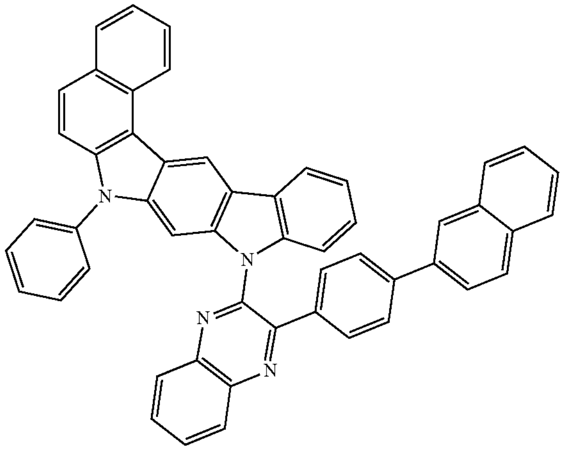
-continued
B-206
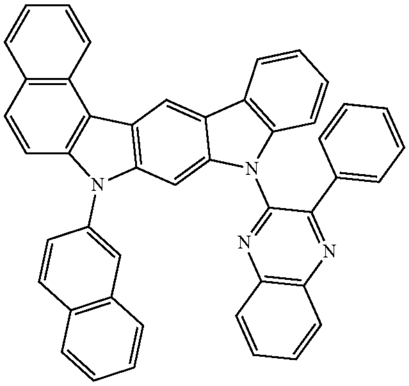
B-207
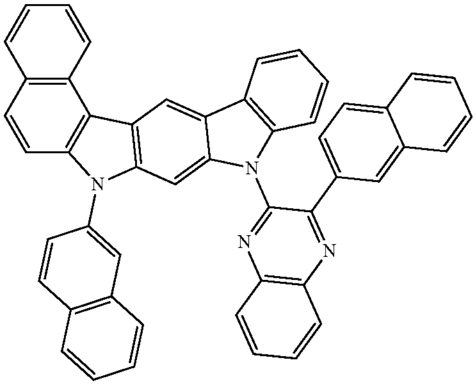
B-208
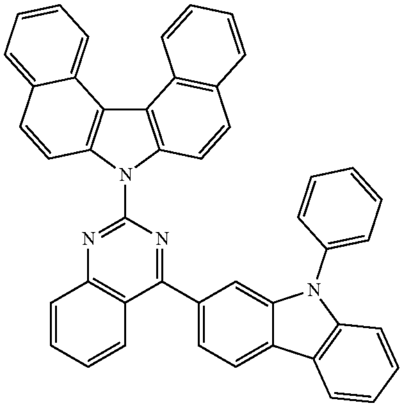

-continued
B-209
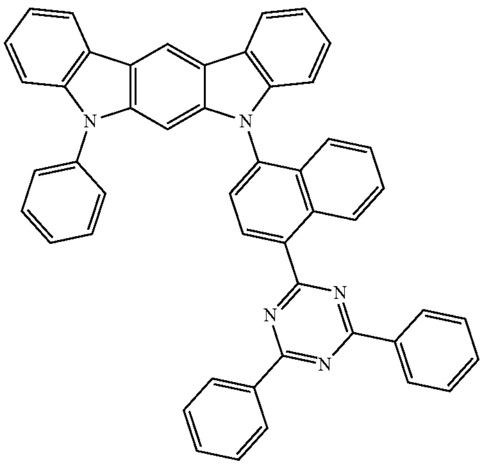
B-210
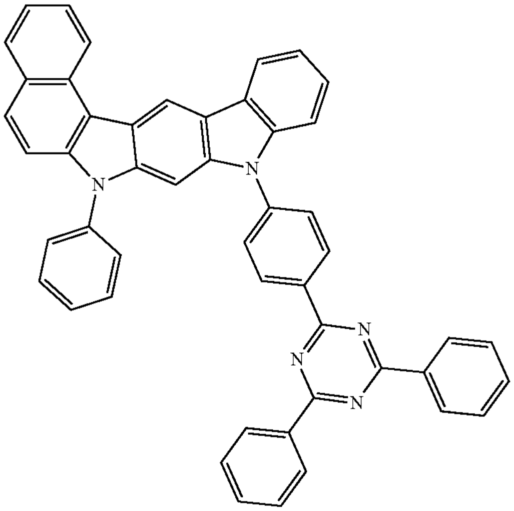
B-211
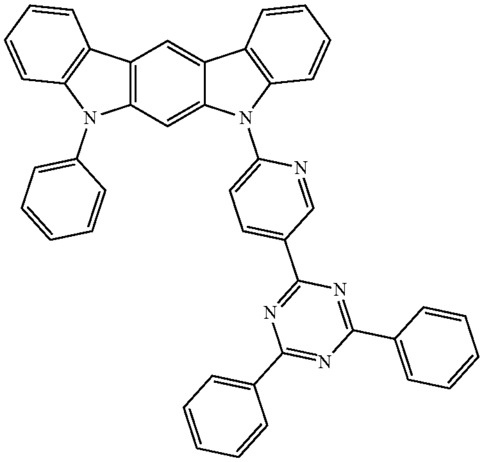
-continued
B-212
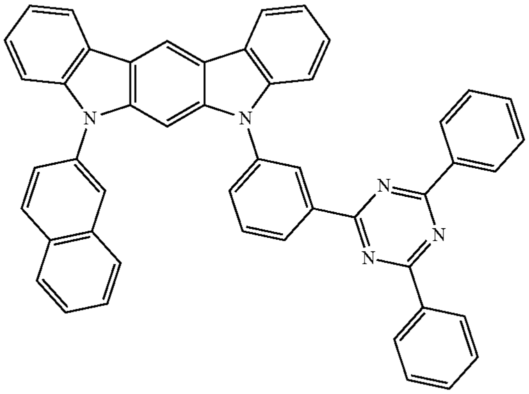
B-213
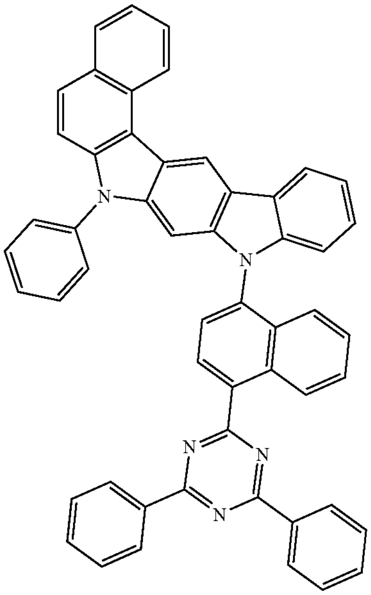
B-214
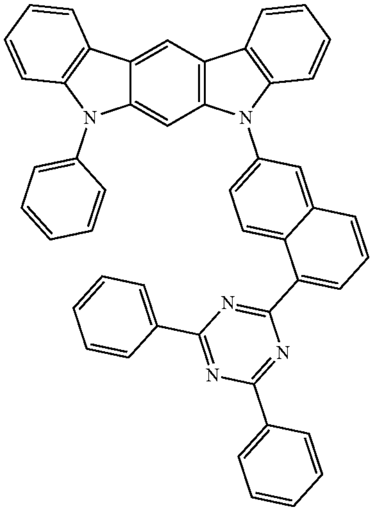

-continued
B-215
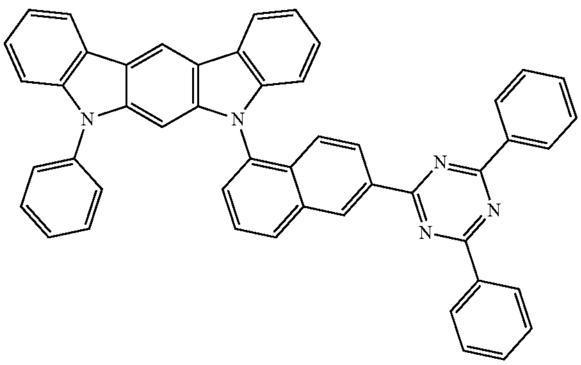
B-216
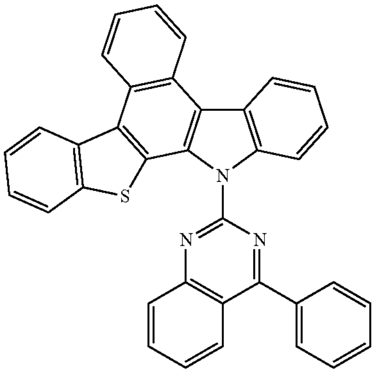
B-217
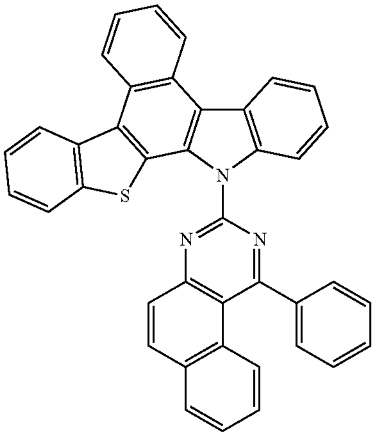
B-218
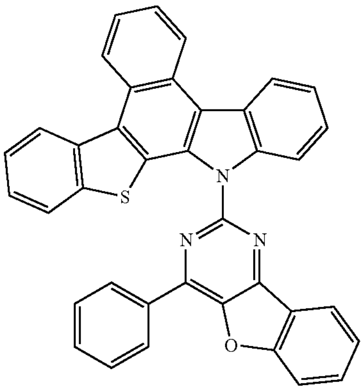
-continued
B-219
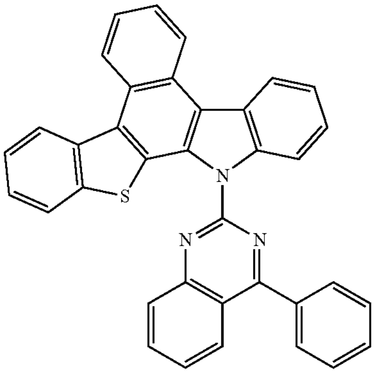
B-220
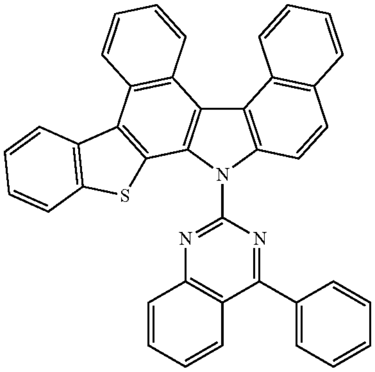
B-221
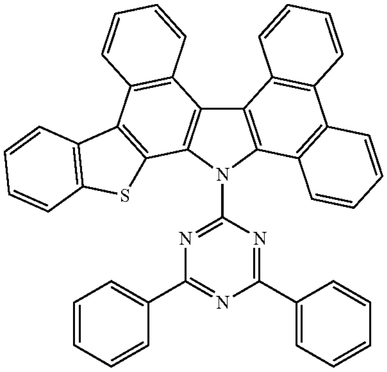
B-222
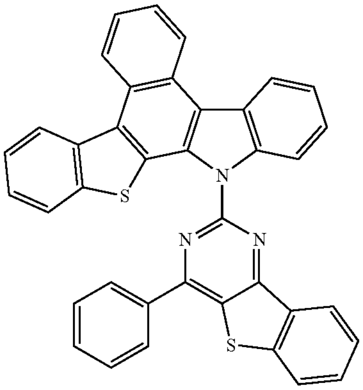

-continued
B-223
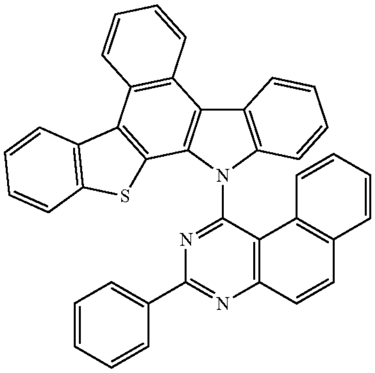
B-224
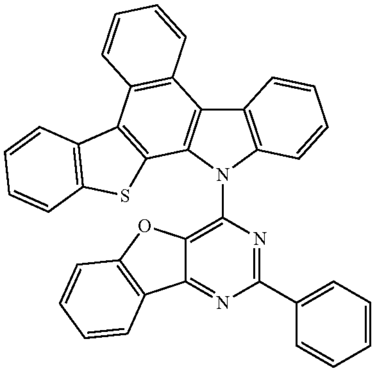
B-225
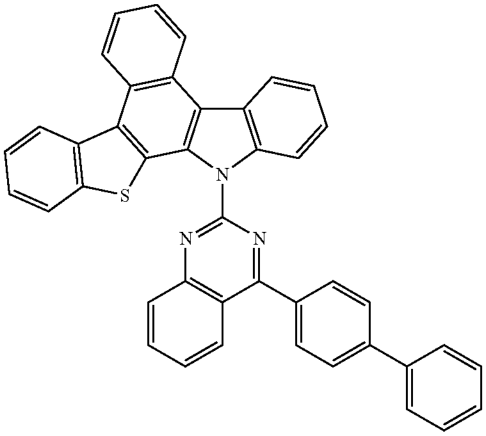
B-226
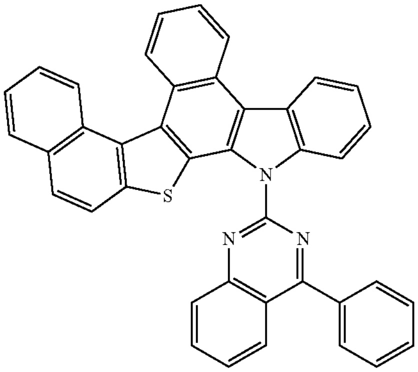
-continued
B-227
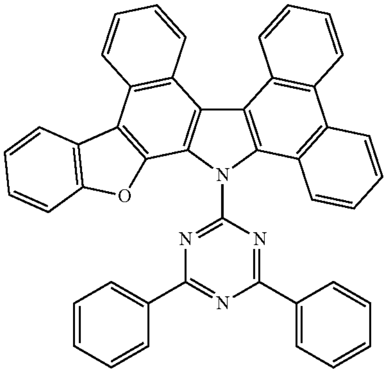
B-228
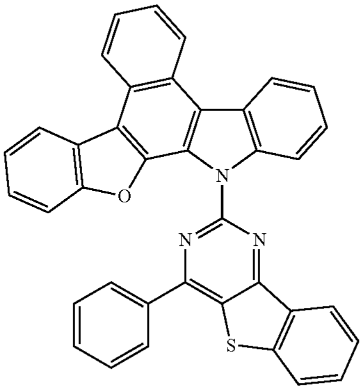
B-229
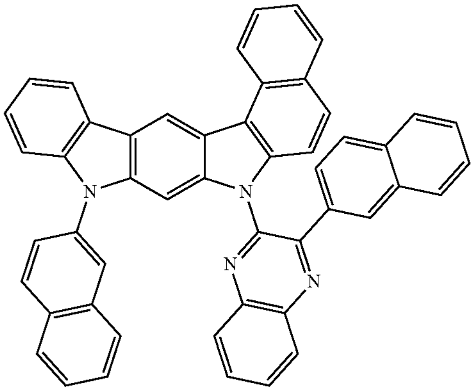
B-230
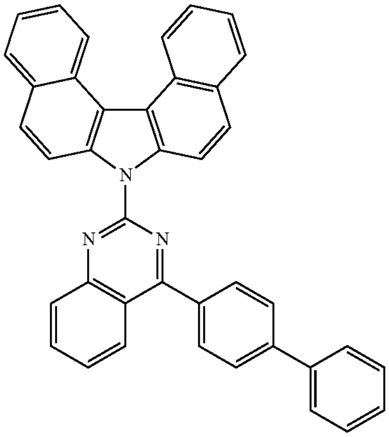

-continued

B-231

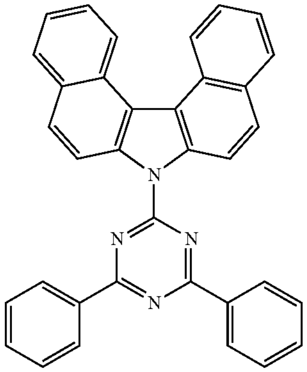

B-232

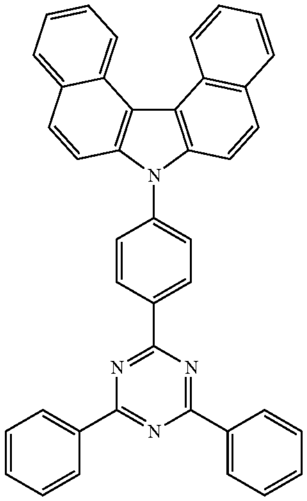

B-233

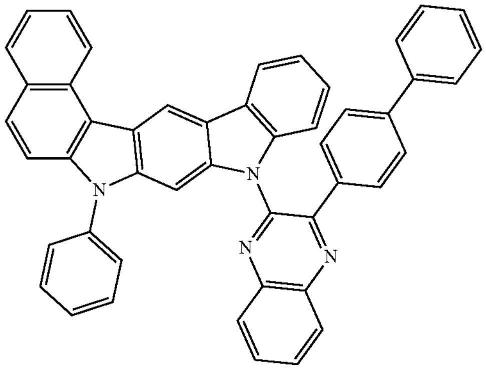

-continued

B-234

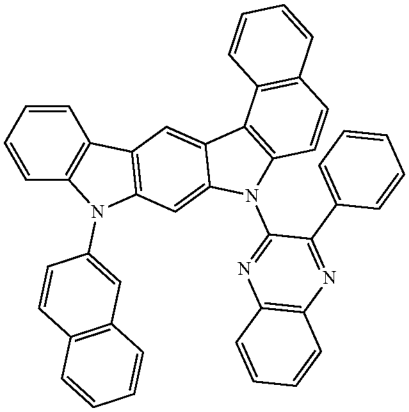

The compound represented by any one of formulas 11 to 13 of the present disclosure may be produced by a synthetic method known to one skilled in the art, but is not limited thereto.

The organic electroluminescent device of the present disclosure may comprise an anode, a cathode, and at least one organic layer between the two electrodes. The organic layer may comprise at least one light-emitting layer, and may further comprise at least one layer selected from a hole injection layer, a hole transport layer, a hole auxiliary layer, a light-emitting auxiliary layer, an electron transport layer, an electron buffer layer, an electron injection layer, an interlayer, a hole blocking layer, and an electron blocking layer. According to one embodiment of the present disclosure, the light-emitting layer may comprise the organic electroluminescent compound of the present disclosure.

The light-emitting layer is a layer from which light is emitted, and can be a single layer or a multi-layer of which two or more layers are stacked. In the light-emitting layer, it is preferable that the doping concentration of a dopant compound with respect to a host compound is less than 20 wt %.

The light-emitting auxiliary layer may be placed between the anode and the light-emitting layer, or between the cathode and the light-emitting layer. When the light-emitting auxiliary layer is placed between the anode and the light-emitting layer, it can be used for promoting the hole injection and/or the hole transport, or for preventing the overflow of electrons. When the light-emitting auxiliary layer is placed between the cathode and the light-emitting layer, it can be used for promoting the electron injection and/or the electron transport, or for preventing the overflow of holes. Also, the hole auxiliary layer may be placed between the hole transport layer (or hole injection layer) and the light-emitting layer, and may be effective to promote or block the hole transport rate (or the hole injection rate), thereby enabling the charge balance to be controlled. In addition, the electron blocking layer may be placed between the hole transport layer (or hole injection layer) and the light-emitting layer, and may block overflowing electrons from the light-emitting layer and confine the excitons in the light-emitting layer to prevent light leakage. When an organic electroluminescent device includes two or more hole transport layers, the hole transport layer, which is further included, may be used as a hole auxiliary layer or an electron blocking layer. The light-emitting auxiliary layer, the hole auxiliary layer or the electron blocking layer may have an effect of improving the efficiency and/or the lifetime of the organic electroluminescent device.

According to one embodiment of the present disclosure, an organic layer comprising a combination of at least one compound comprising ligand $L_1$ represented by formula 1, and at least one compound represented by any one of formulas 11 to 13 is provided. The organic layer may be a single layer or a plurality of layers, and the compound comprising ligand $L_1$ represented by formula 1 and the compound represented by any one of formulas 11 to 13 may be comprised in the same layer or different layers, respectively. According to one embodiment of the present disclosure, the compound comprising ligand $L_1$ represented by formula 1 and the compound represented by any one of formulas 11 to 13 may be comprised in a light-emitting layer. Also, the present disclosure provides an organic electroluminescent device comprising the organic layer.

According to another embodiment of the present disclosure, an organic electroluminescent device comprising at least one dopant compound comprising ligand $L_1$ represented by formula 1 is provided.

According to a further embodiment of the present disclosure, an organic electroluminescent material comprising at least one compound comprising ligand $L_1$ represented by formula 1, and an organic electroluminescent device comprising the material are provided. The material may consist of only the compound comprising ligand $L_1$ represented by formula 1, and may further comprise conventional materials comprised in an organic electroluminescent material.

Also, the organic electroluminescent device of the present disclosure may comprise the compound comprising ligand $L_1$ represented by formula 1, and further comprise at least one compound selected from the group consisting of arylamine-based compounds and styrylarylamine-based compounds.

In addition, in the organic electroluminescent device of the present disclosure, the organic layer may further comprise at least one metal selected from the group consisting of metals of Group 1, metals of Group 2, transition metals of the $4^{th}$ period, transition metals of the $5^{th}$ period, lanthanides and organic metals of d-transition elements of the Periodic Table, or at least one complex compound comprising said metal, besides the compound comprising ligand $L_1$ represented by formula 1. Further, the organic layer may further comprise a light-emitting layer and a charge generating layer.

Further, the organic electroluminescent device of the present disclosure may emit white light by further including at least one light-emitting layer containing a blue, red or green light-emitting compound, which are known in the art. Also, it may further comprise a yellow or orange light-emitting layer, if necessary.

In the organic electroluminescent device of the present disclosure, at least one layer selected from a chalcogenide layer, a metal halide layer and a metal oxide layer (hereinafter, "a surface layer") may be preferably placed on an inner surface(s) of one or both electrodes. Specifically, a chalcogenide (including oxides) layer of silicon or aluminum is preferably placed on an anode surface of an electroluminescent medium layer, and a metal halide layer or a metal oxide layer is preferably placed on a cathode surface of an electroluminescent medium layer. Such a surface layer may provide operation stability for the organic electroluminescent device. Preferably, the chalcogenide includes $SiO_x$ ($1 \leq X \leq 2$), $AlO_x$($1 \leq X \leq 1.5$), SiON, SiAlON, etc.; the metal halide includes LiF, $MgF_2$, $CaF_2$, a rare earth metal fluoride, etc.; and the metal oxide includes $Cs_2O$, $Li_2O$, MgO, SrO, BaO, CaO, etc.

In the organic electroluminescent device of the present disclosure, a mixed region of an electron transport compound and a reductive dopant, or a mixed region of a hole transport compound and an oxidative dopant is preferably placed on at least one surface of a pair of electrodes. In this case, the electron transport compound is reduced to an anion, and thus it becomes easier to inject and transport electrons from the mixed region to an electroluminescent medium. Further, the hole transport compound is oxidized to a cation, and thus it becomes easier to inject and transport holes from the mixed region to the electroluminescent medium. Preferably, the oxidative dopant includes various Lewis acids and acceptor compounds; and the reductive dopant includes alkali metals, alkali metal compounds, alkaline earth metals, rare-earth metals, and mixtures thereof. A reductive dopant layer may be employed as a charge-generating layer to prepare an organic electroluminescent device having two or more light-emitting layers and emitting white light.

The organic electroluminescent material according to the present disclosure may be used as a light-emitting material for a white organic light-emitting device. The white organic light-emitting device has been suggested to have various structures such as a side-by-side structure or a stacking structure depending on the arrangement of R (red), G (green) or YG (yellow green), and B (blue) light-emitting parts, or color conversion material (CCM) method, etc. The organic electroluminescent material according to the present disclosure may also be used in an organic electroluminescent device comprising a quantum dot (QD).

In order to form each layer of the organic electroluminescent device of the present disclosure, dry film-forming methods such as vacuum evaporation, sputtering, plasma and ion plating methods, or wet film-forming methods such as ink jet printing, nozzle printing, slot coating, spin coating, dip coating, and flow coating methods may be used. The dopant and host compounds of the present disclosure may be co-evaporated or mixture-evaporated.

When using a wet film-forming method, a thin film may be formed by dissolving or diffusing materials forming each layer into any suitable solvent such as ethanol, chloroform, tetrahydrofuran, dioxane, etc. The solvent may be any solvent where the materials forming each layer can be dissolved or diffused, and where there are no problems in film-formation capability.

The co-evaporation is a mixed deposition method in which two or more isomer materials are placed in a respective individual crucible source and a current is applied to both cells at the same time to evaporate the materials. The mixture-evaporation is a mixed deposition method in which two or more isomer materials are mixed in one crucible source before evaporating them, and a current is applied to the cell to evaporate the materials.

In addition, it is possible to produce a display system, for example, a display system for smart phones, tablets, notebooks, PCs, TVs, or cars; or a lighting system, for example an outdoor or indoor lighting system, by using the organic electroluminescent device of the present disclosure.

Hereinafter, the synthesis method of the compound according to the present disclosure and the properties thereof, and the luminescent properties of an organic electroluminescent device (OLED) comprising the same will be explained in detail with reference to the representative compounds of the present disclosure. However, the present disclosure is not limited by the following examples.

Example 1: Preparation of Compound C-3

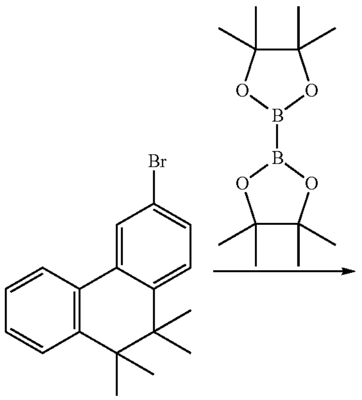

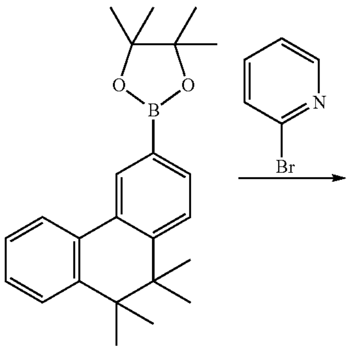

2

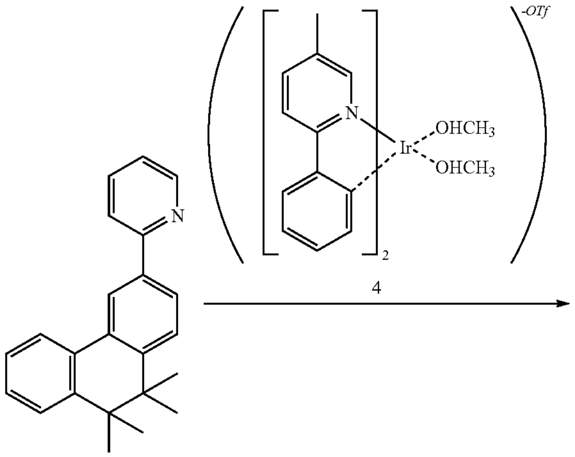

4

3

-continued

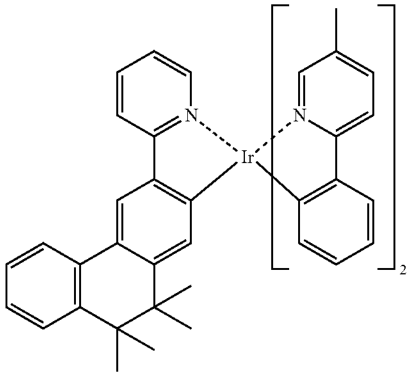

C-3

Synthesis of Compound 2

In a flask, 3-bromo-9,9,10,10-tetramethyl-9,10-dihydrophenanthrene (30 g, 94.56 mmol), bis(pinacolato)diboron (72 g, 283.67 mmol), and [bis(diphenylphosphino)ferrocene]palladium(II) dichloride (Pd(dppf)$Cl_2$) (4.152 g, 10 mol %), KOAc (27 g, 283.67 mmol) were dissolved in 1,4-dioxin (300 mL), and the mixture was stirred under reflux at 140° C. for 12 hours. After completion of the reaction, the mixture was cooled to room temperature. An organic layer was extracted with ethyl acetate. The residual moisture was removed with magnesium sulfate. The residue was separated by column chromatography to obtain compound 2 (34 g, yield: 99%).

Synthesis of Compound 3

In a flask, compound 2 (34 g, 93.84 mmol), 2-bromopyridine (9 mL, 93.84 mmol), $Pd(PPh_3)_4$ (5.4 g, 5 mmol %), and $K_3PO_4$ (59.7 g, 281.51 mmol) were dissolved in 1,4-dioxin (320 mL), and the mixture was stirred under reflux at 140° C. for 12 hours. After completion of the reaction, the mixture was cooled to room temperature. An organic layer was extracted with ethyl acetate. The residual moisture was removed with magnesium sulfate. The residue was separated by column chromatography to obtain compound 3 (18 g, yield: 68%).

Synthesis of Compound C-3

Compound 3 (8.5 g, 26.96 mmol), compound 4 (10 g, 13.48 mmol), MeOH (228 mL), EtOH (114 mL), and $Cs_2CO_3$ (3.4 g, 10.5 mmol) were introduced into a flask, and the mixture was stirred under reflux at 100° C. for 12 hours. The mixture was cooled to room temperature, and a reaction mixture was obtained through a filter. The residue was separated by column chromatography to obtain compound C-3 (1.8 g, yield: 16%).

| | MW | UV | PL | M.P. |
|---|---|---|---|---|
| C-3 | 841.09 | 294 nm | 517 nm | 400° C. |

Device Example 1: Producing a Green OLED Comprising the Organic Electroluminescent Compound According to the Present Disclosure An OLED according to the present disclosure was produced. A transparent electrode indium tin oxide (ITO) thin film (10 O/sq) on a glass substrate for an OLED (GEOMATEC CO., LTD., Japan) was subjected to an ultrasonic washing with acetone and isopropyl alcohol, sequentially, and then was stored in isopropyl alcohol. The ITO substrate was then mounted on a substrate holder of a vacuum vapor deposition apparatus. Compound HI-1 was introduced into a cell of the vacuum vapor deposition apparatus, and compound HT-1 was introduced into another cell of the vacuum vapor deposition apparatus. The two materials were evaporated at different rates, and compound HI-1 was deposited in a doping amount of 3 wt % based on the total amount of compound HI-1 and compound HT-1 to form a hole injection layer having a thickness of 10 nm on the ITO substrate. Next, compound HT-1 was deposited on the hole injection layer to form a first hole transport layer having a thickness of 80 nm. Compound HT-2 was then introduced into another cell of the vacuum vapor deposition apparatus and was evaporated by applying an electric current to the cell, thereby forming a second hole transport layer having a thickness of 30 nm on the first hole transport layer. After forming the hole injection layer and the hole transport layers, a light-emitting layer was formed thereon as follows.

Compound B-8 and compound B-112 were introduced into two cells of the vacuum vapor deposition apparatus as hosts, and compound C-3 was introduced into another cell as a dopant. The two host materials were evaporated at a rate of 2:1 and the dopant material was simultaneously evaporated at a different rate, and the dopant was deposited in a doping amount of 10 wt % based on the total amount of the hosts and the dopant to form a light-emitting layer having a thickness of 40 nm on the second hole transport layer. Compound ETL-1 and compound EIL-1 were evaporated in a weight ratio of 4:6 to form an electron transport layer having a thickness of 35 nm on the light-emitting layer. After depositing compound EIL-1 as an electron injection layer having a thickness of 2 nm on the electron transport layer, an Al cathode having a thickness of 80 nm was deposited on the electron injection layer by another vacuum vapor deposition apparatus. Thus, an OLED was produced. All the materials used for producing the OLED were purified by vacuum sublimation at $10^{-6}$ torr.

Comparative Example 1: Producing a Green OLED not Comprising the Organic Electroluminescent Compound According to the Present Disclosure An OLED was produced in the same manner as in Device Example 1, except that compound D1 was used instead of compound C-3 as a dopant of the light-emitting layer.

The driving voltage, luminous efficiency, and light-emitting color at a luminance of 1,000 nit, and the time taken for luminance to decrease from 100% to 95% at a luminance of 20,000 nit (lifetime; T95) of the OLEDs produced in the Device Example and the Comparative Example are provided in Table 1 below.

TABLE 1

| | Driving Voltage [V] | Luminous Efficiency [cd/A] | Light-Emitting Color | Lifetime (T95) [hr] |
|---|---|---|---|---|
| Device Example 1 | 3.4 | 75.2 | Green | 6 |
| Comparative Example 1 | 3.3 | 64.8 | Green | 3.7 |

From Table 1 above, it can be confirmed that the OLED comprising the organic electroluminescent compound according to the present disclosure as a dopant material exhibits excellent luminous efficiency and lifetime properties compared to the OLED using the conventional dopant material (Comparative Example 1).

TABLE 2

| Hole Injection Layer/Hole Transport Layer | |
|---|---|
| | 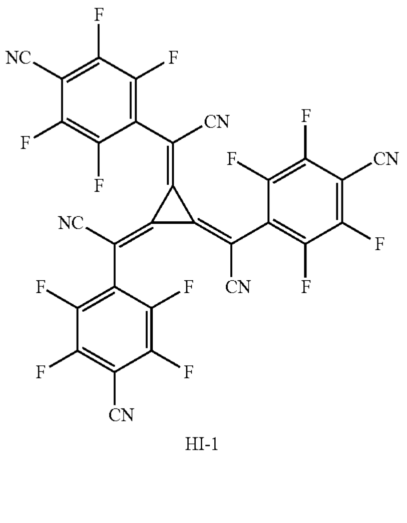 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F ; [I-]] HI-1 |

TABLE 2-continued
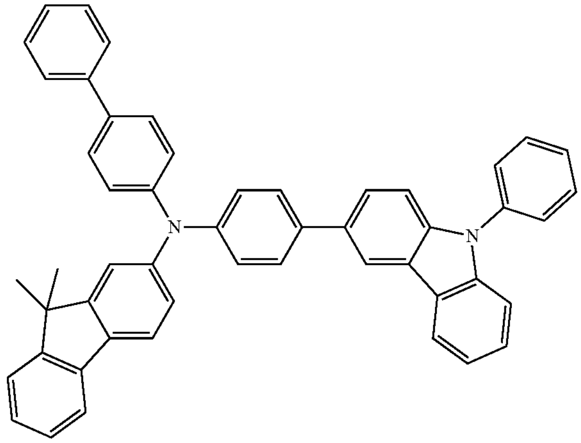
HT-1
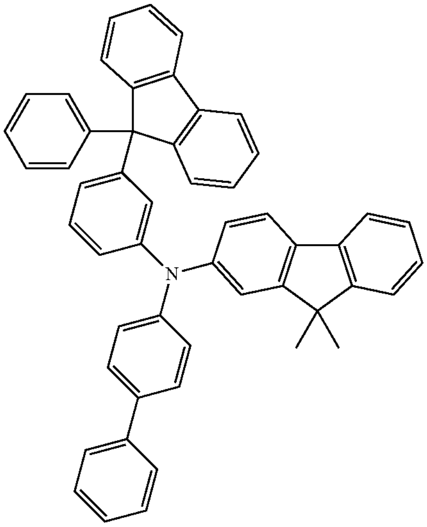
HT-2

TABLE 2-continued
Light-Emitting Layer
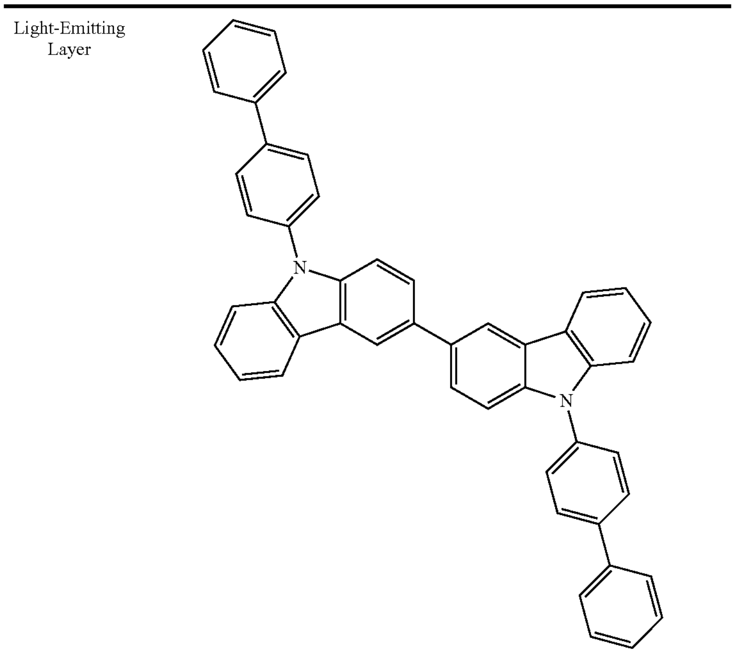
B-8
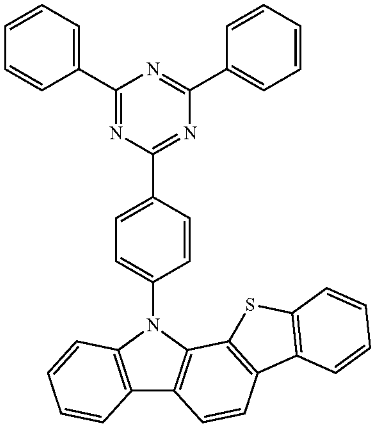
B-112
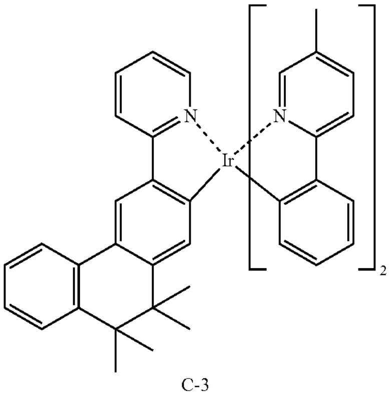
C-3

TABLE 2-continued
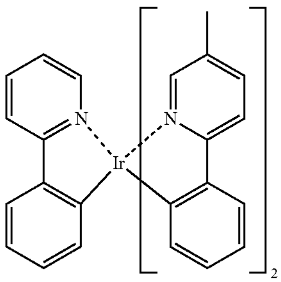
D1
Electron Transport Layer/Electron Injection Layer
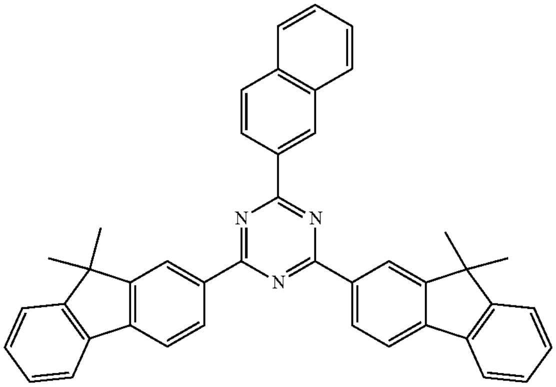
ETL-1
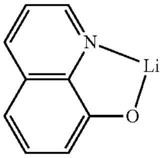
EIL-1

The invention claimed is:

1. An organic electroluminescent compound represented by the following formula 2:

$$M(L_1)x(L_2)y \quad (2)$$

in formula 2,

M represents a metal having an atomic number greater than 40;

x represents 1 or 2;

y represents 1 or 2;

the sum of x and y is the oxidation number of M;

$L_1$ represents the ligand represented by formula 1;

(1)

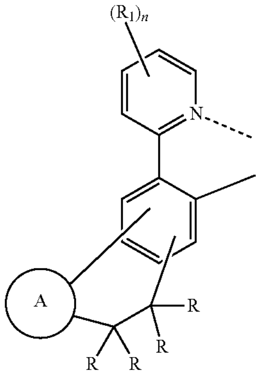

in formula 1, ring A represents a substituted or unsubstituted benzene ring, or a substituted or unsubstituted pyridine ring;

R, each independently, represents a substituted or unsubstituted (C1-C30)alkyl, a substituted or unsubstituted (C3-C30)cycloalkyl, a substituted or unsubstituted (C6-C30)aryl, or a substituted or unsubstituted (3- to 30-membered)heteroaryl;

$R_1$, each independently, represents hydrogen, deuterium, a substituted or unsubstituted (C1-C30)alkyl, a substituted or unsubstituted (C3-C30)cycloalkyl, a substituted or unsubstituted (C6-C30)aryl, or a substituted or unsubstituted (3- to 30-membered)heteroaryl;

n represents an integer of 1 to 4, in which, if n is an integer of 2 or more, each of $R_1$ may be the same or different; and wherein one or more hydrogen atoms in ring A, R, and $R_1$ may be replaced with one or more deuterium atoms; and $L_2$ represents the ligand represented by the following formula 3 or 4:

(3)

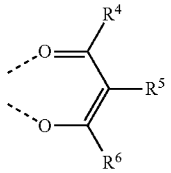

-continued (4)

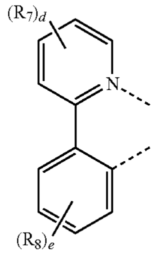

in formulas 3 and 4, $R_4$ to $R_8$, each independently, represent hydrogen, deuterium, a substituted or unsubstituted (C1-C30)alkyl, a substituted or unsubstituted (C3-C30)cycloalkyl, a substituted or unsubstituted (C6-C30)aryl, or a substituted or unsubstituted (3- to 30-membered)heteroaryl; or $R_4$ and $R_5$, $R_5$ and $R_6$, adjacent $R_7$'s, and adjacent $R_8$'s, each independently, may be linked to each other to form a ring(s); and d and e, each independently, represent an integer of 1 to 4, in which, if d and e, each independently, are an integer of 2 or more, each of $R_7$ and each of $R_8$ may be the same or different.

2. The organic electroluminescent compound according to claim 1, wherein the metal having an atomic number greater than 40 is Ir or Pt.

3. The organic electroluminescent compound according to claim 1, wherein the ligand $L_1$ is represented by the following formula 1-1 or 1-2:

(1-1)

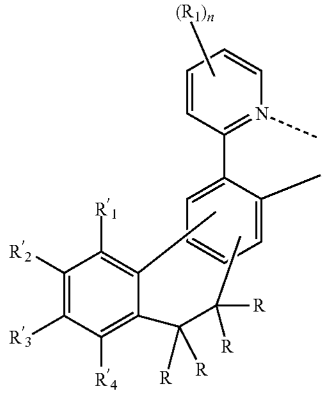

(1-2)

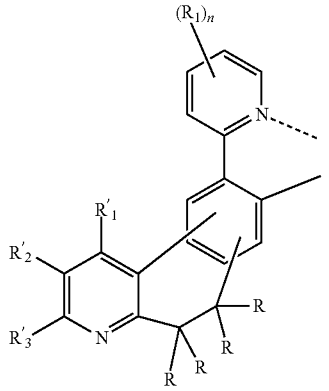

in formulas 1-1 and 1-2, $R'_1$ to $R'_4$, each independently, represent hydrogen, deuterium, a substituted or unsubstituted (C1-C30)alkyl, or a substituted or unsubstituted (C3-C30)cycloalkyl; and R, $R_1$, and n are as defined in claim 1.

4. The organic electroluminescent compound according to claim 3, wherein the organic electroluminescent compound is represented by the following formula 2-1 or 2-2:

(2-1)

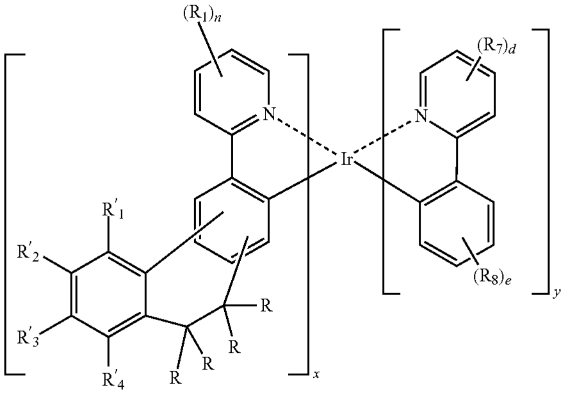

(2-2)

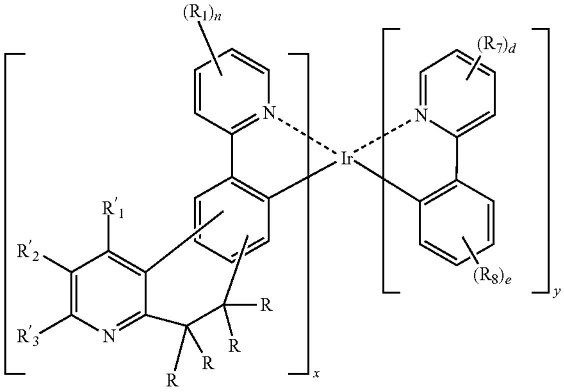

in formulas 2-1 and 2-2, $R_7$ and $R_8$, each independently, represent hydrogen, deuterium, a substituted or unsubstituted (C1-C30)alkyl, a substituted or unsubstituted (C3-C30)cycloalkyl, a substituted or unsubstituted (C6-C30)aryl, or a substituted or unsubstituted (3- to 30-membered)heteroaryl; or adjacent $R_7$'s, and adjacent $R_8$'s, each independently, may be linked to each other to form a ring(s);

d and e, each independently, represent an integer of 1 to 4, in which, if d and e, each independently, are an integer of 2 or more, each of $R_7$ and each of $R_8$ may be the same or different;

x represents 1 or 2;

y represents 1 or 2;

the sum of x and y is the oxidation number of Ir;

R, $R_1$, and n are as defined in claim 1; and $R'_1$ to $R'_4$ are as defined in claim 3.

5. The organic electroluminescent compound according to claim 1, wherein R, each independently, represents a (C1-C10)alkyl unsubstituted or substituted with deuterium, or an unsubstituted (C6-C25)aryl.

6. The organic electroluminescent compound according to claim 1, wherein $R_1$ and $R_4$ to $R_8$, each independently, are selected from the group consisting of hydrogen, deuterium, methyl, ethyl, n-propyl, isopropyl, n-butyl, isobutyl, sec-butyl, tert-butyl, n-pentyl, tert-pentyl, neopentyl, isopentyl, sec-pentyl, sec-isopentyl, 3-pentyl, and phenyl; and the hydrogen in $R_1$ and $R_4$ to $R_8$ may be substituted with deuterium.

7. The organic electroluminescent compound according to claim 3, wherein $R'_1$ to $R'_4$, each independently, are selected from the group consisting of hydrogen, deuterium, methyl, ethyl, n-propyl, isopropyl, n-butyl, isobutyl, sec-butyl, tert-butyl, n-pentyl, tert-pentyl, neopentyl, isopentyl, sec-pentyl, sec-isopentyl, and 3-pentyl; and the hydrogen in $R'_1$ to $R'_4$ may be substituted with deuterium.

8. The organic electroluminescent compound according to claim 1, wherein the substituent(s) of the substituted benzene ring, the substituted pyridine ring, the substituted alkyl, the substituted aryl, the substituted heteroaryl, and the substituted cycloalkyl, each independently, are at least one selected from the group consisting of deuterium; a halogen; a cyano; a carboxyl; a nitro; a hydroxyl; a phosphine oxide; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered)heteroaryl unsubstituted or substituted with a (C6-C30)aryl(s); a (C6-C30)aryl unsubstituted or substituted with at least one of a (C1-C30) alkyl(s), a (C6-C30)aryl(s), and a (3- to 30-membered) heteroaryl(s); a tri(C1-C30)alkylsilyl; a tri(C6-C30)arylsilyl; a di(C1-C30)alkyl(C6-C30)arylsilyl; a (C1-C30)alkyldi (C6-C30)arylsilyl; a fused ring group of a (C3-C30) aliphatic ring(s) and a (C6-C30) aromatic ring(s); an amino; a mono- or di-(C1-C30)alkylamino; a mono- or di-(C2-C30) alkenylamino; a (C1-C30)alkyl(C2-C30)alkenylamino; a mono- or di-(C6-C30)arylamino; a (C1-C30)alkyl(C6-C30) arylamino; a mono- or di-(3- to 30-membered)heteroarylamino; a (C1-C30)alkyl(3- to 30-membered)heteroarylamino; a (C2-C30)alkenyl(C6-C30)arylamino; a (C2-C30) alkenyl(3- to 30-membered)heteroarylamino; a (C6-C30) aryl(3- to 30-membered)heteroarylamino; a (C1-C30) alkylcarbonyl; a (C1-C30)alkoxycarbonyl; a (C6-C30) arylcarbonyl; a (C6-C30)arylphosphinyl; a di(C6-C30) arylboronyl; a di(C1-C30)alkylboronyl; a (C1-C30)alkyl (C6-C30)arylboronyl; a (C6-C30)aryl(C1-C30)alkyl; and a (C1-C30)alkyl(C6-C30)aryl.

9. The organic electroluminescent compound according to claim 1, wherein the organic electroluminescent compound is selected from the group consisting of the following:

C-1

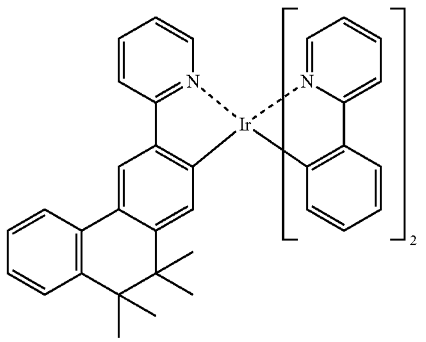

-continued
C-2
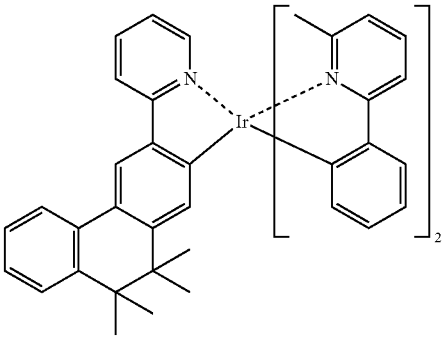
C-3
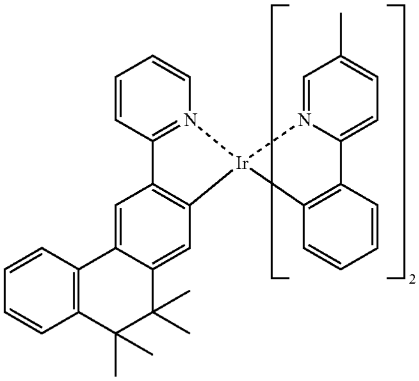
C-4
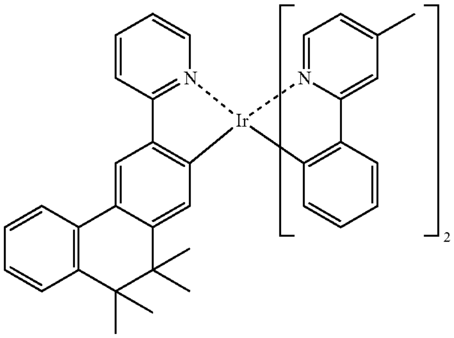
C-5
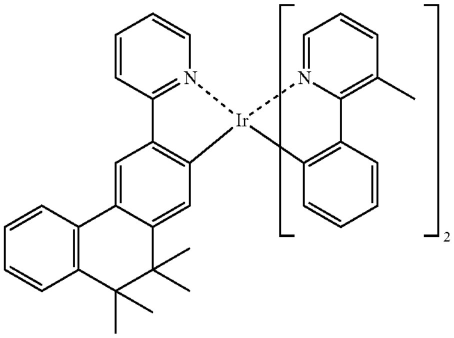
-continued
C-6
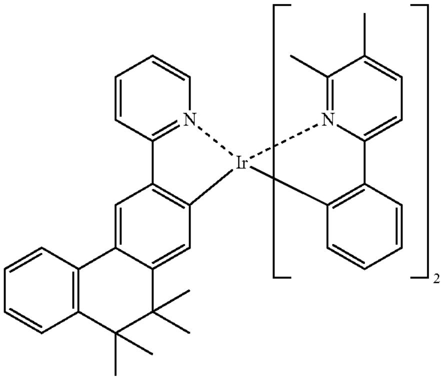
C-7
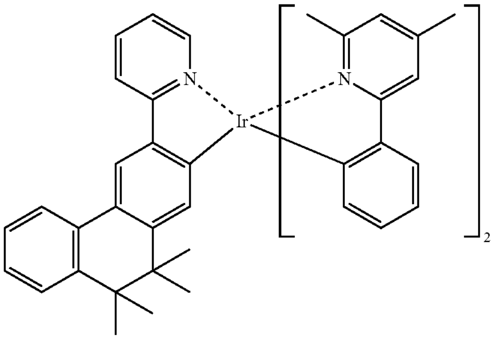
C-8
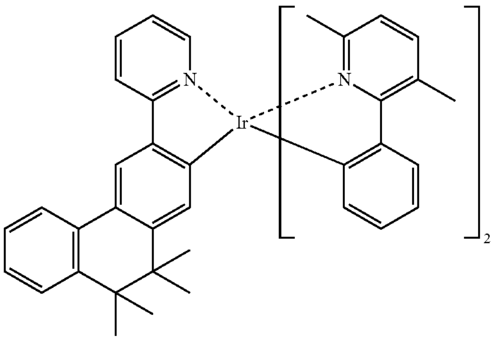
C-9
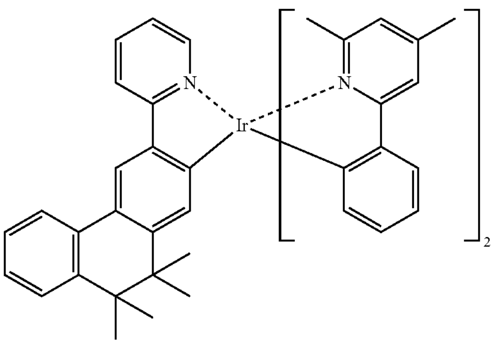

-continued
C-10
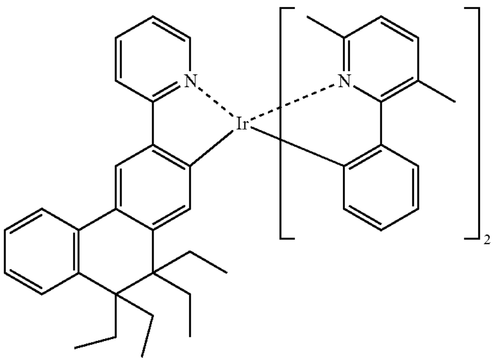
C-11
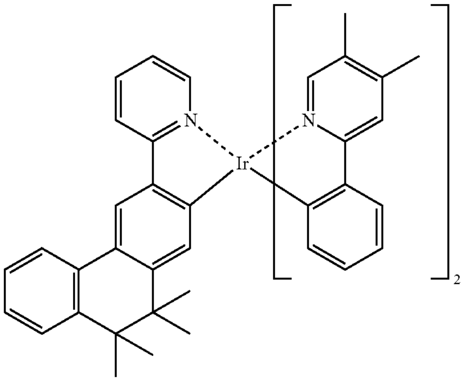
C-12
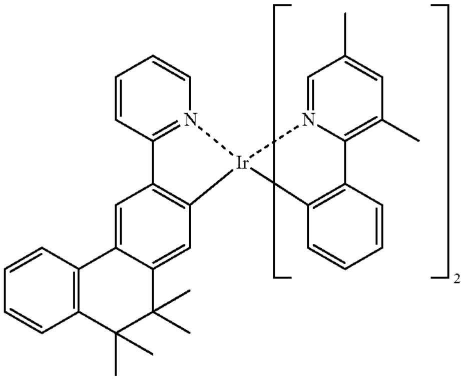
C-13
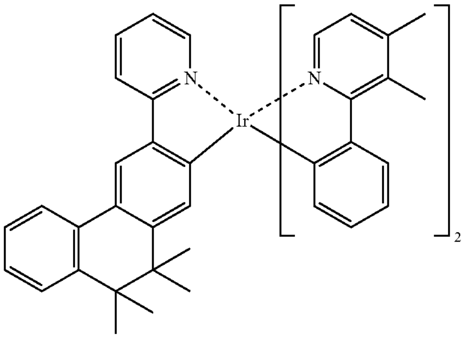
-continued
C-14
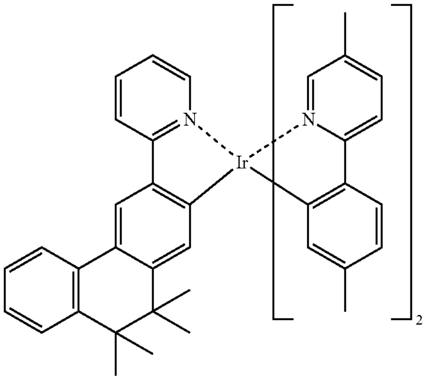
C-15
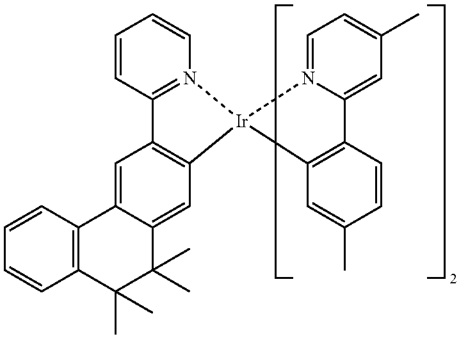
C-16
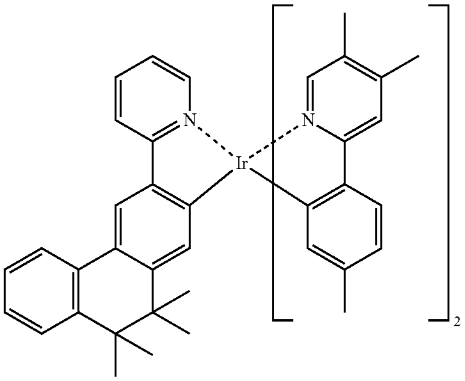
C-17
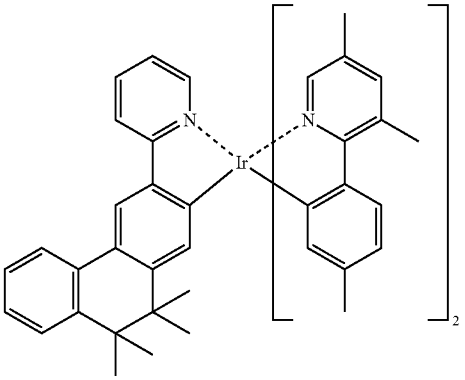

-continued
C-18
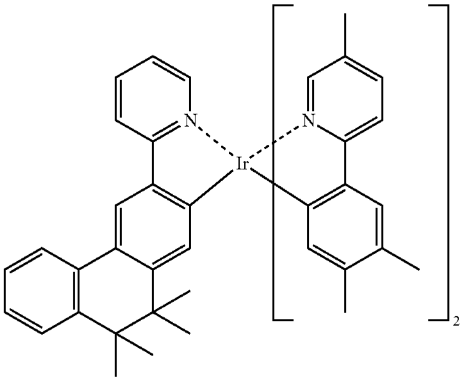
C-19
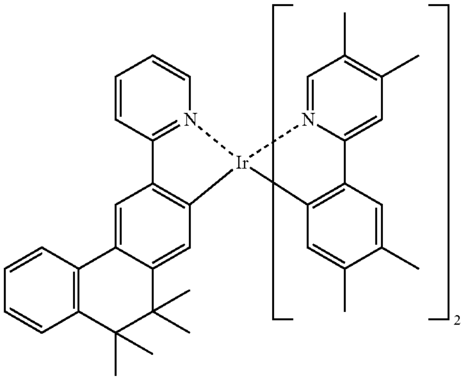
C-20
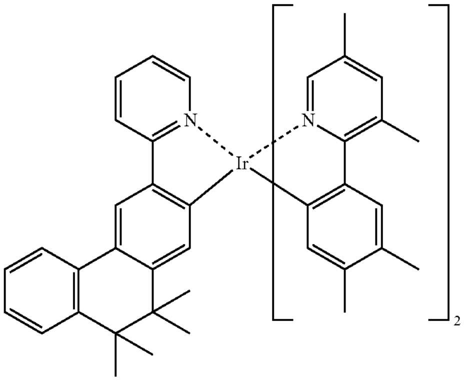
C-21
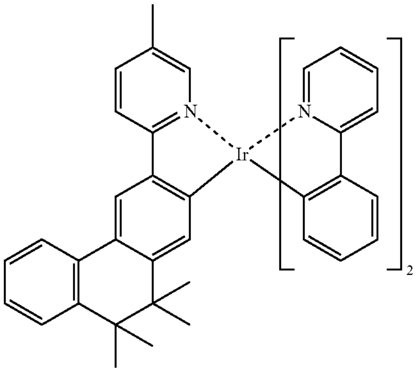
-continued
C-22
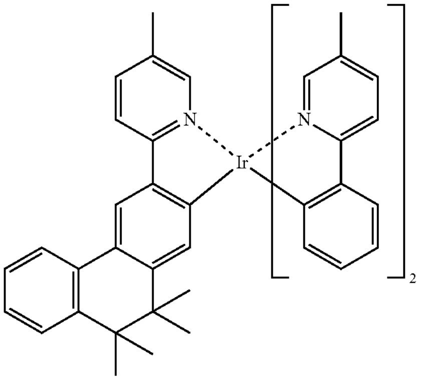
C-23
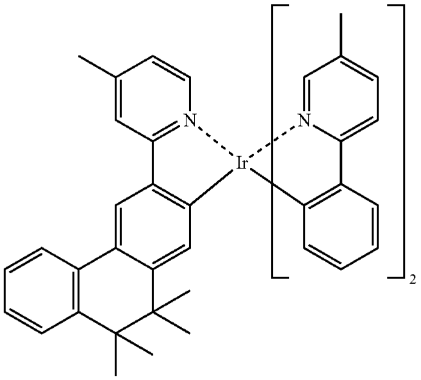
C-24
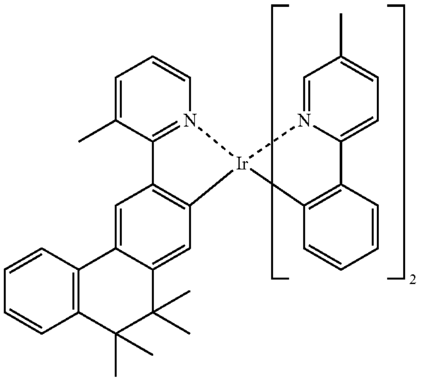
C-25
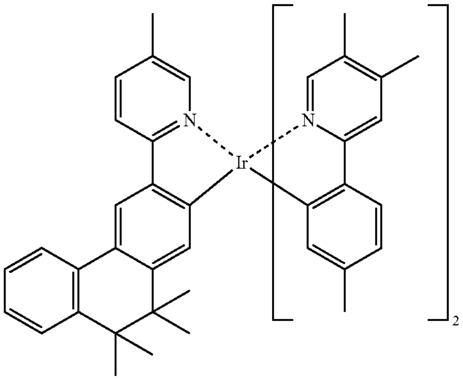

-continued
C-26
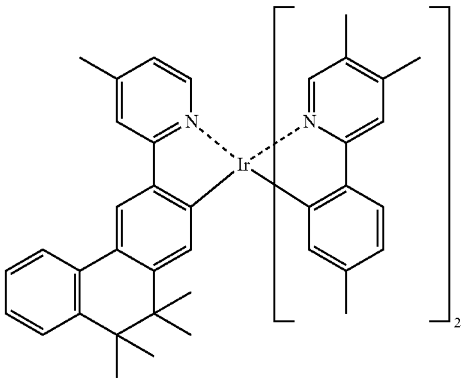
C-27
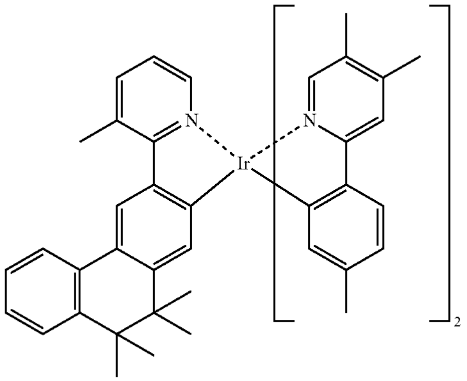
C-28
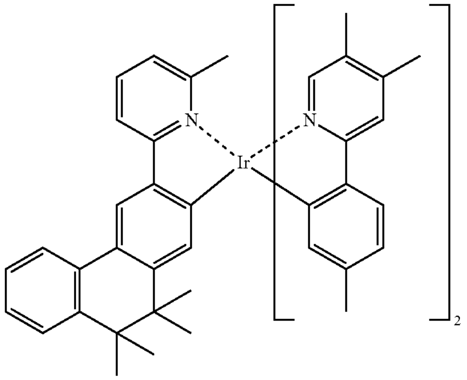
C-29
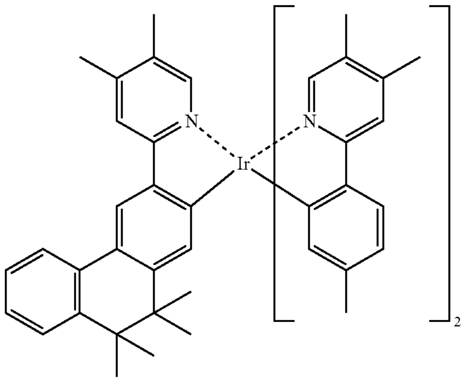
-continued
C-30
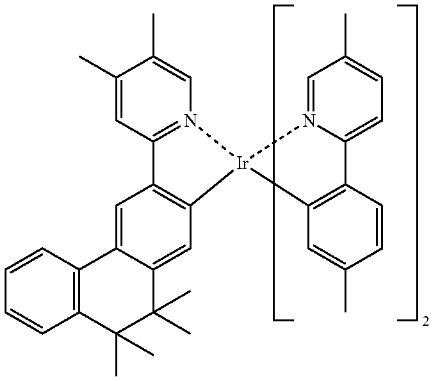
C-31
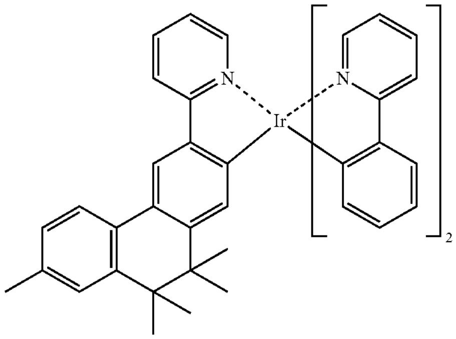
C-32
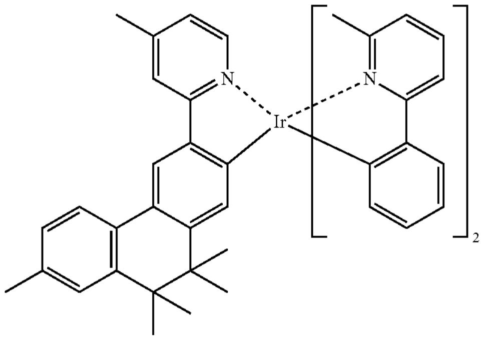
C-33
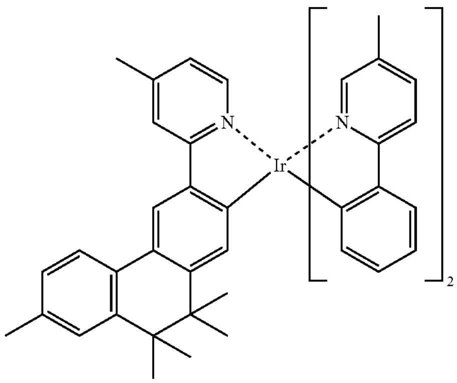

-continued
C-34
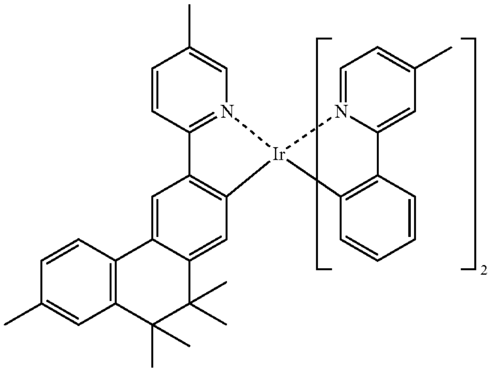
C-35
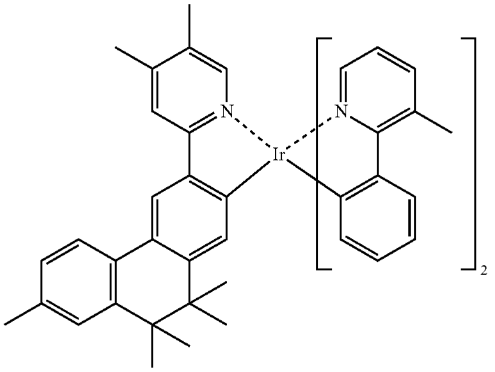
C-36
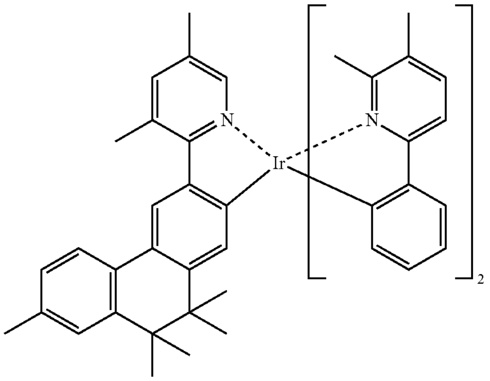
C-37
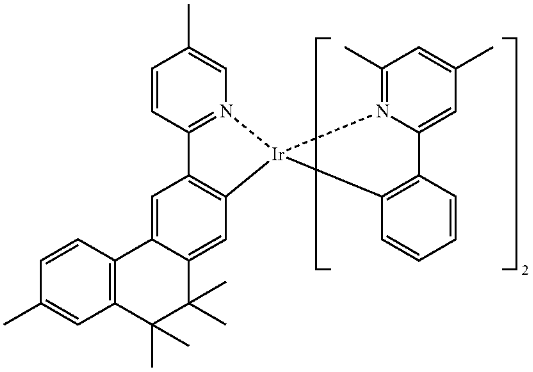
-continued
C-38
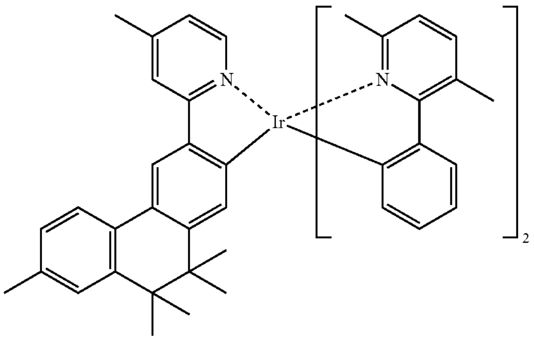
C-39
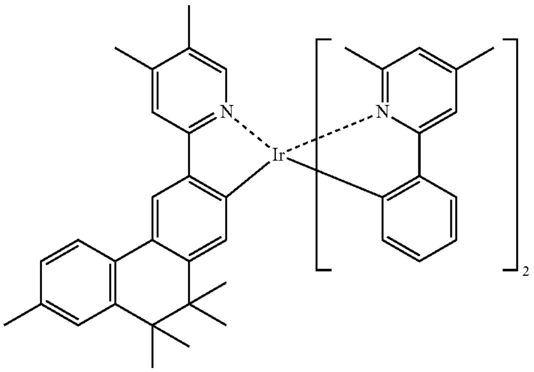
C-40
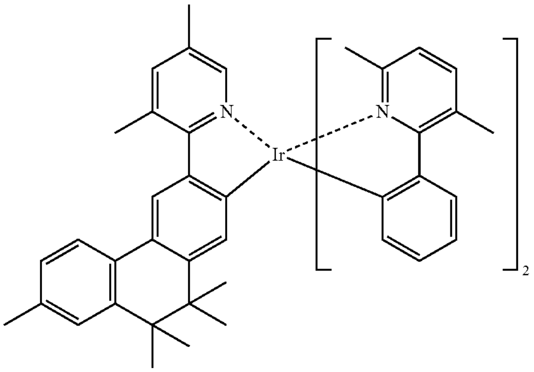
C-41
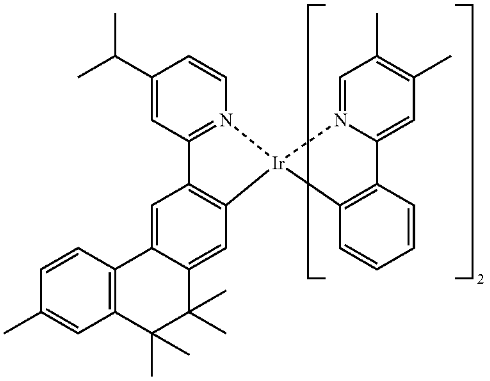

C-42
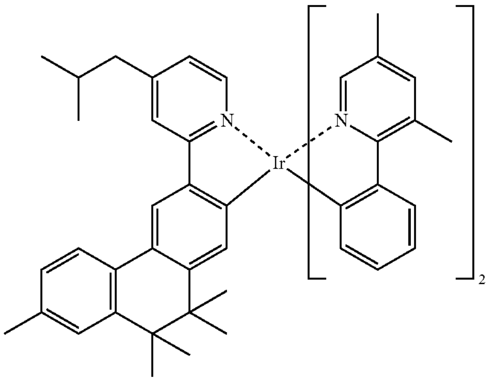
C-43
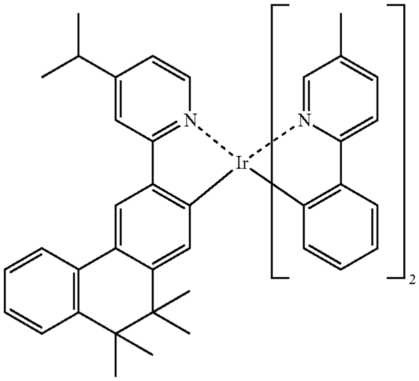
C-44
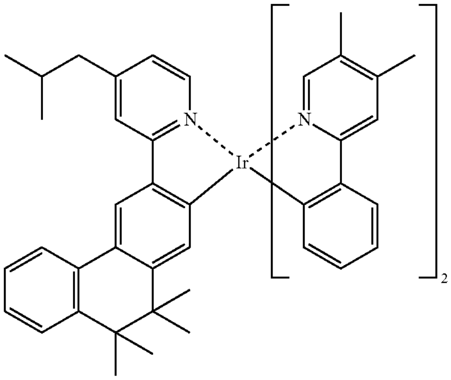
C-45
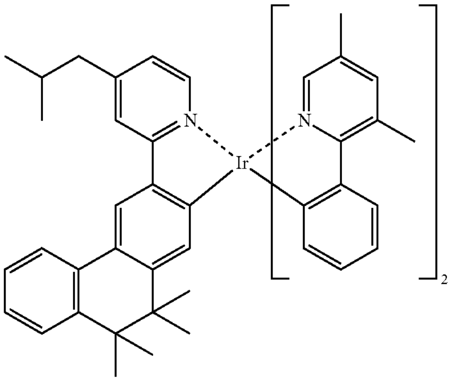
C-46
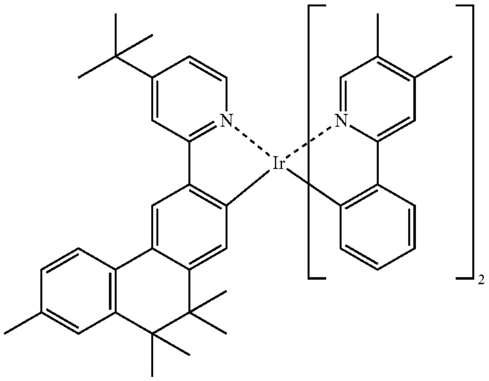
C-47
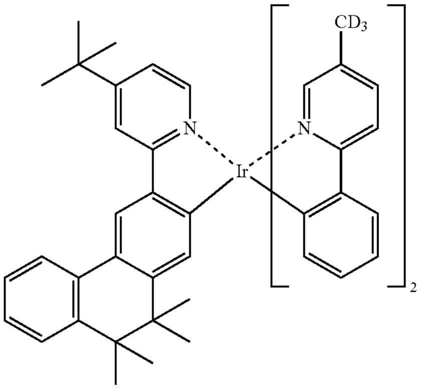
C-48
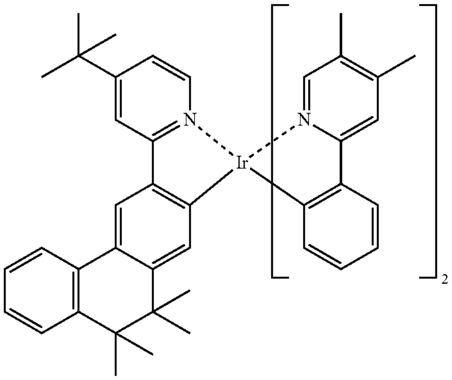
C-49
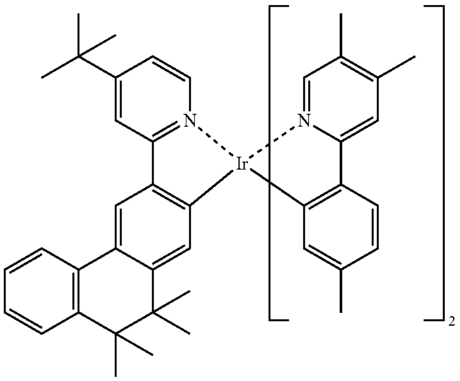

-continued
C-50
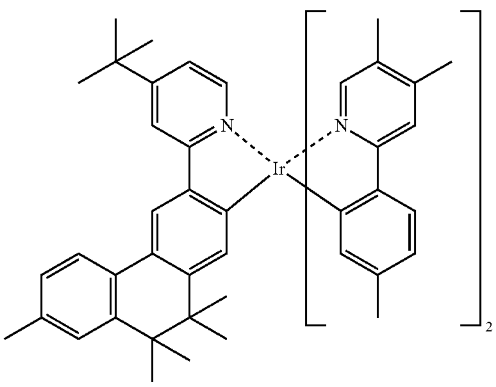
C-51
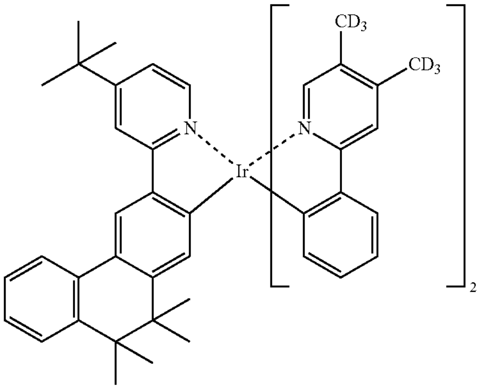
C-52
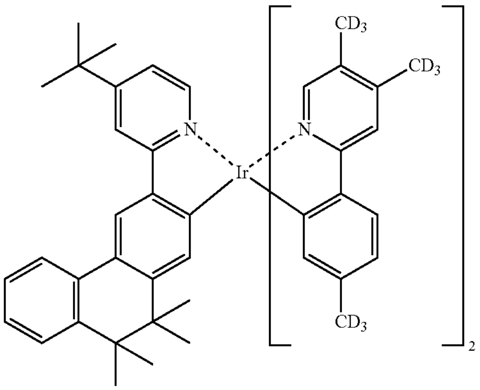
C-53
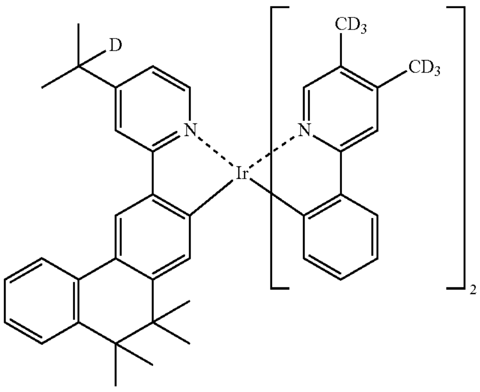
-continued
C-54
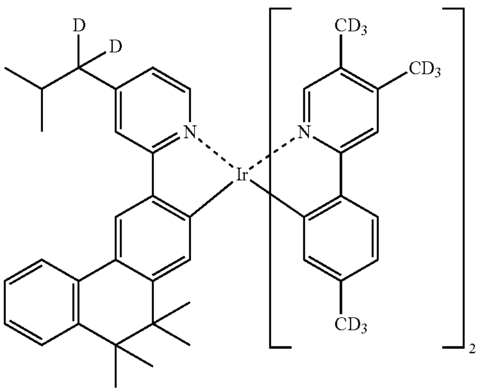
C-55
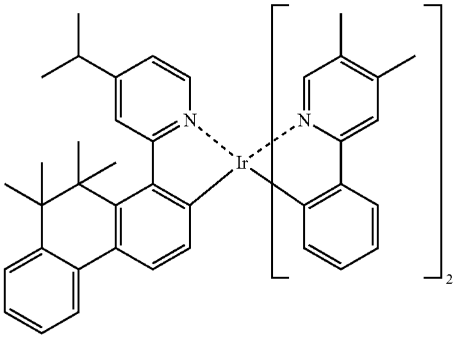
C-56
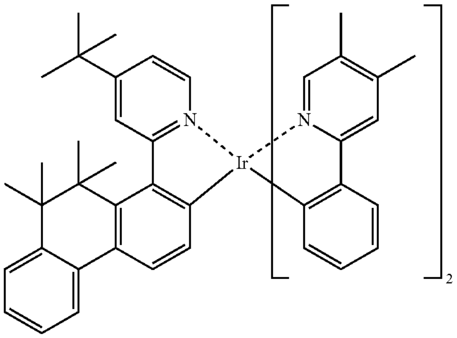
C-57
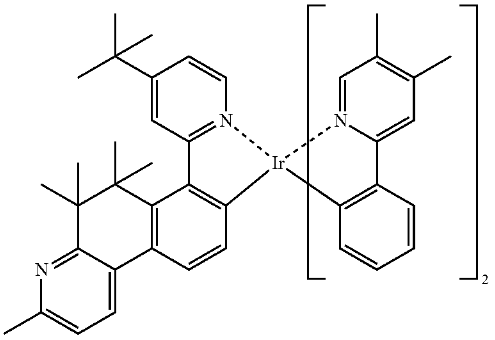

-continued
C-58
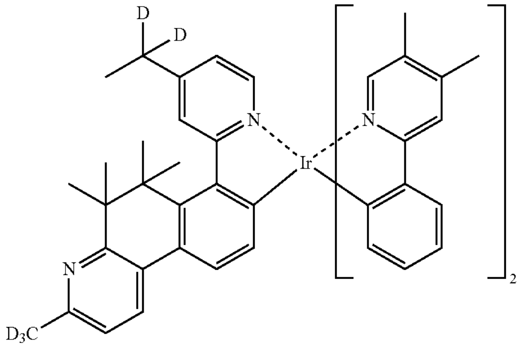
C-59
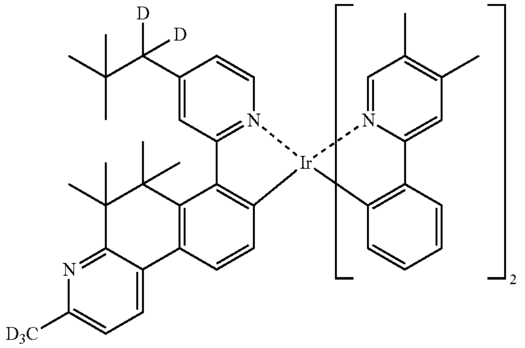
C-60
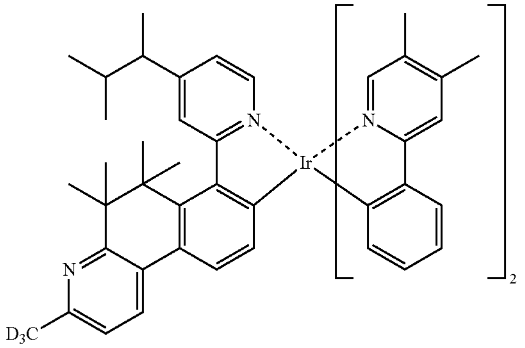
C-61
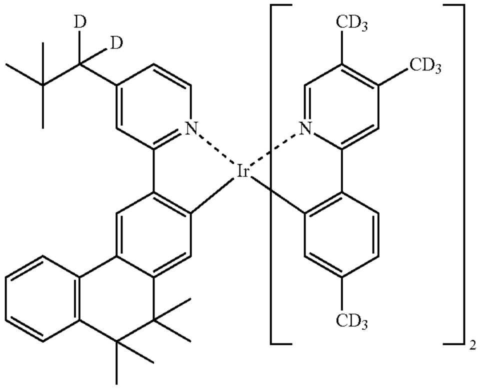
-continued
C-62
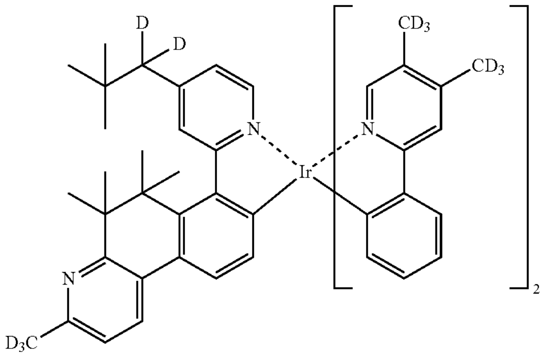
C-63
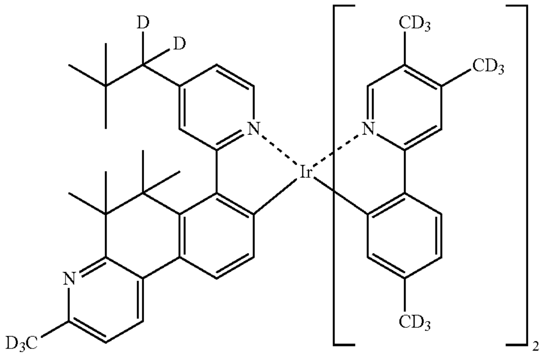
C-64
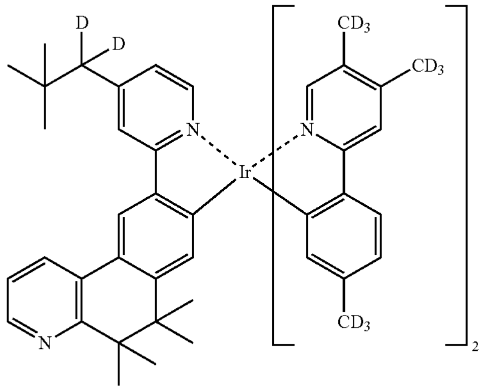
C-65
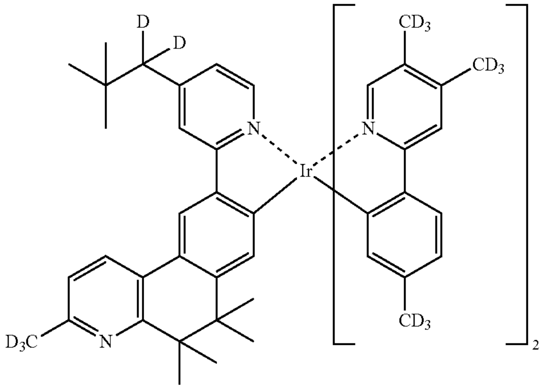

-continued
C-66
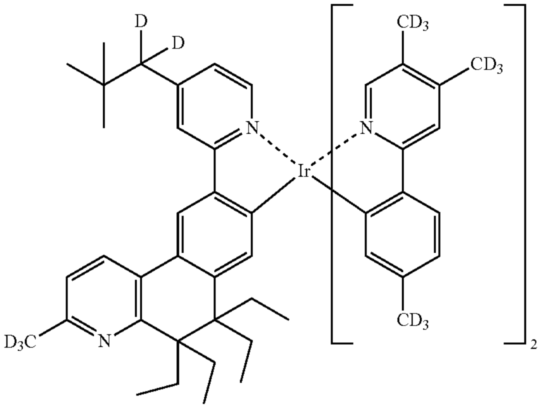
C-67
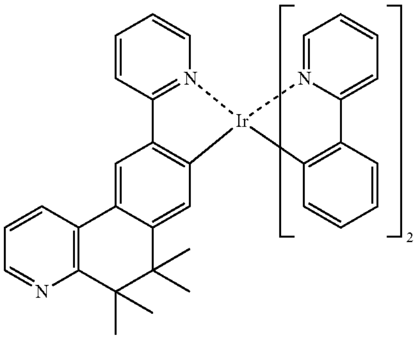
C-68
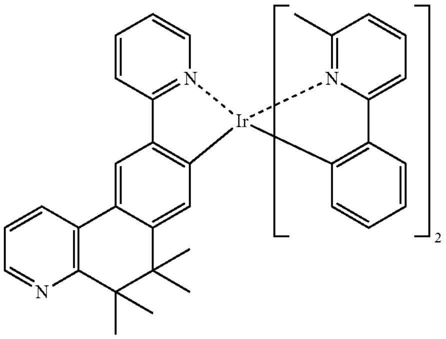
C-69
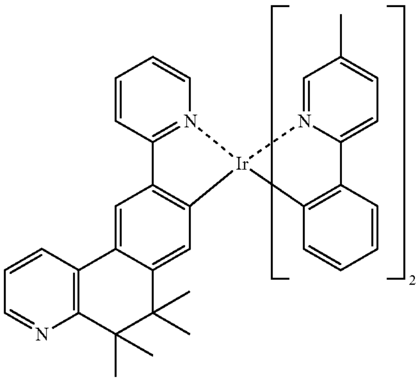
-continued
C-70
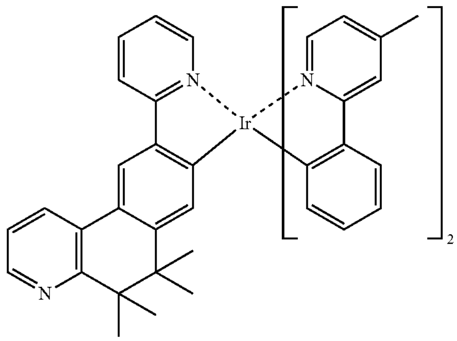
C-71
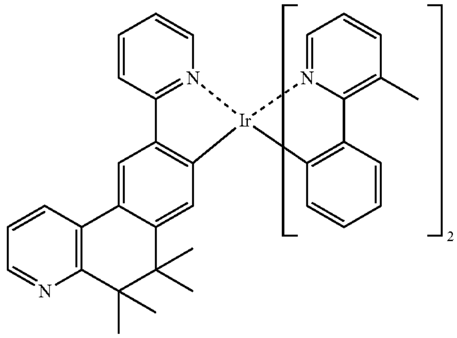
C-72
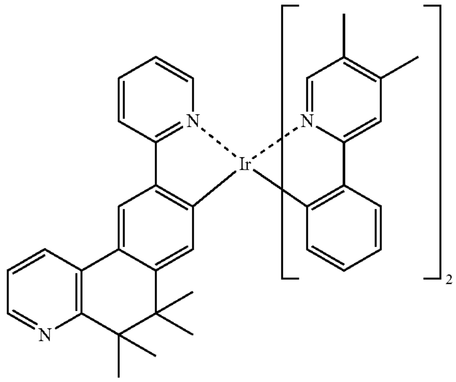
C-73
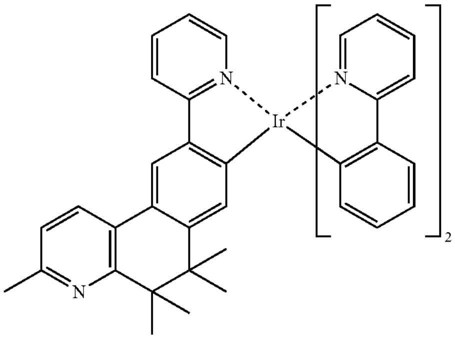

-continued
C-74
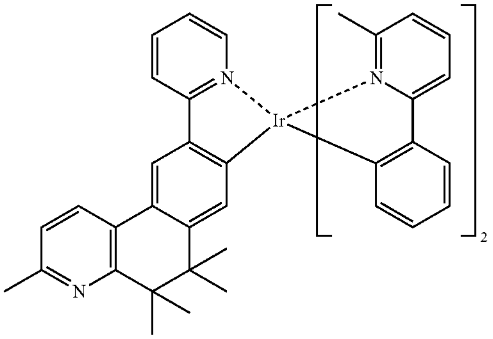
C-75
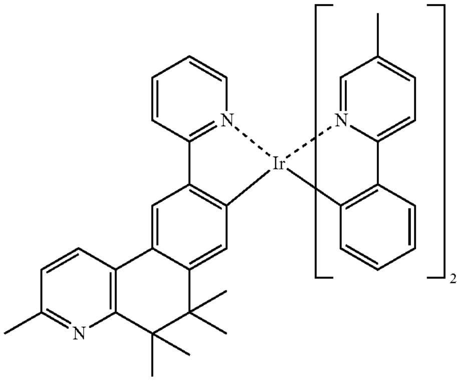
C-76
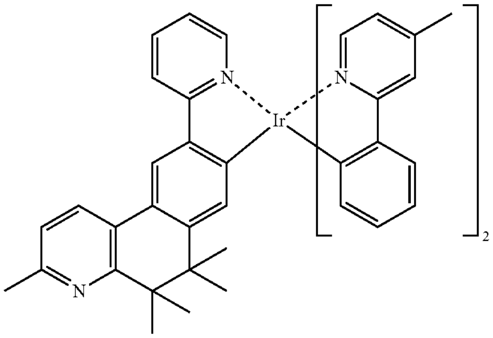
C-77
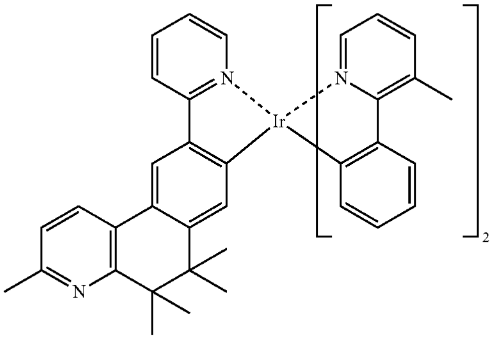
-continued
C-78
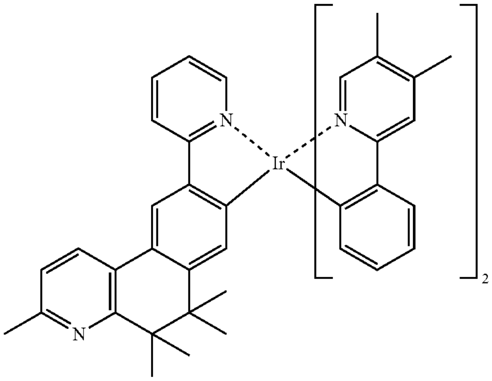
C-79
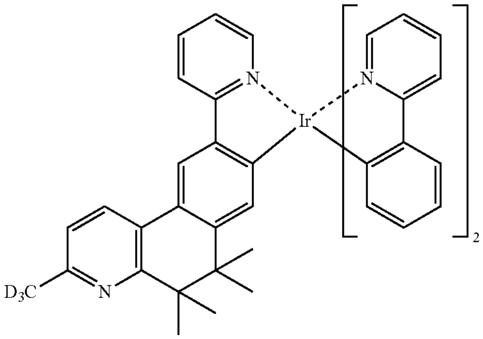
C-80
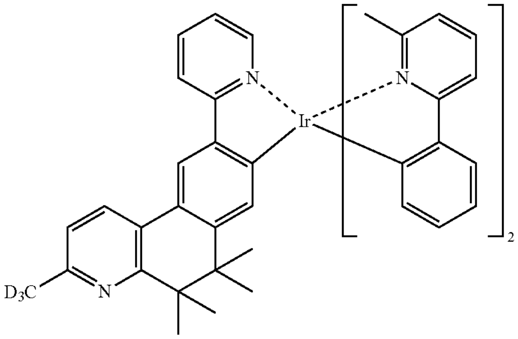
C-81
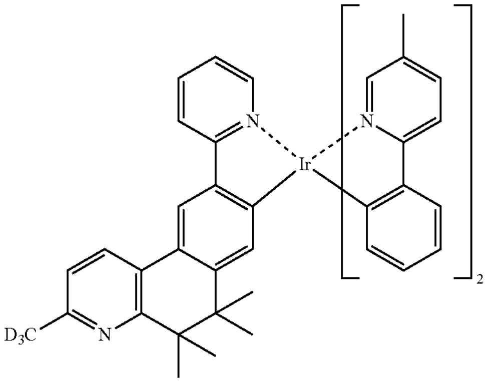

-continued
C-82
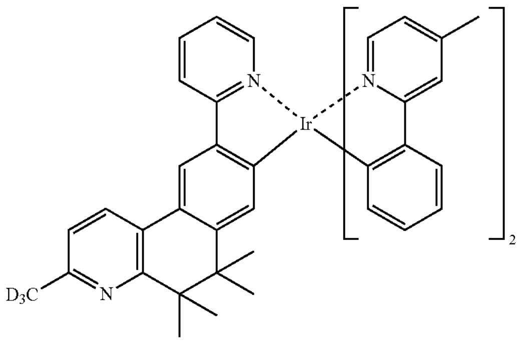
C-83
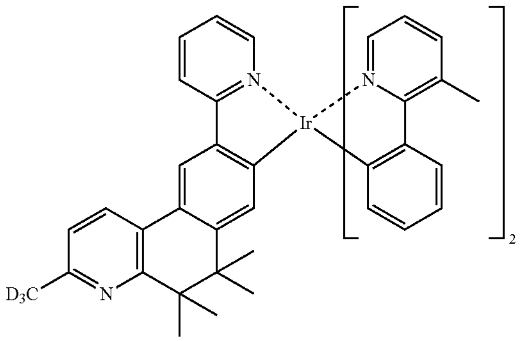
C-84
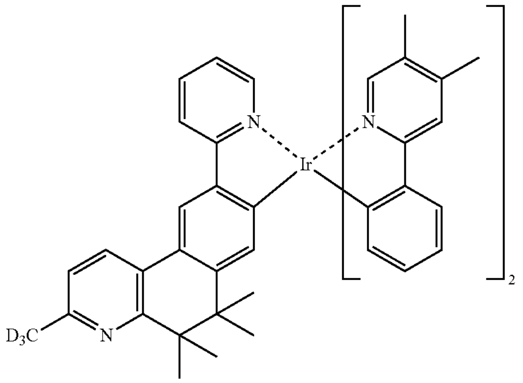
C-85
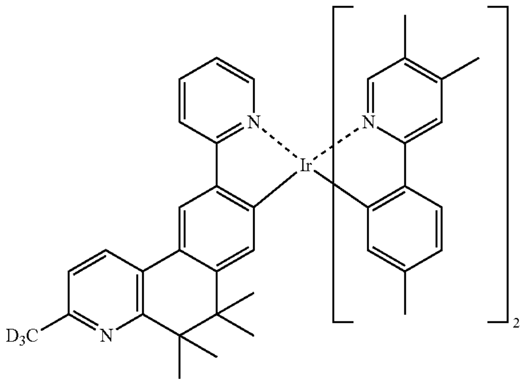
-continued
C-86
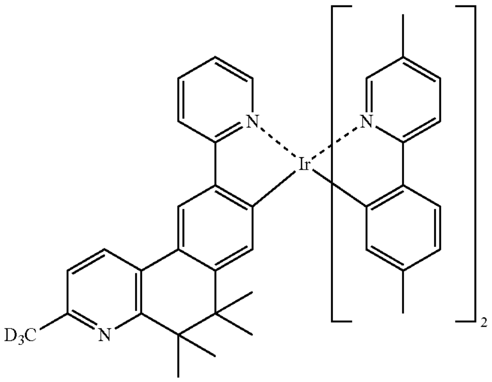
C-87
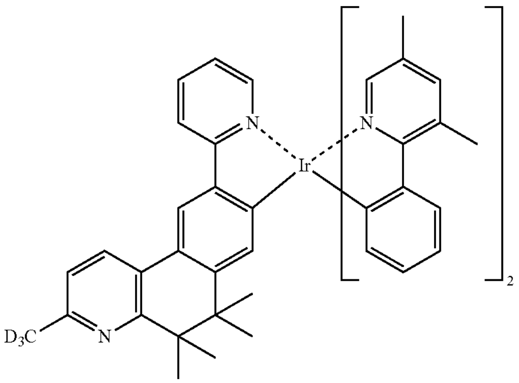
C-88
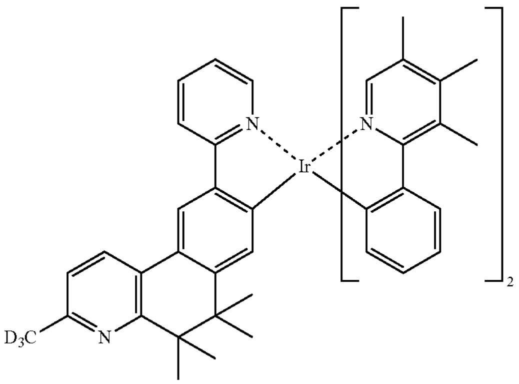
C-89
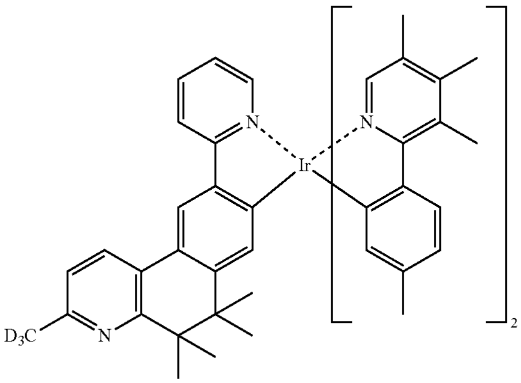

-continued
C-90
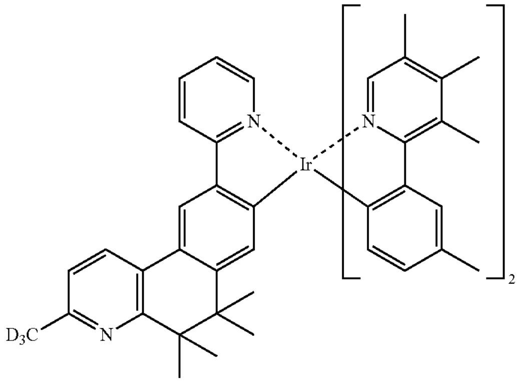
C-91
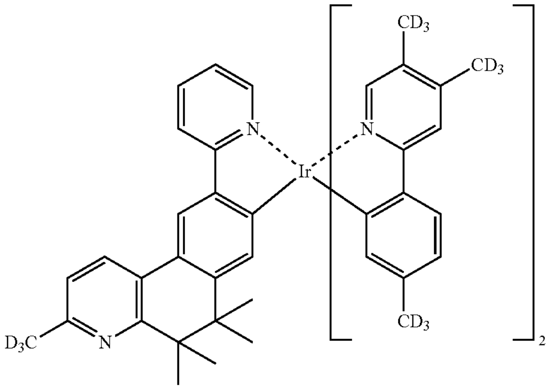
C-92
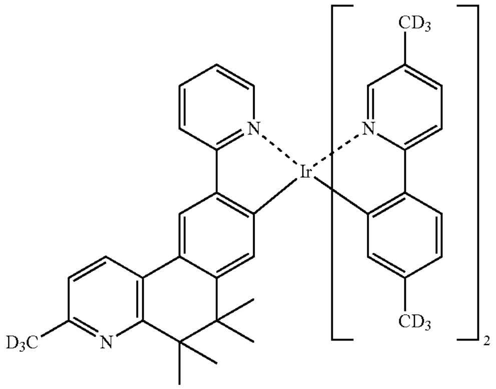
C-93
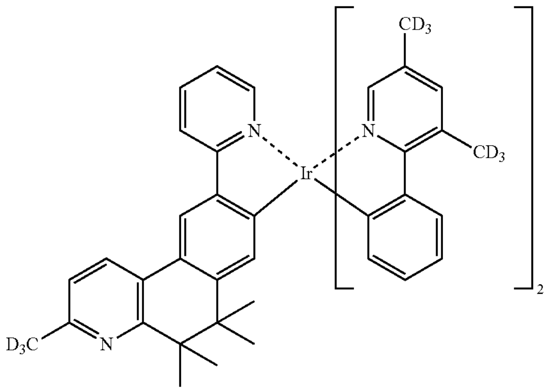
-continued
C-94
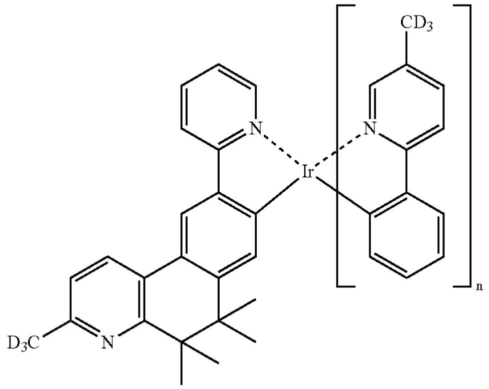
C-95
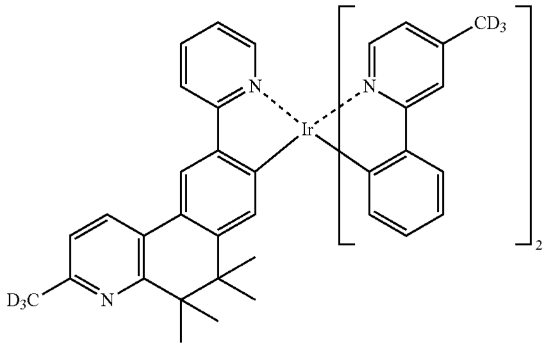
C-96
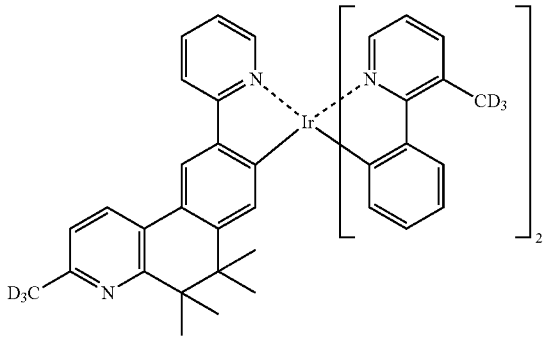
C-97
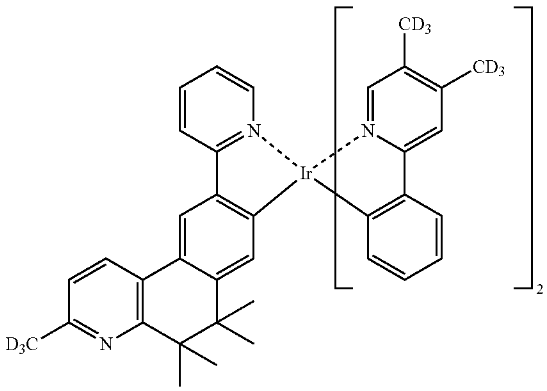

-continued
C-98
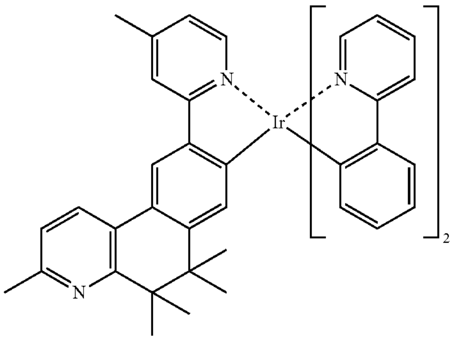
C-99
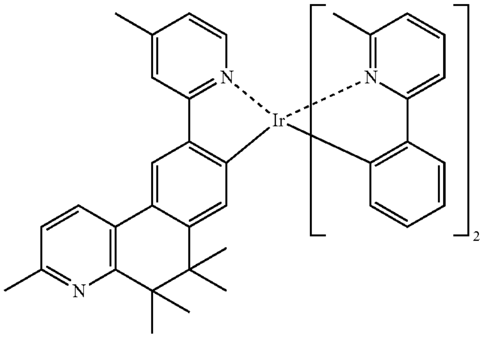
C-100
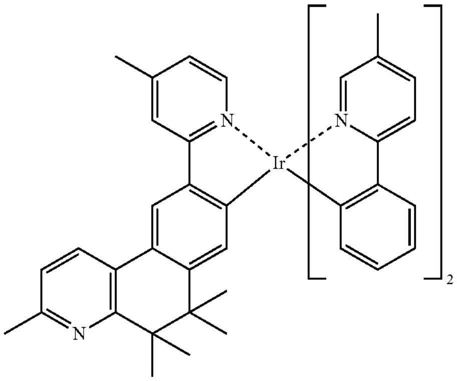
C-101
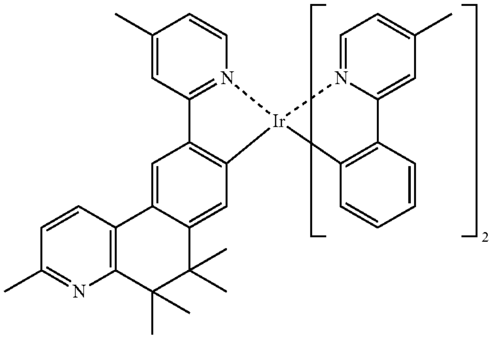
-continued
C-102
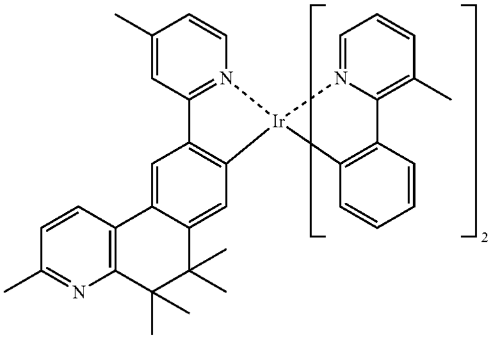
C-103
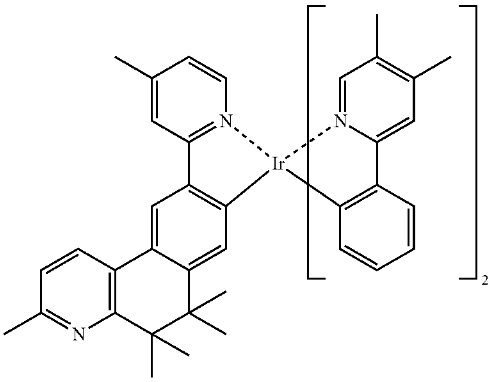
C-104
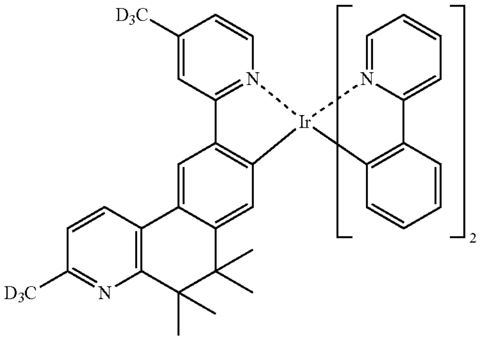
C-105
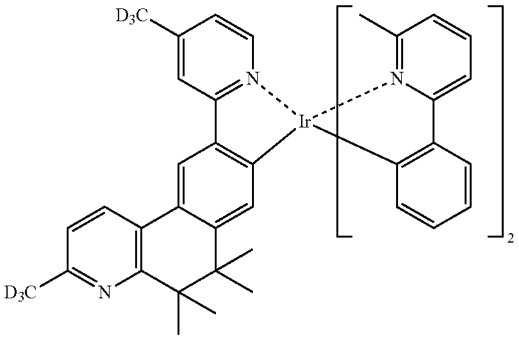

-continued
C-106
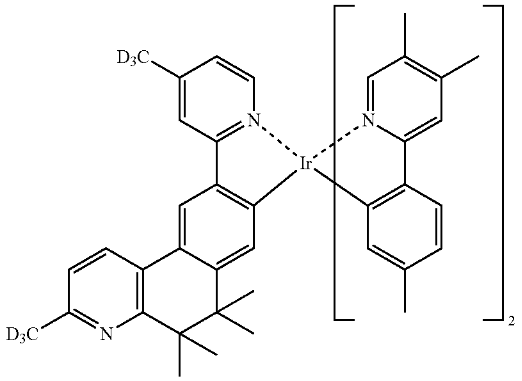
C-107
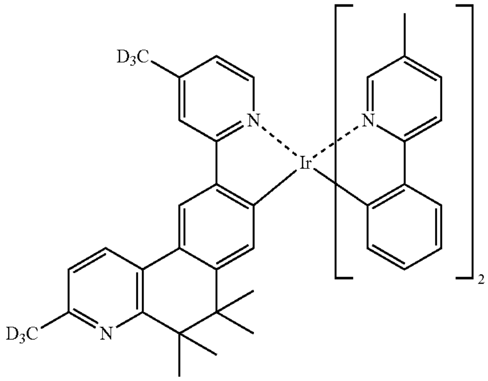
C-108
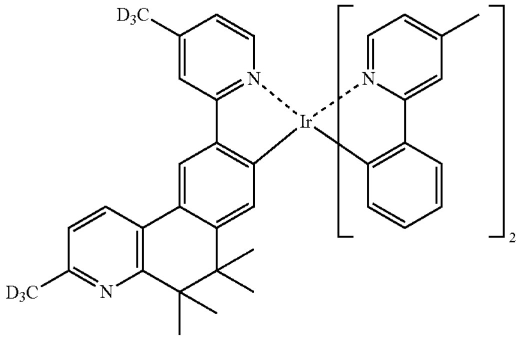
C-109
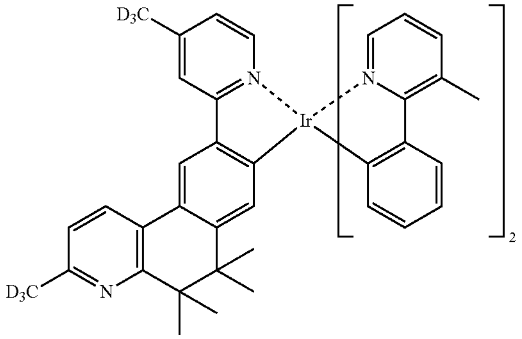
-continued
C-110
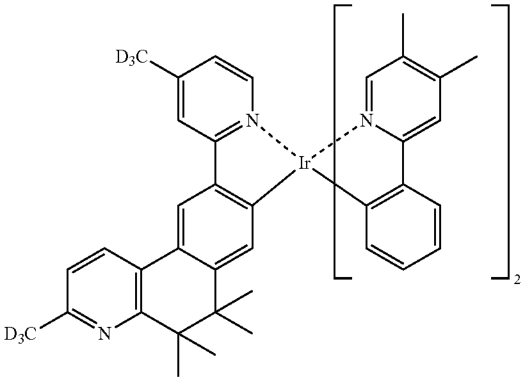
C-111
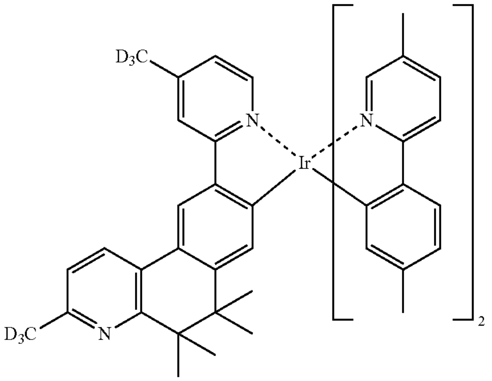
C-112
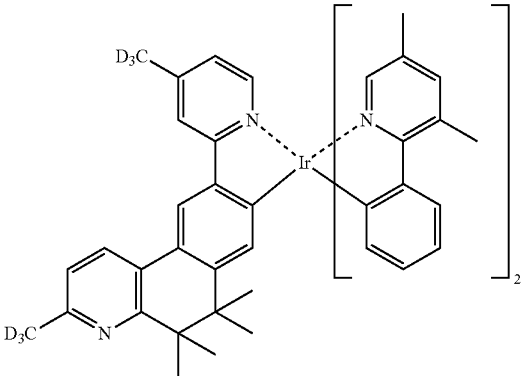
C-113
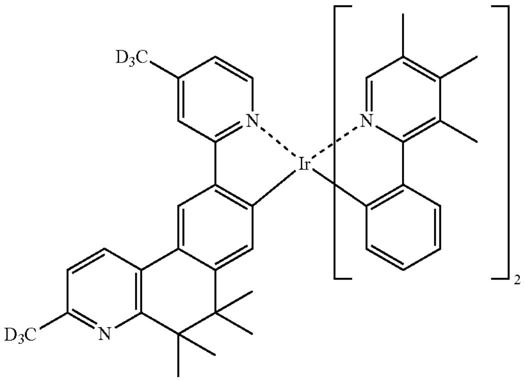

-continued
C-114
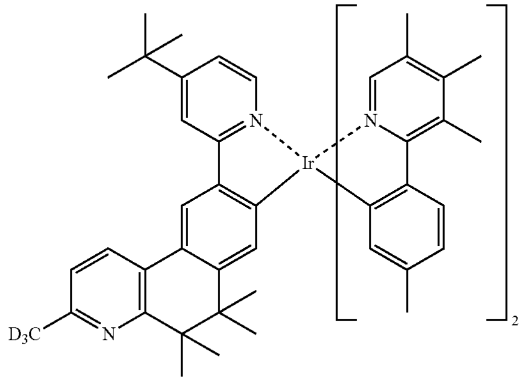
C-115
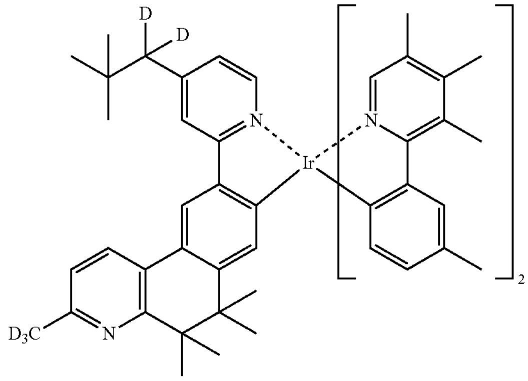
C-116
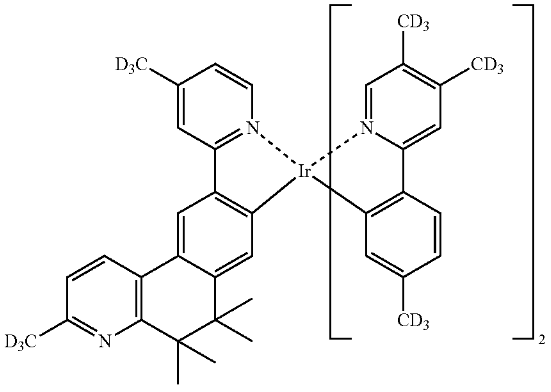
C-117
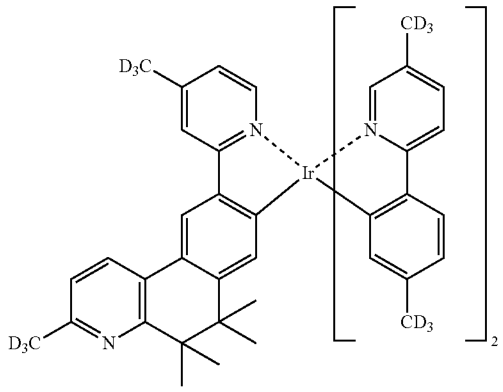
-continued
C-118
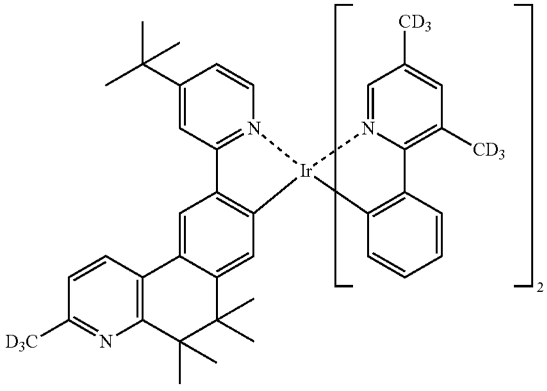
C-119
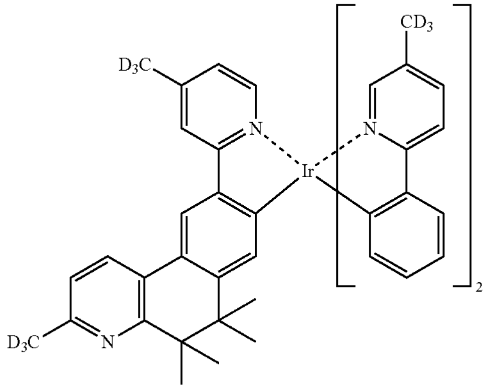
C-120
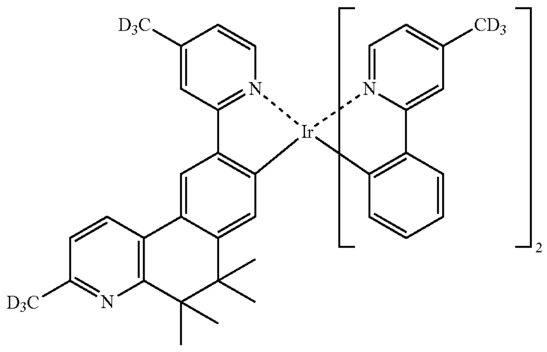
C-121
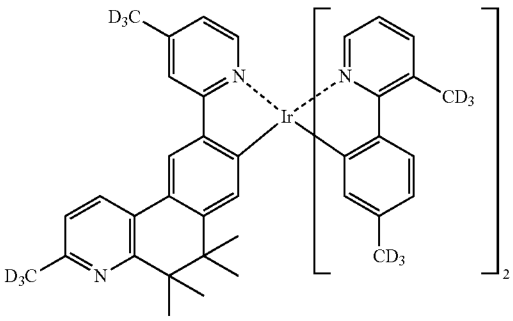
and -continued

C-122

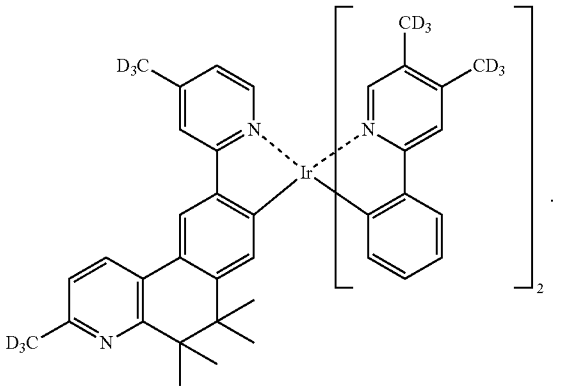

10. An organic electroluminescent material comprising the organic electroluminescent compound according to claim 1.

11. An organic electroluminescent device comprising a cathode, an anode, and a light-emitting layer between the cathode and the anode, wherein the light-emitting layer comprises the organic electroluminescent compound according to claim 1.

* * * * *